United States Patent
Liao et al.

(10) Patent No.: US 12,040,394 B2
(45) Date of Patent: Jul. 16, 2024

(54) SEMICONDUCTOR DEVICE HAVING IMPROVED GATE LEAKAGE CURRENT

(71) Applicant: INNOSCIENCE (ZHUHAI) TECHNOLOGY CO., LTD., Zhuhai (CN)

(72) Inventors: Hang Liao, Zhuhai (CN); Qiyue Zhao, Zhuhai (CN); Chang An Li, Zhuhai (CN); Chao Wang, Zhuhai (CN); Chunhua Zhou, Zhuhai (CN); King Yuen Wong, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 876 days.

(21) Appl. No.: 17/064,622

(22) Filed: Oct. 7, 2020

(65) Prior Publication Data

US 2021/0399123 A1    Dec. 23, 2021

(30) Foreign Application Priority Data

Jun. 19, 2020    (CN) .......................... 202010564680.5

(51) Int. Cl.
*H01L 29/778* (2006.01)
*H01L 29/20* (2006.01)

(52) U.S. Cl.
CPC ...... *H01L 29/7787* (2013.01); *H01L 29/2003* (2013.01)

(58) Field of Classification Search
None
See application file for complete search history.

(56) References Cited

U.S. PATENT DOCUMENTS

2010/0258843 A1   10/2010   Lidow et al.
2013/0280877 A1   10/2013   Kobayashi et al.
(Continued)

FOREIGN PATENT DOCUMENTS

CN    102388441 A    3/2012
CN    103022121 A    4/2013
(Continued)

OTHER PUBLICATIONS

State Intellectual Property Office of the People's Republic of China, Office Action and Search Report Issued in Application No. 202010564680.5, Feb. 7, 2023, 29 pages. (Submitted with Partial Translation).

*Primary Examiner* — Grant S Withers
(74) *Attorney, Agent, or Firm* — McCoy Russell LLP

(57) ABSTRACT

The present invention relates to a semiconductor device having an improved gate leakage current. The semiconductor device includes: a substrate; a first nitride semiconductor layer, positioned above the substrate; a second nitride semiconductor layer, positioned above the first nitride semiconductor layer and having an energy band gap greater than that of the first nitride semiconductor layer; a source contact and a drain contact, positioned above the second nitride semiconductor layer; a doped third nitride semiconductor layer, positioned above the second nitride semiconductor layer and between the drain contact and the source contact; and a gate electrode, positioned above the doped third nitride semiconductor layer, where the doped third nitride semiconductor layer has at least one protrusion extending along a direction substantially parallel to an interface between the first nitride semiconductor layer and the second nitride semiconductor layer, thereby improving the gate leakage current phenomenon.

20 Claims, 36 Drawing Sheets

(56) References Cited

U.S. PATENT DOCUMENTS

2014/0042449 A1   2/2014  Jeon et al.
2021/0083073 A1*  3/2021  Liu ...................... H01L 29/778
2022/0209001 A1*  6/2022  Otake ................ H01L 29/0657

FOREIGN PATENT DOCUMENTS

| CN | 103715240 A | 4/2014 |
| CN | 103972284 A | 8/2014 |
| CN | 105453216 A | 3/2016 |
| CN | 113748519 A | 12/2021 |
| JP | 2020080362 A | 5/2020 |

* cited by examiner

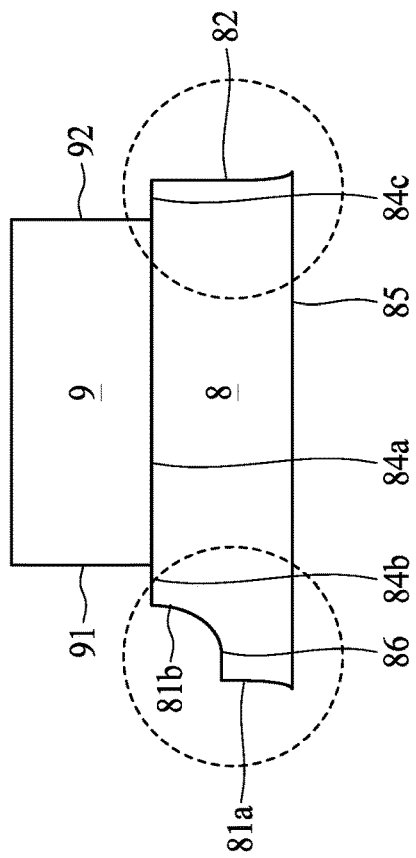
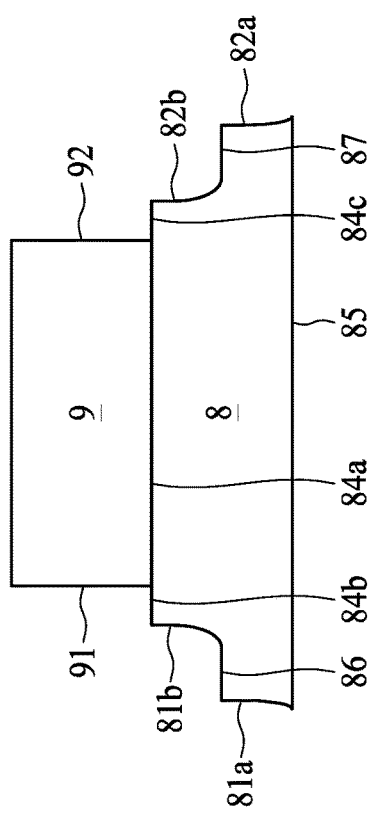

SEMICONDUCTOR DEVICE HAVING IMPROVED GATE LEAKAGE CURRENT

BACKGROUND OF THE INVENTION

1. Field of the Invention

The present invention relates to a semiconductor device and a manufacturing method thereof, and particularly to a semiconductor device with a group III-V layer, two-dimensional electron gas, conductor structures, and metal layers.

2. Description of the Related Art

GaN switching power transistors can realize a new generation of small-size high-efficiency power converters. Through high switching speeds of the devices, the switching frequency can be improved to realize maintenance or even increase of the total efficiency while reducing the volume and the weight. Due to the physical properties of GaN/AlGaN materials, a high breakdown voltage and a high current level can be achieved at the same time over the small semiconductor area, and the material properties are converted into the high switching frequency at a high power level. However, many different physical effects limit the voltage tolerance performance of GaN devices. In many cases, the maximum allowable operating voltage is limited by an excessive gate leakage current. The gate leakage current refers to a current leaked to a source and/or drain from gate metal along a sidewall of a doped nitride semiconductor layer and an interface between a first nitride semiconductor layer and a passivation layer. The excessive gate leakage current may inhibit the operating voltage of a component.

Therefore, there is a need of improving gate leakage current characteristics in the field of GaN switching power transistors.

SUMMARY OF THE INVENTION

The following presents a simplified summary of the basic features of the present invention in order to provide a basic understanding of some aspects of the present invention.

First generation semiconductor materials are elemental semiconductors with indirect energy gaps, such as silicon or germanium. Second generation semiconductor materials are represented by Group III arsenide (for example, gallium arsenide (GaAs)) compound semiconductor materials, and they have direct energy gaps, are luminous but have certain wavelength limitation, and have high pollution. Third generation semiconductors refer to wide bandgap semiconductor materials represented by Group III nitrides (for example, gallium nitride (GaN)), silicon carbide (SiC), diamond, and zinc oxide (ZnO).

With the development of wireless communication markets, such as military radar systems, personal mobile phones, and base stations, in recent years, millimeter wave transistors are becoming increasingly important. High electron mobility transistors, such as AlGaN/GaN high electron mobility transistors, made of Group III nitride materials, are always a hot research topic. Gallium nitride has a wide bandgap, a high breakdown voltage, a high peak electron velocity, a high electron saturation velocity, strong bonding force and excellent thermal stability, so the gallium nitride has the opportunity to become a main material of the next generation of power devices.

Compared with the first generation semiconductor materials of silicon (Si) and the second generation semiconductor materials of gallium arsenide (GaAs), the third generation semiconductors have the unique performance of large bandgap width, high breakdown electric field, high thermal conductivity, high electron saturation drift speed, small dielectric constant and the like, so that they show great potentials in aspects of photoelectric devices, power electronics, radio frequency (RF) and microwave power amplifiers, lasers, detection devices and the like.

Components based on the third generation semiconductors may include high electron mobility transistors (HEMTs), also known as heterojunction field effect transistors (HFETs) or modulation doped field effect transistors (MODFETs). Generally, junctions formed by using two kinds of materials with different bandgap widths, such as heterojunctions, are used instead of doped regions as channels. High electron mobility transistors get benefits from heterostructures, and use high mobility electrons generated by the heterojunctions. The heterojunctions may be formed, for example, by unintentionally doped wide bandgap layers (for example, AlGaN layers) and unintentionally doped narrow bandgap layers (for example, GaN layers).

In the AlGaN/GaN material system, due to extremely strong spontaneous polarization and piezoelectric polarization effects, unintentional doping may also form a high-concentration electron channel. Under this condition, since there is no scattering caused by donor impurities in the channel, electrons may move at a high speed, and very high electron mobility is obtained. A final result is that an electron thin layer with high concentration and high mobility is generated in the heterostructure, thereby resulting in very low channel resistivity. This is generally known as two-dimensional electron gas (2DEG). In the field effect transistors (FETs), the operation of the transistor is accomplished by changing the conductivity of this layer by applying a bias voltage to a gate electrode, and this is an advantage not found in the second generation semiconductor materials (such as gallium arsenide).

Therefore, gallium nitride may be used as the HEMT. The HEMT is better than the MESFET in the carrier concentration and electron mobility due to lower impurity scattering and lattice scattering. Therefore, the gallium nitride material is very suitable for being applied to the HEMTs and applied to high-frequency, high-power or microwave purposes.

High-frequency and high-power components need to have the characteristics of high breakdown voltage and high electron speed. In view of power amplifiers, the third generation semiconductor HEMTs have better power density than the second generation semiconductor HEMTs, so that the third generation semiconductor HEMTs conform to requirements by smaller sizes.

An AlGaN/GaN HEMT is a most general heterojunction HEMT. MOCVD or MBE is used for epitaxial growth of GaN, AlGaN and relevant structures thereof on a substrate material (such as sapphire, silicon (111) and silicon carbide) to provide materials required for preparation of the AlGaN/GaN HEMT.

The energy gap of GaN is as high as 3.39 eV, and the breakdown voltage also reaches 3.3 MV/cm. From the two points, the possibility of GaN for preventing the electronic pulse attack can be improved, and GaN can also work normally in a high-temperature environment.

The technology of growing gallium nitride on a silicon carbide or sapphire substrate is very mature, and the grown gallium nitride has good crystallization quality and low surface defect density. However, the silicon carbide or sapphire substrate is expensive and difficult to process, so that a semiconductor device based on the silicon carbide or sapphire substrate is difficult to realize mass production or manufacturing cost reduction. Based on the above disadvantages, GaN-on-Si is a process development trend in recent years. The silicon substrate has the cost advantages, and GaN-on-Si is also compatible with a modern silicon semiconductor manufacturing process. However, the difference in thermal expansion coefficients of gallium nitride and silicon is as high as 34%, so that epitaxial film breaking or silicon substrate bending deformation is caused during growth of a crystal film or at the room temperature. The surface defect density of the epitaxial film is high due to poor crystallization quality of the epitaxial film, so that a leakage current of about $10^{-12}$ A/mm to about $10^{-8}$ A/mm may be generated when the operating voltage of a GaN-on-Si HEMT at a gate is 5 V to 6 V. However, it is found that, when the GaN-on-Si HEMT is used for a circuit such as a comparator or an oscillator, the gate leakage current of about $10^{-12}$ A/mm to about $10^{-8}$ A/mm still causes earlier breakdown at the operating voltage of 6 V to 8 V and system power consumption of about 10 Watt, thereby reducing the system efficiency by about 5%. Such reduction in the system efficiency does not conform to the industry standard, and in the switch application, severe problems such as abnormal operation and poor efficiency are caused. Therefore, an urgent requirement of reducing the gate leakage current exists in the related technical field.

Moreover, it is known that the magnitude of the leakage current is mainly related to the quality of the epitaxial film growing on a substrate, and different dies on the same substrate or different switching elements of the same integrated circuit generally have substantially identical gate leakage current. Additionally, the gate leakage current may be subdivided into gate-to-source leakage current ($J_{gs}$) and gate-to-drain leakage current ($J_{gd}$). In conventional devices with symmetrical gate structures, $J_{gs}$ and $J_{gd}$ have similar magnitudes. It has been found that when the HEMTs are applied to an upper tube of a buck circuit in an on-board charger (OBC), it is generally desirable to minimize $J_{gd}$ to reduce the power consumption of $C_{gd}$ in a charging process. On the other hand, when the HEMTs are applied to LLC resonant converters in adapters, it is generally desirable to minimize $J_{gs}$ to optimize the charging time for $C_{gs}$, thereby further reducing the delay of the circuit. Based on this, there are the following requirements in the art: 1) the requirement of modulating the magnitude of leakage current of different dies on the same wafer; 2) the requirement of modulating the magnitude of leakage current of different switching elements in the same integrated circuit; or 3) the requirement of independently modulating the magnitudes of $J_{gs}$ and $J_{gd}$ in the HEMT devices.

In various embodiments, the present invention provides precisely designed HEMT gate structures. The gate structures effectively improve the gate leakage current characteristics of the HEMT devices, thereby achieving the requirement of reducing the gate leakage current, the requirement of independently modulating the magnitude of the leakage current of each die or switching elements, or the requirement of independently modulating the magnitudes of $J_{gs}$ and $J_{gd}$.

Some embodiments of the present invention provide a semiconductor device, including a substrate; a first nitride semiconductor layer, positioned above the substrate; a second nitride semiconductor layer, positioned above the first nitride semiconductor layer and having an energy band gap greater than that of the first nitride semiconductor layer; a source contact and a drain contact, positioned above the second nitride semiconductor layer; a doped third nitride semiconductor layer, positioned above the second nitride semiconductor layer and between the drain contact and the source contact, where the doped third nitride semiconductor layer has a first sidewall adjacent to the source contact, a second sidewall adjacent to the drain contact, and a third sidewall positioned between the first sidewall and the second sidewall in a direction substantially parallel to an interface between the first nitride semiconductor layer and the second nitride semiconductor layer; and a gate electrode, positioned above the doped third nitride semiconductor layer.

Some other embodiments of the present invention provide a semiconductor device, including a substrate; a first nitride semiconductor layer, positioned above the substrate; a second nitride semiconductor layer, positioned above the first nitride semiconductor layer and having an energy band gap greater than that of the first nitride semiconductor layer; a source contact and a drain contact, positioned above the second nitride semiconductor layer; a doped third nitride semiconductor layer, positioned above the second nitride semiconductor layer and between the drain contact and the source contact; and a gate electrode, positioned above the doped third nitride semiconductor layer, where the doped third nitride semiconductor layer has a first surface in contact with the gate electrode, a second surface in contact with the second nitride semiconductor layer, and a third surface positioned between the first surface and the second surface in a direction substantially perpendicular to an interface between the first nitride semiconductor layer and the second nitride semiconductor layer, and the third surface extends in a direction substantially parallel to the interface between the first nitride semiconductor layer and the second nitride semiconductor layer.

Some other embodiments of the present invention provide a semiconductor device, including a substrate; a first nitride semiconductor layer, positioned above the substrate; a second nitride semiconductor layer, positioned above the first nitride semiconductor layer and having an energy band gap greater than that of the first nitride semiconductor layer; a source contact and a drain contact, positioned above the second nitride semiconductor layer; a doped third nitride semiconductor layer, positioned above the second nitride semiconductor layer and between the drain contact and the source contact; and a gate electrode, positioned above the doped third nitride semiconductor layer, where the doped third nitride semiconductor layer has at least one protrusion extending along a direction substantially parallel to an interface between the first nitride semiconductor layer and the second nitride semiconductor layer.

Unexpectedly, the present invention may effectively improve the gate leakage current phenomenon of the HEMT device through the precisely designed gate structure, and the magnitudes of the gate-to-source leakage current ($J_{gs}$) and the gate-to-drain leakage current ($J_{gd}$) may even be separately adjusted as required.

BRIEF DESCRIPTION OF THE DRAWINGS

The aspects of the present invention will become more comprehensible from the following detailed description made with reference to the accompanying drawings. It should be noted that, various features may not be drawn to scale. In fact, the sizes of the various features may be increased or reduced arbitrarily for the purpose of clear description.

FIG. 1(d) shows an embodiment and a configuration of a gate electrode and a doped nitride semiconductor layer in a gate structure in a dotted box in FIG. 1(a);

FIG. 1(e) shows an embodiment and a configuration of a gate electrode and a doped nitride semiconductor layer in a gate structure in a dotted box in FIG. 1(a), which is a further improvement of the structure in FIG. 1(b);

FIG. 6(a) to FIG. 6(l) show several operations for manufacturing an HEMT device 1e according to some embodiments of the present invention.

PREFERRED EMBODIMENT OF THE PRESENT INVENTION

Figure 1A:
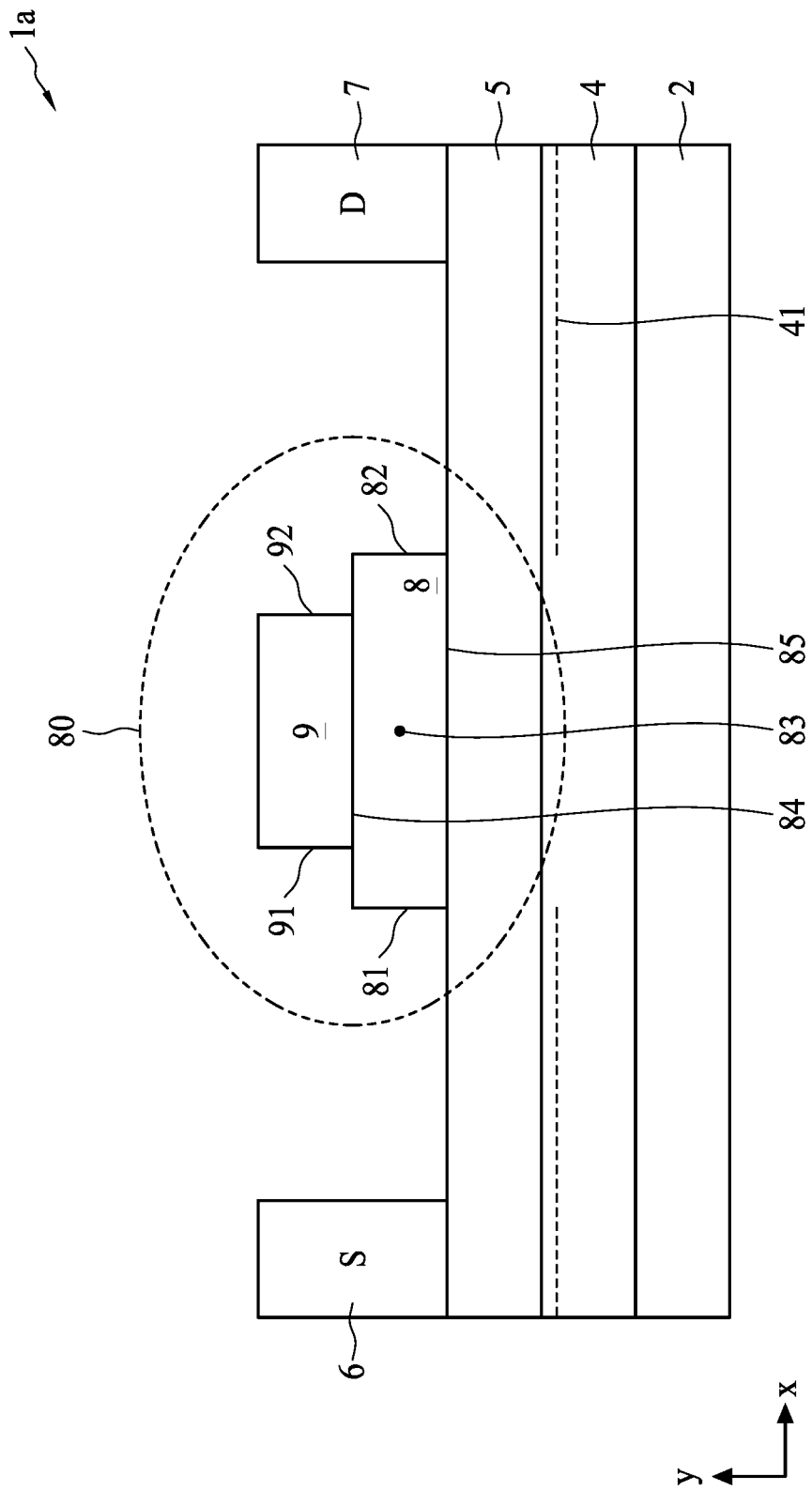
FIG. 1(a) shows an HEMT device including a gate structure of the present invention.

To make the figures clear and concise, unless otherwise specified, the same reference numerals in different figures indicate the same components. In addition, to simplify the description, descriptions and details of well-known steps and components may be omitted. Although devices may be described herein as some n-channel or p-channel devices or some n-type or p-type doping devices, it is found through effortful research that, the present invention may also be applied to complementary devices. The word "substantially" or "basically" used herein means that a value of a component has a parameter that is expected to be close to a stated value or position. However, as is well known in the art, there are always small differences that prevent a value or position from being exactly the stated value or position. It is acknowledged in the art that a deviation of up to at least ten percent (10%) (and even to twenty percent (20%) for some components including semiconductor doping concentrations) is a reasonable deviation from an ideal target exactly as described. The terms "first", "second", "third", and the like (as used in part of a component name) in the claims and/or specific embodiments are used to distinguish similar components, and do not necessarily describe an order in time, space, rank, or any other way. It should be understood that, such terms may be interchanged under appropriate circumstances, and the embodiments described herein may be operated in other orders than that described or exemplified herein. The phrase "some embodiments" means that specific features, structures, or characteristics described in combination with the embodiments are included in at least one embodiment of the present invention. Therefore, the phrase "in some embodiments" appearing at different positions throughout this specification does not necessarily refer to the same embodiment, but in some cases, may refer to the same embodiment. In addition, it is apparent to a person of ordinary skill in the art that, in one or more embodiments, specific features, structures, or characteristics may be combined in any appropriate manner.

In this specification, the so-called "normal direction" refers to a normal direction of an interface between a first nitride semiconductor layer and a second nitride semiconductor layer of an HEMT device; in some cases, the "normal direction" may alternatively be a normal direction of a flowing direction of two-dimensional electron gas of an HEMT device; and in some cases, the "normal direction" may alternatively be a stacking direction of epitaxial layers. The so-called "tangential direction" refers to a tangential direction of an interface between a first nitride semiconductor layer and a second nitride semiconductor layer of an HEMT device; in some cases, the "tangential direction" may alternatively be a tangential direction of a flowing direction of two-dimensional electron gas of an HEMT device; and in some cases, the "tangential direction" alternatively refers to a direction along a connecting line between a source contact and a drain contact of an HEMT device.

The following disclosure provides many different embodiments or examples for implementing different features of the provided subject matter. Specific examples of components and arrangements are described below. Certainly, the descriptions are merely examples and are not intended to be limiting. In this application, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in this application, reference numerals and/or letters may be repeated in examples. This repetition is for the purpose of simplification and clarity, and does not indicate a relationship between the described various embodiments and/or configurations.

The embodiments of the present invention are described in detail below. However, it should be understood that many applicable concepts provided by the present invention may be implemented in a plurality of specific environments. The described specific embodiments are only illustrative and do not limit the scope of the present invention.

FIG. 1(a) shows an HEMT device 1a according to some embodiments of the present invention. The structure is drawn on a tangent plane substantially along a connecting line between a source contact 6 and a drain contact 7, where the x direction is a tangential direction in this specification; and they direction is a normal direction in this specification.

Generally, the HEMT device is constructed on a substrate 2. A nitride semiconductor layer 4 and a nitride semiconductor layer 5 are arranged on the substrate 2. The nitride semiconductor layer 5 and the nitride semiconductor layer 4 are configured to form two-dimensional electron gas (2DEG) 41 in the nitride semiconductor layer 4 along an interface between the nitride semiconductor layer 4 and the nitride semiconductor layer 5. Therefore, the nitride semiconductor layer 4 may be considered as a channel layer of the HEMT device, and the nitride semiconductor layer 5 may be considered as a barrier layer of the HEMT device. The source contact 6, a gate structure 80, and the drain contact 7 are additionally arranged on the nitride semiconductor layer 5. The gate structure 80 is positioned between the source contact 6 and the drain contact 7 substantially along the tangential direction, and includes a doped nitride semiconductor layer 8 and a gate electrode 9.

The substrate 2 may include, but is not limited to, silicon (Si), doped silicon (doped Si), gallium nitride, zinc oxide, silicon carbide (SiC), silicon germanium (SiGe), gallium arsenide (GaAs), sapphire, silicon on an insulator (SOI), or other suitable materials, preferably silicon. The substrate 2 may also include a doped region (not shown in the figure), for example, p-well and/or n-well. The substrate 2 has an active layer and a back layer opposite to the active layer. An integrated circuit may be formed above the active layer.

As mentioned above, the gate leakage current in the state of the art still cannot meet requirements such as high gate breakdown voltage and low system power consumption on a circuit such as a comparator or an oscillator. The inventors have found that, the gate leakage current phenomenon may be improved through a technical measure of improving the geometric contour of a sidewall adjacent to a source or drain of a doped nitride semiconductor layer of the present invention, thereby achieving the goals of reducing the gate leakage current, and reducing the system power consumption; and improving the gate breakdown voltage, and improving the device reliability.

Moreover, a leakage current $J_{gd}$ between a source and a drain determines the power consumption of $C_{gd}$. The inventors of this application have unexpectedly found that the magnitude of $J_{gd}$ may be modulated by precisely designing the geometric contour of the gate structure 80. The inventors have found that under the condition that the total gate leakage current cannot be further reduced due to the limitation by a manufacturing process technology, a proportion between $J_{gd}$ and $J_{sd}$ may be regulated by a technical measure of changing the symmetry of the gate structure of the present invention, thereby achieving the effects of increasing $J_{gs}$, reducing $J_{gd}$ and decreasing $C_{gd}$, and further achieving the goal of reducing the power consumption of $C_{gd}$.

On the other hand, a leakage current $J_{gs}$ between the gate and the source determines the charging time of $C_{gs}$. Therefore, under the condition that the total gate leakage current cannot be further reduced due to the limitation by the manufacturing process technology, a proportion between $J_{gd}$ and $J_{sd}$ may be regulated by a technical measure of changing the symmetry of the gate structure of the present invention, thereby achieving the effects of increasing $J_{gd}$, reducing $J_{gs}$ and decreasing the charging time of $C_{gs}$, and further achieving the goal of reducing the circuit delay.

Therefore, on the tangent plane substantially along the connecting line between the source contact 6 and the drain contact 7, relative to the geometric center 83 of the doped nitride semiconductor layer, the doped nitride semiconductor layer may substantially have a non-mirror-symmetric shape.

Having generated a practical channel (electron channel region) under the gate electrode 9, the nitride semiconductor layer 4 is preset to be in an ON state when the gate electrode 9 is in a zero-bias state. Such a device may also be known as a depletion mode device.

An enhancement mode device is contrary to the depletion mode device. The enhancement mode device is preset to be in an OFF state when the gate electrode 9 is in the zero-bias state. To form the enhancement mode device, the doped nitride semiconductor layer 8 is necessarily disposed between the gate electrode 9 and the nitride semiconductor layer 5 so as to deplete or remove part of the two-dimensional electron gas 41.

The doped nitride semiconductor layer 8 and the nitride semiconductor layer 4 may form a pn junction used to deplete the two-dimensional electron gas 41. Since the pn junction depletes the two-dimensional electron gas 41, when the gate electrode 9 is in the zero-bias state, no current passes through the HEMT device 1a, i.e., a threshold voltage of the HEMT device 1a is a positive value. The doped nitride semiconductor layer 8 is favorable for reducing the leakage current, and increasing the threshold voltage.

The gate electrode 9 may be used as a stop layer or a protective layer to protect the whole top surface of the doped nitride semiconductor layer 8, so that the surface of the doped nitride semiconductor layer 8 cannot generate bulges or recesses (or relatively uneven surfaces) due to the removal operation (such as etching).

Figure 1C:
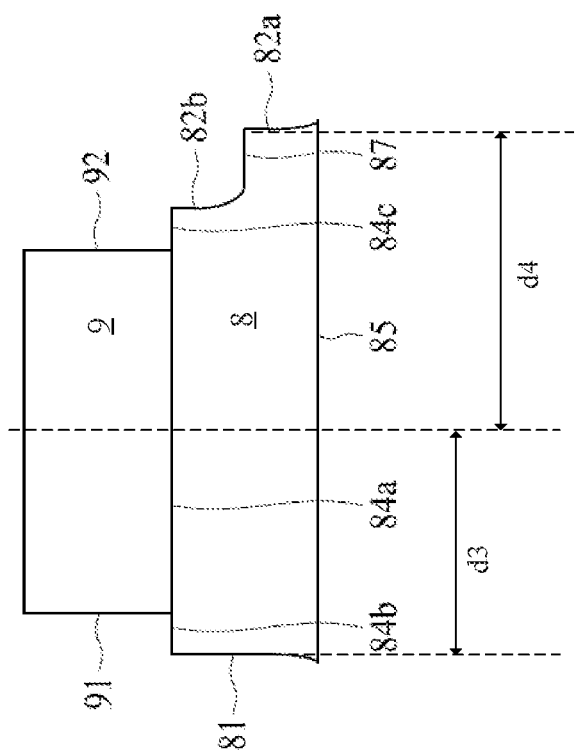
FIG. 1(c) shows an embodiment and a configuration of a gate electrode and a doped nitride semiconductor layer in a gate structure in a dotted box in FIG. 1(a)
Figure 1B:
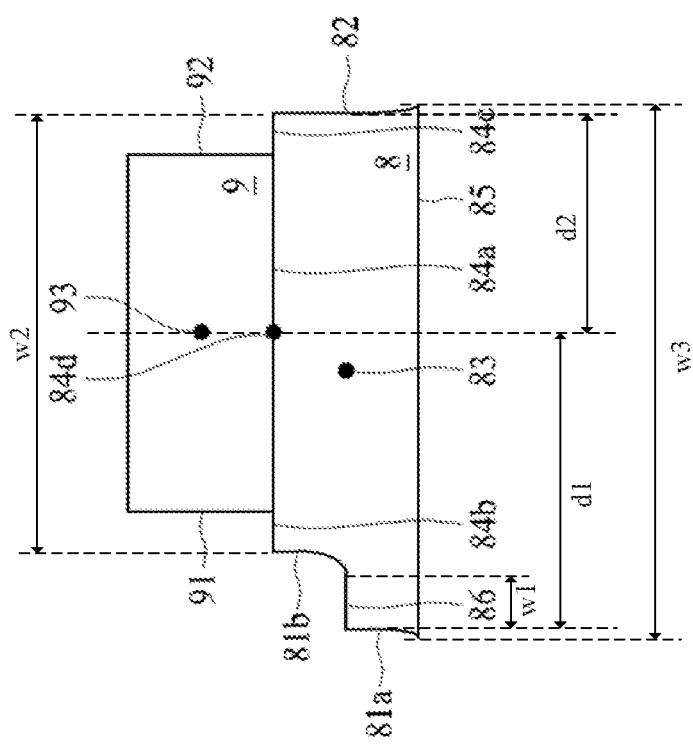
FIG. 1(b) shows an embodiment and a configuration of a gate electrode and a doped nitride semiconductor layer in a gate structure in a dotted box in FIG. 1(a)

FIG. 1(b) to FIG. 1(l) show one or more embodiments of a gate structure 80 in a dotted box in FIG. 1(a):

As shown in FIG. 1(b), the gate structure 80 of the present invention may include a doped nitride semiconductor layer 8 and a gate electrode 9, and the doped nitride semiconductor layer 8 may have a surface 84 and a surface 85. The surface 84 may include a part 84a electrically connected to the gate electrode, and a part 84b and a part 84c adjacent to the part 84a. The part 84a of the doped nitride semiconductor layer 8 may be in contact with the gate electrode 9. The part 84b and the part 84c may be in direct contact with a passivation layer (not shown in FIG. 1(a) to FIG. 1(l)) of the HEMT device. The surface 85 may be in contact with the nitride semiconductor layer 5. Substantially along the tangential direction, the geometric center 93 of the gate electrode 9 may be aligned with the geometric center 84d of the surface 84. Substantially along the tangential direction, the geometric center 93 of the gate electrode 9 may be aligned with the geometric center 84d of the part 84a of the surface 84.

The doped nitride semiconductor layer 8 has a protrusion adjacent to the source contact 6, and this protrusion extends toward the source contact 6 along the tangential direction. Therefore, a sidewall 81 of the doped nitride semiconductor layer 8 forms a one-step shaped contour line, which sequentially includes interfaces such as a sidewall 81a, a surface 86, and a sidewall 81b. In this aspect, the doped nitride semiconductor layer 8 has the sidewall 81a adjacent to the source contact 6 and a sidewall 82 adjacent to the drain contact 7, and the sidewall 81*b* positioned between the sidewall 81*a* and the sidewall 82 substantially along the tangential direction, and the sidewall 81*b* is positioned between the sidewall 81*a* and the gate electrode 9 substantially along the tangential direction. The doped nitride semiconductor layer 8 may have the surface 86 positioned between the surface 84 and the surface 85 substantially along the normal direction, and the surface 86 may be positioned between the gate electrode 9 and the source contact 6 in a direction substantially parallel to the tangential direction, and extend toward the source contact 6.

The doped nitride semiconductor layer 8 only has the protrusion adjacent to the source contact 6. Therefore, on the tangent plane substantially along the connecting line between the source contact 6 and the drain contact 7, the doped nitride semiconductor layer 8 is a non-mirror-symmetric structure relative to the geometric center 83 thereof. In this aspect, the leakage current $J_{gs}$ between the gate and the source is less than the leakage current $J_{gd}$ between the gate and the drain.

Substantially along the normal direction, a ratio of the height of the sidewall 81*b* to that of the sidewall 81*a* may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2.

Substantially along the tangential direction, a ratio of a shortest distance between the gate electrode 9 and the sidewall 81*a* to a shortest distance between the gate electrode 9 and the sidewall 82 may be greater than 1, for example, but not limited to: 1.1, 1.2, 1.3, 1.4, 1.5, 1.6, 1.7, 1.8, 1.9, 2, 2.1, 2.2, 2.3, 2.4 or 2.5; and the ratio of the shortest distance between the gate electrode 9 and the sidewall 81*a* to the shortest distance between the gate electrode 9 and the sidewall 82 may not exceed 4, for example, but not limited to: 4, 3.9, 3.8, 3.7, 3.6, 3.5, 3.4, 3.3, 3.2, 3.1, 3, 2.9, 2.8, 2.7, 2.6, or 2.5. For example, the shortest distance between the gate electrode 9 and the sidewall 81*a* may be d1, the shortest distance between the gate electrode 9 and the sidewall 82 may be d2, where d1/d2 may be greater than 1. In some embodiments, the shortest distance between the gate electrode 9 and the sidewall 81*a* may be a shortest distance between a center line of the gate electrode 9 substantially parallel to the normal direction and the sidewall 81*a* in the tangential direction, and the shortest distance between the gate electrode 9 and the sidewall 82 may be a shortest distance between the center line of the gate electrode 9 substantially parallel to the normal direction and the sidewall 82 in the tangent direction.

In the tangential direction, a ratio of the width of the surface 86 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2. For example, the width of the surface 86 may be w1, and the width of the surface 84 may be w2, where w1/w2 may be 0.05 to 0.2.

In the tangential direction, a ratio of the width of the surface 86 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15. For example, the width of the surface 86 may be w1, and the width of the surface 85 may be w3, where w1/w3 may be 0.02 to 0.15.

The sidewall 81*a* of the doped nitride semiconductor layer 8 may be in direct contact with the passivation layer. The sidewall 82 of the doped nitride semiconductor layer 8 may be in direct contact with the passivation layer. The sidewall 81*b* of the doped nitride semiconductor layer 8 may be in direct contact with the passivation layer. The surface 86 of the doped nitride semiconductor layer 8 may be in direct contact with the passivation layer.

If the part 84*b* of the surface 84 of the doped nitride semiconductor layer 8 exists, the part 84*b* may be in direct contact with the passivation layer. If the part 84*c* of the surface 84 of the doped nitride semiconductor layer 8 exists, the part 84*c* may be in direct contact with the passivation layer.

The gate structure 80 shown in FIG. 1(*c*) is substantially the same as that in FIG. 1(*b*). A difference lies in that, the protrusion of the doped nitride semiconductor layer 8 is positioned adjacent to the drain contact 7 rather than adjacent to the source contact 6, and this protrusion extends toward the drain contact 7 along the tangential direction. Therefore, the sidewall 82 of the doped nitride semiconductor layer 8 forms a one-step shaped contour line, which sequentially includes interfaces such as a sidewall 82*a*, a surface 87 and a sidewall 82*b*. In this aspect, the doped nitride semiconductor layer 8 has the sidewall 81 adjacent to the drain contact 7 and the sidewall 82*a* adjacent to the drain contact, and the sidewall 82*b* positioned between the sidewall 81 and the sidewall 82*a* substantially along the tangential direction, and the sidewall 82*b* is positioned between the gate electrode 9 and the sidewall 82*a* substantially along the tangential direction. The doped nitride semiconductor layer 8 has the surface 87 positioned between the surface 84 and the surface 85 substantially along the normal direction, and the surface 87 is positioned between the gate electrode 9 and the drain contact 7 in a direction substantially parallel to the tangential direction, and extends toward the drain contact 7.

The doped nitride semiconductor layer 8 only has the protrusion adjacent to the drain contact 7. Therefore, on the tangent plane substantially along the connecting line between the source contact 6 and the drain contact 7, the doped nitride semiconductor layer 8 is a non-mirror-symmetric structure relative to the geometric center 83 thereof. In this aspect, the leakage current $J_{gd}$ between the gate and the drain is less than the leakage current $J_{gs}$ between the gate and the source.

Substantially along the normal direction, a ratio of the height of the sidewall 82*b* to that of the sidewall 82*a* may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2.

Substantially along the tangential direction, a ratio of a shortest distance between the gate electrode 9 and the sidewall 82*a* to a shortest distance between the gate electrode 9 and the sidewall 81 may be greater than 1, for example, but not limited to: 1.1, 1.2, 1.3, 1.4, 1.5, 1.6, 1.7, 1.8, 1.9, 2, 2.1, 2.2, 2.3, 2.4 or 2.5; and the ratio of the shortest distance between the gate electrode 9 and the sidewall 82*a* to the shortest distance between the gate electrode 9 and the sidewall 81 may not exceed 4, for example, but not limited to: 4, 3.9, 3.8, 3.7, 3.6, 3.5, 3.4, 3.3, 3.2, 3.1, 3, 2.9, 2.8, 2.7, 2.6, or 2.5. For example, the shortest distance between the gate electrode 9 and the sidewall 82*a* may be d3, the shortest distance between the gate electrode 9 and the sidewall 81 may be d4, where d3/d4 may be greater than 1. In some embodiments, the shortest distance between the gate electrode 9 and the sidewall 82*a* may be a shortest distance between a center line of the gate electrode 9 substantially parallel to the normal direction and the sidewall 82*a* in the tangential direction, and the shortest distance between the gate electrode 9 and the sidewall 81 may be a shortest distance between the center line of the gate electrode 9 substantially parallel to the normal direction and the sidewall 81 in the tangent direction.

In the tangential direction, a ratio of the width of the surface 87 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2.

In the tangential direction, a ratio of the width of the surface 87 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15.

The sidewall 81 of the doped nitride semiconductor layer 8 may be in direct contact with the passivation layer. The sidewall 81a of the doped nitride semiconductor layer 8 may be in direct contact with the passivation layer. The sidewall 82b of the doped nitride semiconductor layer 8 may be in direct contact with the passivation layer. The surface 87 of the doped nitride semiconductor layer 8 may be in direct contact with the passivation layer.

If the part 84b of the surface 84 of the doped nitride semiconductor layer 8 exists, the part 84b may be in direct contact with the passivation layer. If the part 84c of the surface 84 of the doped nitride semiconductor layer 8 exists, the part 84c may be in direct contact with the passivation layer.

The gate structure 80 shown in FIG. 1(d) is substantially the same as that in FIG. 1(b) or FIG. 1(c). A difference lies in that, the doped nitride semiconductor layer 8 has a protrusion that is adjacent to the source contact 6 and extends toward the source contact 6 along the tangential direction, and at the same time has another protrusion that is adjacent to the drain contact 7 and extends toward the drain contact 7 along the tangential direction. Therefore, the sidewall 81 of the doped nitride semiconductor layer 8 forms a one-step shaped contour line, which sequentially includes interfaces such as a sidewall 81a, a surface 86 and a sidewall 81b; and the sidewall 82 of the doped nitride semiconductor layer 8 forms a one-step shaped contour line, which sequentially includes interfaces such as a sidewall 82a, a surface 87 and a sidewall 82b. In this aspect, the doped nitride semiconductor layer 8 has the sidewall 81a adjacent to the source contact 6 and a sidewall 82a adjacent to the drain contact, and the sidewall 81b and the sidewall 82b positioned between the sidewall 81a and the sidewall 82a substantially along the tangential direction; and substantially along the tangential direction, the sidewall 81b is positioned between the sidewall 81a and the gate electrode 9 and the sidewall 82b is positioned between the gate electrode 9 and the sidewall 82a. The doped nitride semiconductor layer 8 may have the surface 86 and the surface 87 positioned between the surface 84 and the surface 85 substantially along the normal direction; and in a direction substantially parallel to the tangential direction, the surface 86 is positioned between the gate electrode 9 and the source contact 6 and extends toward the source contact 6, and the surface 87 is positioned between the gate electrode 9 and the drain contact 7 and extends toward the drain contact 7.

The doped nitride semiconductor layer 8 may be a non-mirror-symmetric structure or mirror-symmetric structure relative to the geometric center 83 thereof.

Substantially along the normal direction, a ratio of the height of the sidewall 81b to that of the sidewall 81a may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2; and a ratio of the height of the sidewall 82b to that of the sidewall 81a may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2. The sidewall 81a and the sidewall 82a may have the same height. The sidewall 81a and the sidewall 82a may have different heights. The sidewall 81b and the sidewall 82b may have the same height. The sidewall 81b and the sidewall 82b may have different heights.

Substantially along the tangential direction, a ratio of a shortest distance between the gate electrode 9 and the sidewall 81a to a shortest distance between the gate electrode 9 and the sidewall 82a may be greater than or equal to 1, for example, but not limited to: 1, 1.1, 1.2, 1.3, 1.4, 1.5, 1.6, 1.7, 1.8, 1.9, 2, 2.1, 2.2, 2.3, 2.4 or 2.5; and the ratio of the shortest distance between the gate electrode 9 and the sidewall 81a to the shortest distance between the gate electrode 9 and the sidewall 82a may not exceed 4, for example, but not limited to: 4, 3.9, 3.8, 3.7, 3.6, 3.5, 3.4, 3.3, 3.2, 3.1, 3, 2.9, 2.8, 2.7, 2.6, or 2.5. In this aspect, the leakage current $J_{gs}$ between the gate and the source is less than the leakage current $J_{gd}$ between the gate and the drain.

In some embodiments, substantially along the tangential direction, a ratio of a shortest distance between the gate electrode 9 and the sidewall 82a to a shortest distance between the gate electrode 9 and the sidewall 81a is greater than or equal to 1, for example, but not limited to: 1, 1.1, 1.2, 1.3, 1.4, 1.5, 1.6, 1.7, 1.8, 1.9, 2, 2.1, 2.2, 2.3, 2.4 or 2.5; and in some cases, the ratio of the shortest distance between the gate electrode 9 and the sidewall 81a to the shortest distance between the gate electrode 9 and the sidewall 82 does not exceed 4, for example, but not limited to: 4, 3.9, 3.8, 3.7, 3.6, 3.5, 3.4, 3.3, 3.2, 3.1, 3, 2.9, 2.8, 2.7, 2.6, or 2.5. In this aspect, the leakage current $J_{gd}$ between the gate and the drain is less than the leakage current $J_{gs}$ between the gate and the source.

Substantially along the tangential direction, a ratio of a shortest distance between the gate electrode 9 and the sidewall 81b to a shortest distance between the gate electrode 9 and the sidewall 82b may be greater than or equal to 1, for example, but not limited to: 1, 1.1, 1.2, 1.3, 1.4, 1.5, 1.6, 1.7, 1.8, 1.9 or 2; and the ratio of the shortest distance between the gate electrode 9 and the sidewall 81b to the shortest distance between the gate electrode 9 and the sidewall 82b may not exceed 3, for example, but not limited to: 3, 2.9, 2.8, 2.7, 2.6, 2.5, 2.4, 2.3, 2.2, 2.1 or 2. In this aspect, the leakage current $J_{gs}$ between the gate and the source is less than the leakage current $J_{gd}$ between the gate and the drain.

Substantially along the tangential direction, a ratio of a shortest distance between the gate electrode 9 and the sidewall 82b to a shortest distance between the gate electrode 9 and the sidewall 81b may be greater than or equal to 1, for example, but not limited to: 1, 1.1, 1.2, 1.3, 1.4, 1.5, 1.6, 1.7, 1.8, 1.9 or 2; and the ratio of the shortest distance between the gate electrode 9 and the sidewall 81b to the shortest distance between the gate electrode 9 and the sidewall 82b may not exceed 3, for example, but not limited to: 3, 2.9, 2.8, 2.7, 2.6, 2.5, 2.4, 2.3, 2.2, 2.1 or 2. In this aspect, the leakage current $J_{gd}$ between the gate and the drain is less than the leakage current $J_{gs}$ between the gate and the source.

In the tangential direction, a ratio of the width of the surface 86 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2.

In the tangential direction, a ratio of the width of the surface 86 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15.

In the tangential direction, a ratio of the width of the surface 87 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2.

In the tangential direction, a ratio of the width of the surface 87 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15.

The sidewall 81*a* of the doped nitride semiconductor layer 8 may be in direct contact with the passivation layer. The sidewall 82*a* of the doped nitride semiconductor layer 8 may be in direct contact with the passivation layer. The sidewall 81*b* of the doped nitride semiconductor layer 8 may be in direct contact with the passivation layer. The sidewall 82*b* of the doped nitride semiconductor layer 8 may be in direct contact with the passivation layer. The surface 86 of the doped nitride semiconductor layer 8 may be in direct contact with the passivation layer. The surface 87 of the doped nitride semiconductor layer 8 may be in direct contact with the passivation layer.

If the part 84*b* of the surface 84 of the doped nitride semiconductor layer 8 exists, the part 84*b* may be in direct contact with the passivation layer. If the part 84*c* of the surface 84 of the doped nitride semiconductor layer 8 exists, the part 84*c* may be in direct contact with the passivation layer.

According to some aspects of the present invention, on the tangent plane substantially along the connecting line between the source contact 6 and the drain contact 7, an angle between any tangent plane of the sidewall 81 of the doped nitride semiconductor layer 8 and the tangential direction may be 30° to 150°; and an angle between the tangential direction and a connecting line between an intersection of the sidewall 81 and the surface 84 and an intersection of the sidewall 81 and the surface 85 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

An angle between any tangent plane of the sidewall 82 and the tangential direction may be 30° to 150°; and an angle between the tangential direction and a connecting line between an intersection of the sidewall 82 and the surface 84 and an intersection of the sidewall 82 and the surface 85 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

An angle between any tangent plane of the sidewall 81*a* and the tangential direction may be 30° to 150°; and an angle between the tangential direction and a connecting line between an intersection of the sidewall 81*a* and the surface 86 and an intersection of the sidewall 81*a* and the surface 85 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

An angle between any tangent plane of the sidewall 82*a* and the tangential direction may be 30° to 150°; and an angle between the tangential direction and a connecting line between an intersection of the sidewall 82*a* and the surface 87 and an intersection of the sidewall 81*a* and the surface 85 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

An angle between any tangent plane of the sidewall 81*b* and the tangential direction may be 30° to 150°; and an angle between the tangential direction and a connecting line between an intersection of the sidewall 81*b* and the surface 84 and an intersection of the sidewall 81*b* and the surface 86 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

An angle between any tangent plane of the sidewall 82*b* and the tangential direction may be 30° to 150°; and an angle between the tangential direction and a connecting line between an intersection of the sidewall 82*b* and the surface 84 and an intersection of the sidewall 82*b* and the surface 87 may be 30° to 150°, for example, but not limited to: 30°, 35°, 40°, 45°, 50°, 55°, 60°, 65°, 70°, 75°, 80°, 85°, 90°, 95°, 100°, 105°, 110°, 115°, 120°, 125°, 130°, 135°, 140°, 145° or 150°.

In the tangential direction, the orthographic projection range of the sidewall 81, the sidewall 82, the sidewall 81*a*, the sidewall 82*a*, the sidewall 81*b* or the sidewall 82*b* of the doped nitride semiconductor layer 8 may not overlap the surface 84; or the orthographic projection range of the sidewall 81, the sidewall 82, the sidewall 81*a*, the sidewall 82*a*, the sidewall 81*b* or the sidewall 82*b* may overlap the surface 84.

In the tangential direction, the orthographic projection range of the sidewall 81, the sidewall 82, the sidewall 81*a*, the sidewall 82*a*, the sidewall 81*b* or the sidewall 82*b* may not overlap the surface 85; or the orthographic projection range of the sidewall 81, the sidewall 82, the sidewall 81*a*, the sidewall 82*a*, the sidewall 81*b* or the sidewall 82*b* may overlap the surface 85.

In the tangential direction, the orthographic projection range of the surface 86 of the doped nitride semiconductor layer 8 may not overlap the surface 84; or the orthographic projection range of the surface 86 may overlap the surface 84.

In the tangential direction, the orthographic projection range of the surface 86 may not overlap the surface 85; or the orthographic projection range of the surface 86 may overlap the surface 85.

In the tangential direction, the orthographic projection range of the surface 87 may not overlap the surface 84; or the orthographic projection range of the surface 87 may overlap the surface 84.

In the tangential direction, the orthographic projection range of the surface 87 may not overlap the surface 85; or the orthographic projection range of the surface 87 may overlap the surface 85.

In the tangential direction, the orthographic projection range of the sidewall 81*a* of the doped nitride semiconductor layer 8 may overlap the surface 86. The orthographic projection range of the sidewall 81*b* may overlap the surface 86. The orthographic projection range of the sidewall 81*a* may not overlap the surface 86. The orthographic projection range of the sidewall 81*b* may not overlap the surface 86.

In the tangential direction, the orthographic projection range of the sidewall 82*a* may overlap the surface 87. The orthographic projection range of the sidewall 82*b* may overlap the surface 87. The orthographic projection range of the sidewall 82*a* may not overlap the surface 87. The orthographic projection range of the sidewall 82*b* may not overlap the surface 87.

The inventors have unexpectedly found that, when a sidewall of the doped nitride semiconductor layer 8 deviates from the normal direction, the gate leakage current phenomenon of the HEMT device may be effectively improved. For example, as shown in FIG. 1(*e*), the gate structure 80 in the figure is substantially the same as that in FIG. 1(*b*). A difference lies in that, an angle between the tangential direction and a connecting line between an intersection of the sidewall 81b and the surface 84 and an intersection of the sidewall 81b and the surface 86 is less than 80°.

Figure 1F:
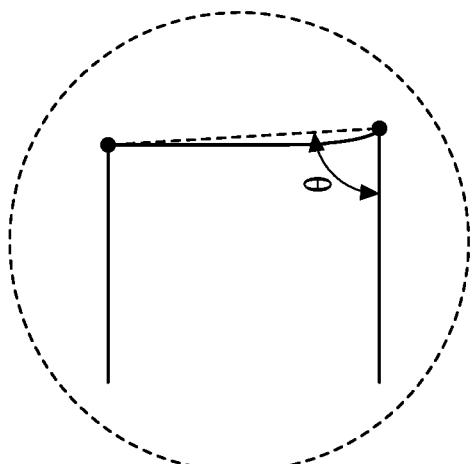
FIG. 1(f) shows an enlarged view of a sidewall adjacent to a source and a sidewall adjacent to a drain of a doped nitride semiconductor layer in a dotted box in FIG. 1(e)
Figure 1F:
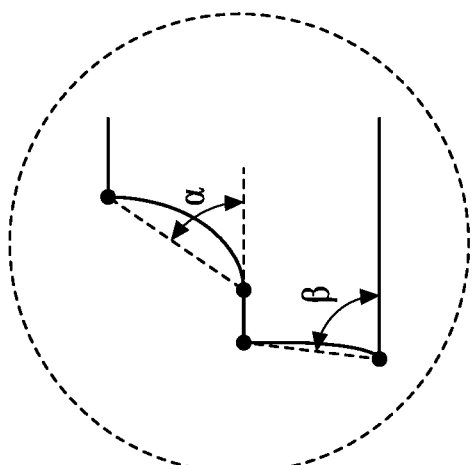

FIG. 1(f) shows an enlarged view in a dotted box in FIG. 1(e), where an angle between the tangential direction and a connecting line between an intersection of the sidewall 81b and the surface 84 of the doped nitride semiconductor layer 8 and an intersection of the sidewall 81b and the surface 86 is α, and α<80°; an angle between the tangential direction and a connecting line between an intersection of the sidewall 81a and the surface 86 and an intersection of the sidewall 81a and the surface 85 is β, and β>80'; and an angle between the tangential direction and a connecting line between an intersection of the sidewall 82 and the surface 84 and an intersection of the sidewall 82 and the surface 85 is θ, and θ>80°.

The inventors have unexpectedly found that, compared with the structure in FIG. 1(b), the structure in FIG. 1(e) may further suppress the leakage current $J_{gs}$ between the gate and the source, thereby further improving the gate leakage current phenomenon of the HEMT device. Likewise, if the sidewall 82b in FIG. 1(c) is modified to deviate from the normal direction, the leakage current $J_{gd}$ between the gate and the drain may be further suppressed, thereby further improving the gate leakage current phenomenon of the HEMT device.

In the tangential direction, the orthographic projection ranges of the sidewall 82, the sidewall 81a, and the sidewall 81b of the doped nitride semiconductor layer 8 may not overlap the surface 84; and the orthographic projection ranges of the sidewall 82, the sidewall 81a, and the sidewall 81b may overlap the range of the surface 85.

In the tangential direction, the orthographic projection range of the surface 86 of the doped nitride semiconductor layer 8 may not overlap the range of the surface 84; and the orthographic projection range of the surface 86 may overlap the range of the surface 85.

In the tangential direction, the orthographic projection range of the sidewall 81a of the doped nitride semiconductor layer 8 may not overlap the range of the surface 86; and the orthographic projection range of the sidewall 81b falls beyond the range of the surface 86.

A skilled person in the art can use any known method to form a doped nitride semiconductor layer 8 having a sidewall not parallel to the normal direction, appropriate methods are, for example, but not limited to, a method published in a thesis by D. Zhuang et al., in Materials Science and Engineering R 48 (2005) 1-46, and the thesis is incorporated in this specification by reference in its entirety.

Figure 1H:
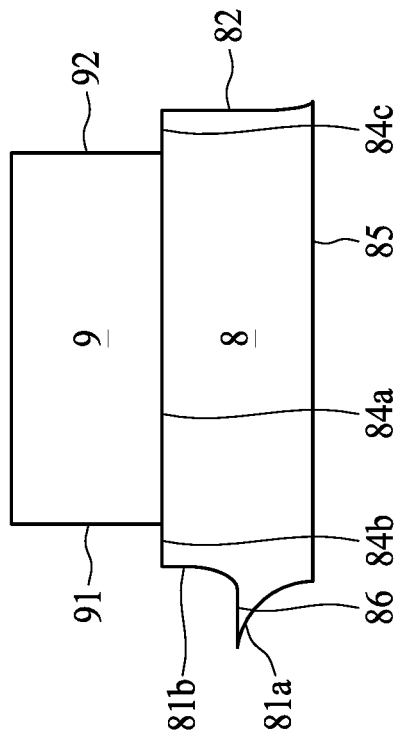
FIG. 1(h) shows an embodiment and a configuration of a gate electrode and a doped nitride semiconductor layer in a gate structure in a dotted box in FIG. 1(a), which is a further improvement of the structure in FIG. 1(b)
Figure 1G:
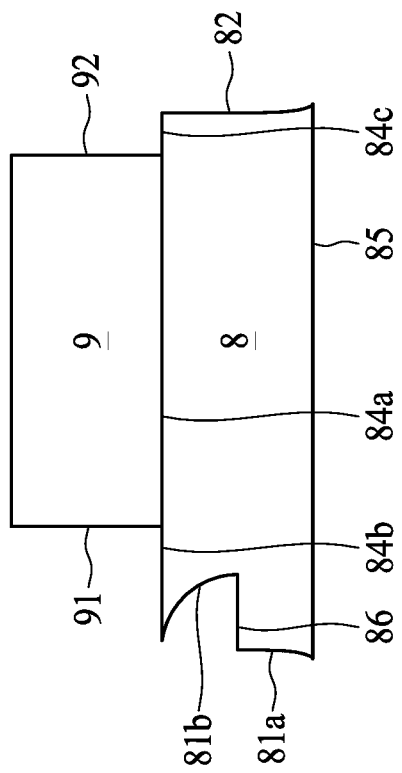
FIG. 1(g) shows an embodiment and a configuration of a gate electrode and a doped nitride semiconductor layer in a gate structure in a dotted box in FIG. 1(a), which is a further improvement of the structure in FIG. 1(b)

The gate structure 80 shown in FIG. 1(g) is substantially the same as that in FIG. 1(e). A difference lies in that, an angle between the tangential direction and a connecting line between an intersection of the sidewall 81b and the surface 84 of the doped nitride semiconductor layer 8 and an intersection of the sidewall 81b and the surface 86 is greater than 100°. In this aspect, in the tangential direction, the orthographic projection range of the sidewall 81b of the doped nitride semiconductor layer 8 may overlap the range of the surface 84, and the orthographic projection range of the sidewall 81a may overlap the range of the surface 84, or may not overlap the range of the surface 84; and the orthographic projection ranges of the sidewall 81a and the sidewall 81b may overlap the range of the surface 85.

The inventors have unexpectedly found that, compared with the structure in FIG. 1(b), the structure in FIG. 1(g) may further suppress the leakage current $J_{gs}$ between the gate and the source, thereby further improving the gate leakage current phenomenon of the HEMT device. Likewise, if the sidewall 82b in FIG. 1(c) is modified to make an angle between the sidewall 82b and the tangential direction be greater than 100°, the leakage current $J_{gd}$ between the gate and the drain may be further suppressed, thereby further improving the gate leakage current phenomenon of the HEMT device.

In the tangential direction, the orthographic projection range of the surface 86 of the doped nitride semiconductor layer 8 may overlap the range of the surface 84; and the orthographic projection range of the surface 86 may overlap the range of the surface 85.

In the tangential direction, the orthographic projection range of the sidewall 81a of the doped nitride semiconductor layer 8 may not overlap the range of the surface 86; and the orthographic projection range of the sidewall 81b may overlap the range of the surface 86.

The gate structure 80 shown in FIG. 1(h) is substantially the same as that in FIG. 1(e). A difference lies in that, an angle between the tangential direction and a connecting line between an intersection of the sidewall 81a and the surface 86 of the doped nitride semiconductor layer 8 and an intersection of the sidewall 81a and the surface 85 is greater than 100°. In this aspect, in the tangential direction, the orthographic projection range of the sidewall 81b of the doped nitride semiconductor layer 8 may not overlap the range of the surface 84, and the orthographic projection range of the sidewall 81a may overlap the range of the surface 84, or may not overlap the range of the surface 84; the orthographic projection range of the sidewall 81a may not overlap the range of the surface 85; and the orthographic projection range of the sidewall 81b may overlap the range of the surface 85, or may not overlap the range of the surface 85.

The inventors have unexpectedly found that, compared with the structure in FIG. 1(b), the structure in FIG. 1(h) may further suppress the leakage current $J_{gs}$ between the gate and the source, thereby further improving the gate leakage current phenomenon of the HEMT device. Likewise, if the sidewall 82a in FIG. 1(c) is modified to make an angle between the sidewall 82a and the tangential direction be greater than 100°, the leakage current $J_{gd}$ between the gate and the drain may be further suppressed, thereby further improving the gate leakage current phenomenon of the HEMT device.

In the tangential direction, the orthographic projection of the surface 86 of the doped nitride semiconductor layer 8 may not overlap the range of the surface 84; and the orthographic projection range of the surface 86 may overlap the range of the surface 85, or may not overlap the range of the surface 85.

In the tangential direction, the orthographic projection range of the sidewall 81a of the doped nitride semiconductor layer 8 may overlap the range of the surface 86; and the orthographic projection range of the sidewall 81b may not overlap the range of the surface 86.

Figure 1J:
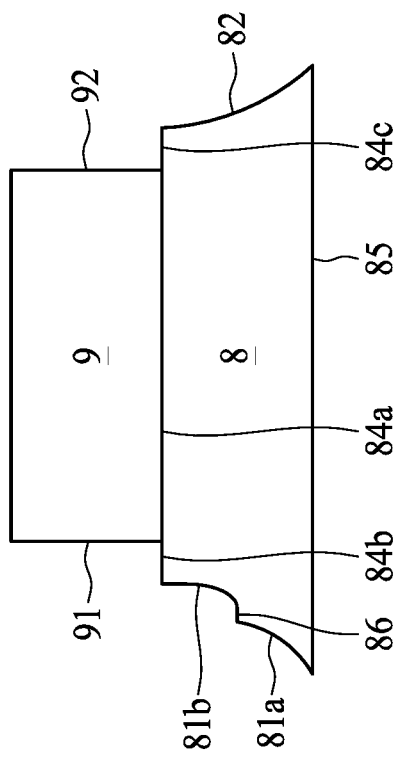
FIG. 1(j) shows an embodiment and a configuration of a gate electrode and a doped nitride semiconductor layer in a gate structure in a dotted box in FIG. 1(a), which is a further improvement of the structure in FIG. 1(i)
Figure 1I:
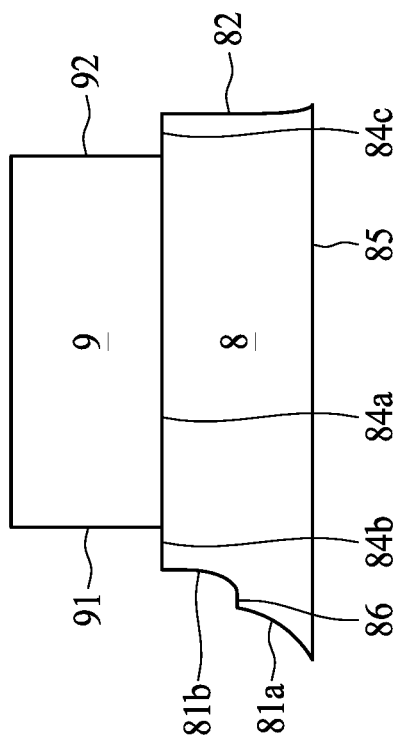
FIG. 1(i) shows an embodiment and a configuration of a gate electrode and a doped nitride semiconductor layer in a gate structure in a dotted box in FIG. 1(a), which is a further improvement of the structure in FIG. 1(b)
Figure 1L:
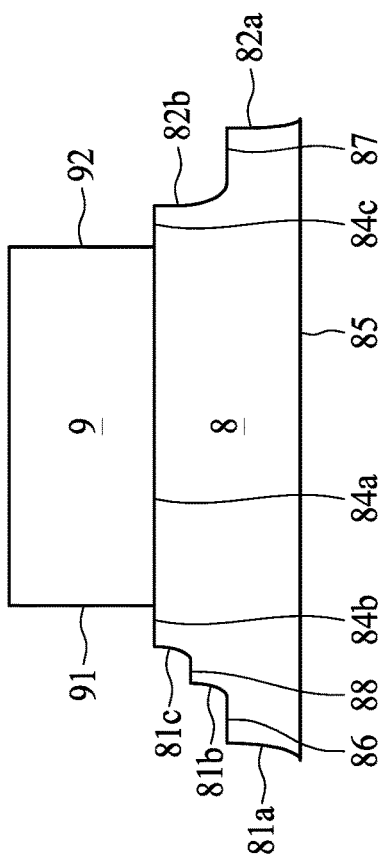
FIG. 1(l) shows an embodiment and a configuration of a gate electrode and a doped nitride semiconductor layer in a gate structure in a dotted box in FIG. 1(a), which is a further improvement of the structure in FIG. 1(k)

The gate structure 80 shown in FIG. 1(i) is substantially the same as that in FIG. 1(e). A difference lies in that, an angle between the tangential direction and a connecting line between an intersection of the sidewall 81a and the surface 86 of the doped nitride semiconductor layer 8 and an intersection of the sidewall 81a and the surface 85 is less than 80°. In this aspect, in the tangential direction, the orthographic projection range of the sidewall 81b of the doped nitride semiconductor layer 8 may not overlap the range of the surface 84, and the orthographic projection range of the sidewall 81a may not overlap the range of the surface 84; the orthographic projection range of the sidewall 81a may overlap the range of the surface 85; and the orthographic projection range of the sidewall 81b may overlap the range of the surface 85.

The inventors have unexpectedly found that, compared with the structure in FIG. 1(b), the structure in FIG. 1(i) may further suppress the leakage current $J_{gs}$ between the gate and the source, thereby further improving the gate leakage current phenomenon of the HEMT device. Likewise, if the sidewall 82a in FIG. 1(c) is modified to make an angle between the sidewall 82a and the tangential direction be less than 80°, the leakage current $J_{gd}$ between the gate and the drain may be further suppressed, thereby further improving the gate leakage current phenomenon of the HEMT device.

In the tangential direction, the orthographic projection of the surface 86 of the doped nitride semiconductor layer 8 may not overlap the range of the surface 84; and the orthographic projection range of the surface 86 may overlap the range of the surface 85.

In the tangential direction, the orthographic projection range of the sidewall 81a of the doped nitride semiconductor layer 8 may not overlap the range of the surface 86; and the orthographic projection range of the sidewall 81b may not overlap the range of the surface 86.

The gate structure 80 shown in FIG. 1(j) is substantially the same as that in FIG. 1(i). A difference lies in that, an angle between the tangential direction and a connecting line between an intersection of the sidewall 82 and the surface 84 of the doped nitride semiconductor layer 8 and an intersection of the sidewall 82 and the surface 85 is less than 80°. In this aspect, in the tangential direction, the orthographic projection range of the sidewall 82 of the doped nitride semiconductor layer 8 may not overlap the range of the surface 84, and the orthographic projection range of the sidewall 82 may overlap the range of the surface 85.

The inventors have unexpectedly found that, compared with the structure in FIG. 1(i), the structure in FIG. 1(j) may further suppress the leakage current $J_{gd}$ between the gate and the drain, thereby further improving the gate leakage current phenomenon of the HEMT device.

Figure 1K:
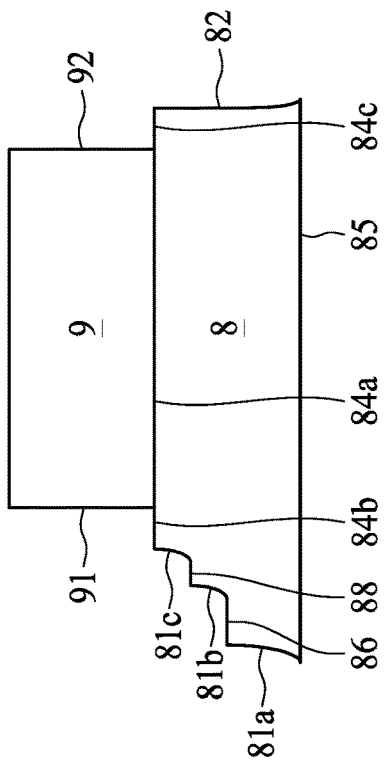
FIG. 1(k) shows an embodiment and a configuration of a gate electrode and a doped nitride semiconductor layer in a gate structure in a dotted box in FIG. 1(a), which is a further improvement of the structure in FIG. 1(b)

The doped nitride semiconductor layer 8 may have at least two protrusions adjacent to the source contact 6, and the protrusions extend toward the source contact 6 along the tangential direction. For example, the gate structure 80 shown in FIG. 1(k) is substantially the same as that shown in FIG. 1(b). A difference lies in that the doped nitride semiconductor layer 8 has two protrusions adjacent to the source contact 6, and the protrusions extend toward the source contact 6 along the tangential direction. Therefore, the sidewall 81 of the doped nitride semiconductor layer 8 forms a two-step shaped contour line, which sequentially includes interfaces such as a sidewall 81a, a surface 86, a sidewall 81b, a surface 88 and a sidewall 81c. In this aspect, the doped nitride semiconductor layer 8 has the sidewall 81a adjacent to the source contact 6 and a sidewall 82 adjacent to the drain contact 7, and the sidewall 81b and the sidewall 81c positioned between the sidewall 81a and the sidewall 82 substantially along the tangential direction; and substantially along the tangential direction, the sidewall 81b is positioned between the sidewall 81a and the gate electrode 9 and the sidewall 81c is positioned between the sidewall 81b and the gate electrode 9. The doped nitride semiconductor layer 8 has the surface 86 and the surface 88 positioned between the surface 84 and the surface 85 substantially along the normal direction, the surface 86 is positioned between the gate electrode 9 and the source contact 6 in a direction substantially parallel to the tangential direction and extends toward the source contact 6, and the surface 88 is positioned between the gate electrode 9 and the surface 86 in a direction substantially parallel to the tangential direction and extends toward the source contact 6.

Substantially along the normal direction, a ratio of the height of the sidewall 81b to that of the sidewall 81a may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2; and a ratio of the height of the sidewall 81c to that of the sidewall 81a may be 0.5 to 2, for example, but not limited to: 0.5, 0.6, 0.7, 0.8, 0.9, 1, 1.1, 1.2, 1.3, 1.4, 1.5, 1.6, 1.7, 1.8, 1.9 or 2.

In the tangential direction, a ratio of the width of the surface 86 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2.

In the tangential direction, a ratio of the width of the surface 86 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15.

In the tangential direction, a ratio of the width of the surface 88 to the width of the surface 84 may be 0.05 to 0.2, for example, but not limited to: 0.05, 0.06, 0.07, 0.08, 0.09, 0.1, 0.11, 0.12, 0.13, 0.14, 0.15, 0.16, 0.17, 0.18, 0.19 or 0.2.

In the tangential direction, a ratio of the width of the surface 88 to the width of the surface 85 may be 0.02 to 0.15, for example, but not limited to: 0.02, 0.03, 0.04, 0.05, 0.06, 0.07, 0.08, 0.09, 0.1, 0.11, 0.12, 0.13, 0.14, or 0.15.

The sidewall 81a of the doped nitride semiconductor layer 8 may be in direct contact with the passivation layer. The sidewall 82 of the doped nitride semiconductor layer 8 may be in direct contact with the passivation layer. The sidewall 81b of the doped nitride semiconductor layer 8 may be in direct contact with the passivation layer. The sidewall 81c of the doped nitride semiconductor layer 8 may be in direct contact with the passivation layer. The surface 86 of the doped nitride semiconductor layer 8 may be in direct contact with the passivation layer. The surface 88 of the doped nitride semiconductor layer 8 may be in direct contact with the passivation layer.

If the part 84b of the surface 84 of the doped nitride semiconductor layer 8 exists, the part 84b may be in direct contact with the passivation layer. If the part 84c of the surface 84 of the doped nitride semiconductor layer 8 exists, the part 84c may be in direct contact with the passivation layer.

The doped nitride semiconductor layer 8 may alternatively have at least two protrusions adjacent to the drain contact 7, and the protrusions extend toward the drain contact 7 along the tangential direction. The protrusions may be configured in the aforementioned manner.

The inventors have unexpectedly found that, the number of sidewall protrusions (or steps) of the doped nitride semiconductor layer 8 is related to the magnitude of the gate leakage current; have found that when the number of protrusions or steps is increased, the gate leakage current phenomenon can be more effectively improved; and have found through further research that, the gate leakage current phenomenon is also related to the sidewall roughness. When the sidewall roughness is greater than 50 nm, uneven electric field distribution of the gate would be present, and then earlier breakdown of the device is caused. Compared with the structure in FIG. 1(b), the structure in FIG. 1(k) further suppresses the leakage current $J_{gs}$ between the gate and the source, thereby further improving the gate leakage current phenomenon of the HEMT device. Likewise, if the number of protrusions of the doped nitride semiconductor layer 8 in FIG. 1(c) that are adjacent to the drain contact 7 is increased, the leakage current $J_{gd}$ between the gate and the drain may be further suppressed, thereby further improving the gate leakage current phenomenon of the HEMT device. However, if the sidewall roughness is increased due to the limitation to the etching technology or material characteristics in a process of manufacturing a sidewall protrusion or step, an adverse effect may be generated for the effect of the gate leakage current phenomenon. If a general etching process is used for preparing a sidewall protrusion or step for the doped nitride semiconductor layer 8 whose thickness is 50 to 100 nm, it is found through repetitive research that when the number of sidewall protrusions or steps is 1 or 2, the gate leakage current is improved relatively notably.

The gate structure 80 shown in FIG. 1(*l*) is substantially the same as that in FIG. 1(*k*). A difference lies in that, the doped nitride semiconductor layer 8 has a protrusion adjacent to the drain contact 7, and this protrusion extends toward the drain contact 7 along the tangential direction. Therefore, the sidewall 82 of the doped nitride semiconductor layer 8 forms a one-step shaped contour line, which sequentially includes interfaces such as a sidewall 82*a*, a surface 87 and a sidewall 82*b*. In this aspect, the doped nitride semiconductor layer 8 has the sidewall 81*a* adjacent to the source contact 6 and a sidewall 82*a* adjacent to the drain contact, and the sidewall 81*b*, the sidewall 82*b*, and the sidewall 81*c* positioned between the sidewall 81*a* and the sidewall 82*a* substantially along the tangential direction; and substantially along the tangential direction, the sidewall 81*b* is positioned between the sidewall 81*a* and the gate electrode 9, the sidewall 81*c* is positioned between the sidewall 81*b* and the gate electrode 9, and the sidewall 82*b* is positioned between and the gate electrode 9 and the sidewall 81*a*. The doped nitride semiconductor layer 8 has the surface 86, the surface 87, and the surface 88 that are positioned between the surface 84 and the surface 85 substantially along the normal direction, the surface 86 and the surface 88 extends toward the source contact 6 in a direction substantially parallel to the tangential direction, and the surface 87 extends toward the drain contact 7 in a direction substantially parallel to the tangential direction.

The inventors have unexpectedly found that, compared with the structure in FIG. 1(*k*), the structure in FIG. 1(*l*) may further suppress the leakage current $J_{gd}$ between the gate and the drain, thereby further improving the gate leakage current phenomenon of the HEMT device.

The sidewall 81*a* of the doped nitride semiconductor layer 8 may be in direct contact with the passivation layer. The sidewall 82*a* of the doped nitride semiconductor layer 8 may be in direct contact with the passivation layer. The sidewall 81*b* of the doped nitride semiconductor layer 8 may be in direct contact with the passivation layer. The sidewall 82*b* of the doped nitride semiconductor layer 8 may be in direct contact with the passivation layer. The sidewall 81*c* of the doped nitride semiconductor layer 8 may be in direct contact with the passivation layer. The surface 86 of the doped nitride semiconductor layer 8 may be in direct contact with the passivation layer. The surface 86 of the doped nitride semiconductor layer 8 may be in direct contact with the passivation layer. The surface 88 of the doped nitride semiconductor layer 8 may be in direct contact with the passivation layer.

If the part 84*b* of the surface 84 of the doped nitride semiconductor layer 8 exists, the part 84*b* may be in direct contact with the passivation layer. If the part 84*c* of the surface 84 of the doped nitride semiconductor layer 8 exists, the part 84*c* may be in direct contact with the passivation layer.

Relative positions of the doped nitride semiconductor layer 8 and the gate electrode 9 are described above, and the doped nitride semiconductor layer 8 and the gate electrode 9 extend substantially along a direction perpendicular to a connecting line between the source contact 6 and the drain contact 7 and along the tangential direction.

In the tangential direction, the shortest distance ($L_{gs}$) between the doped nitride semiconductor layer 8 and the source contact 6 and the shortest distance ($L_{gd}$) between the doped nitride semiconductor layer 8 and the drain contact 7 may be defined by a photomask. The sizes of $L_{gs}$ and $L_{gd}$ are related to not only a gate leakage current path, but also the operating voltage of the gate electrode. During application to a low-voltage device (for example, a component applicable to 10 V to 200 V), the distance $L_{gs}$ may be 200 to 1200 nm, for example, but not limited to, 200 nm, 300 nm, 400 nm, 500 nm, 600 nm, 700 nm, 800 nm, 900 nm, 1000 nm, 1100 nm or 1200 nm; and the distance $L_{gd}$ may be 1 to 4 μm, for example, but not limited to: 1 μm, 1.2 μm, 1.4 μm, 1.5 μm, 1.6 μm, 1.8 μm, 2.0 μm, 2.2 μm, 2.4 μm, 2.5 μm, 2.6 μm, 2.8 μm, 3.0 μm, 3.2 μm, 3.4 μm, 3.5 μm, 3.6 μm, 3.8 μm or 4.0 μm. During application to a high-voltage device (for example, a component applicable to 200 V or higher), in order to improve the voltage tolerance, a distance between conductor structures (for example, a distance between a gate and a drain) may be designed to the distance $L_{gs}$ of 1 to 3 μm, for example, but not limited to, 1 μm, 1.2 μm, 1.4 μm, 1.5 μm, 1.6 μm, 1.8 μm, 2.0 μm, 2.2 μm, 2.4 μm, 2.5 μm, 2.6 μm, 2.8 μm or 3.0 μm; and the distance $L_{gd}$ of 5 to 20 μm, for example, but not limited to: 5 μm, 6 μm, 8 μm, 10 μm, 12 μm, 14 μm, 15 μm, 16 μm, 18 μm or 20 μm. Such distances are generally 5 times of those of a relatively-low-voltage component (for example, the component applicable to 10 V to 200 V). For example, if the semiconductor component 1*a* is applicable to 600 V or above, the distance between the gate structure 80 and the drain contact 7 may be greater than 15 μm.

The doped nitride semiconductor layer 8 may include, but is not limited to, doped gallium nitride (doped GaN), doped aluminum gallium nitride (doped AlGaN), doped indium gallium nitride (doped InGaN), and other doped group III-V compounds. The doped nitride semiconductor layer 8 may include, but is not limited to, a p-type dopant, an n-type dopant, or other dopants. An exemplary dopant may include, but is not limited to, magnesium (Mg), zinc (Zn), cadmium (Cd), silicon (Si), and germanium (Ge).

In low-voltage application (for example, the component applicable to 10 V to 200 V), the doped nitride semiconductor layer 8 has the width greater than about 0.5 micrometers (μm) in the tangential direction. The width of the doped nitride semiconductor layer 8 may be about 0.5 μm to about 2.0 μm. The width of the doped nitride semiconductor layer 8 may be about 0.8 μm to about 1.5 μm. The width of the doped nitride semiconductor layer 8 may be about 1.0 μm.

When the gate structure 80 of the present invention is applied to the low-voltage device, if the gate structure 80 includes the part 84*b* and the sidewall 81*a*, the following design specifications may be followed:

in the tangential direction, the width range $W_{85}$ of the surface 85: 0.5 μm≤$W_{85}$≤2 μm;

in the tangential direction, the width range $W_{84}$ of the surface 84: $W_{85}$−0.25 μm≤$W_{84}$≤$W_{85}$−0.05 μm;

in the tangential direction, the lower limit of the width of the part 84*b* is: 30 nm;

in the normal direction, the lower limit of the height of the sidewall 81*a* is: 10 nm;

other undefined parameters may be adjusted as required according to the descriptions of this specification.

When the gate structure 80 of the present invention is applied to the low-voltage device, if the gate structure 80 includes the part 84c and the sidewall 82a, the following design specifications may be followed:
  in the tangential direction, the width range $W_{85}$ of the surface 85: 0.5 μm≤$W_{85}$≤2 μm;
  in the tangential direction, the width range $W_{84}$ of the surface 84: $W_{85}$−0.25 μm≤$W_{84}$≤$W_{85}$−0.05 μm;
  in the tangential direction, the lower limit of the width of the part 84c is: 30 nm;
  in the normal direction, the lower limit of the height of the sidewall 82a is: 10 nm;
  other undefined parameters may be adjusted as required according to the descriptions of this specification.

In high-voltage application (for example, the component applicable to 200 V or above), the doped nitride semiconductor layer 8 has the width greater than about 1.8 micrometers (μm) substantially in the tangential direction.

When the gate structure 80 of the present invention is applied to the high-voltage device, if the gate structure 80 includes the part 84b and the sidewall 81a, the following design specifications may be followed:
  in the tangential direction, the width range $W_{85}$ of the surface 85: 1.5 μm≤$W_{85}$≤3.5 μm;
  in the tangential direction, the width range $W_{84}$ of the surface 84: $W_{85}$−0.25 μm≤$W_{84}$≤$W_{85}$−0.05 μm;
  in the tangential direction, the lower limit of the width of the part 84b is: 30 nm;
  in the normal direction, the lower limit of the height of the sidewall 81a is: 10 nm;
  other undefined parameters may be adjusted as required according to the descriptions of this specification.

When the gate structure 80 of the present invention is applied to the high-voltage device, if the gate structure 80 includes the part 84c and the sidewall 82a, the following design specifications may be followed:
  in the tangential direction, the width range $W_{85}$ of the surface 85: 1.5 μm≤$W_{85}$≤3.5 μm;
  in the tangential direction, the width range $W_{84}$ of the surface 84: $W_{85}$−0.25 μm≤$W_{84}$≤$W_{85}$−0.05 μm;
  in the tangential direction, the lower limit of the width of the part 84c is: 30 nm;
  in the normal direction, the lower limit of the height of the sidewall 82a is: 10 nm;
  other undefined parameters may be adjusted as required according to the descriptions of this specification.

The nitride semiconductor layer 4 may include a group III-V material, for example, but not limited to, group III nitrides, such as a compound $In_xAl_yGa_{1-x-y}N$, where x+y≤1, for example, x=0.1, 0.2, 0.3, 0.4, 0.5, 0.6, 0.7, 0.8 or 0.9. The group III nitrides may also include, for example, but are not limited to, a compound $Al_yGa_{(1-y)}N$, where y≤1, for example, y=0.1, 0.2, 0.3, 0.4, 0.5, 0.6, 0.7, 0.8 or 0.9.

The HEMT device 1a also includes a nitride semiconductor layer 5 disposed on the nitride semiconductor layer 4. The nitride semiconductor layer 5 may include, for example, but not limited to, group III nitrides, such as a compound $In_xAl_yGa_{1-x-y}N$, where x+y≤1. The group III nitrides may also include, for example, but are not limited to, a compound $Al_yGa_{(1-y)}N$, where y≤1, for example, y=0.1, 0.2, 0.3, 0.4, 0.5, 0.6, 0.7, 0.8 or 0.9. The nitride semiconductor layer 5 has a greater bandgap than the nitride semiconductor layer 4. For example, the nitride semiconductor layer 4 may include a GaN layer. GaN may have a bandgap of about 3.4 eV. The nitride semiconductor layer 5 may include AlGaN.

The AlGaN may have a bandgap of about 4 eV. The 2DEG region 41 is generally formed in a layer with a smaller bandgap (for example GaN). A heterojunction is formed between the nitride semiconductor layer 5 and the first nitride semiconductor layer 4. The 2DEG region 41 is formed in the first nitride semiconductor layer 4 through polarization of the heterojunction of different nitrides. The first nitride semiconductor layer 4 can provide or remove electrons in the 2DEG region, and conduction of the HEMT device 1a can be further controlled.

The higher the aluminum content is, the higher the concentration of the two-dimensional electron gas in a gallium nitride buffer layer, and the higher the carrier concentration of the channel for high-current operation, which is a very important index for high-power components. If AlGaN is used as a material of the nitride semiconductor layer 5, the Al content may be 20 to 40%. If the Al content is too high, crystalline blocks can be easily produced, and a problem of stress release of the epitaxial layer may also be generated.

The first nitride semiconductor layer 4 may have an electron channel region shown by dotted lines (a region of a two-dimensional electron gas 41), and the region of the two-dimensional electron gas 41 is generally easy to obtain in the heterostructure. In this region, the electron gas may freely move in a two-dimensional direction, and is limited in a three-dimensional direction (for example, substantially in the normal direction of the two-dimensional electron gas). It should be understood by those skilled in the art that as shown by disconnection in dotted lines, part of the two-dimensional electron gas 41 under the doped nitride semiconductor layer 8 has been depleted. It should also be understood by those skilled in the art that as shown by the dotted line 41, the two-dimensional electron gas 41, including its depleted region, in the first nitride semiconductor layer 4 forms a channel region of the first nitride semiconductor layer 4, and flowing of electrons through the channel region is controlled through a gate voltage applied onto the gate structure 80 during operation. The nitride semiconductor layer 4 may be of a single-layer structure or a multi-layer structure. The nitride semiconductor layer 4 may also include a heterostructure.

The gate electrode 9 may be formed on the doped nitride semiconductor layer 8, for example, formed on the surface of the doped nitride semiconductor layer 8 so as to provide electric connection for the gate structure 80 of the HEMT device 1a. The gate electrode 9 may include, for example, but is not limited to, titanium (Ti), tantalum (Ta), tungsten (W), aluminum (Al), cobalt (Co), copper (Cu), nickel (Ni), platinum (Pt), plumbum (Pb), molybdenum (Mo) and compounds thereof (for example, but not limited to, titanium nitride (TiN), tantalum nitride (TaN), other conductive nitrides, or conductive oxides), metal alloy (such as Al—Cu alloy), or other suitable materials. The gate electrode 9 may be formed by a single metal or a metal stack (such as tungsten and/or titanium or other well-known electrode materials).

The gate electrode 9 may be in direct contact with the doped nitride semiconductor layer 8. The gate electrode 9 may also be electrically connected to the doped nitride semiconductor layer 8. Substantially in the normal direction, the doped nitride semiconductor layer 5 may be disposed under the gate electrode 9, and the gate electrode 9 may be positioned above the doped nitride semiconductor layer 8. The gate electrode is configured to form a Schottky junction with the doped nitride semiconductor layer to further reduce the gate leakage current.

In low-voltage application (for example, the component applicable to 10 V to 200 V), the gate electrode 9 may have a width greater than about 0.4 μm substantially in the tangential direction. The width of the gate electrode 9 may be about 0.4 μm to about 1.2 μm. Substantially in the tangential direction, the width of the gate electrode 9 is smaller than the width of the doped nitride semiconductor layer 8.

In high-voltage application (for example, the component applicable to 200 V or higher), the gate electrode 9 may have a width greater than about 1.6 μm substantially in the tangential direction.

The HEMT device 1a may also include the source contact 6 and the drain contact 7, and the source contact and the drain contact may be formed into a metal region disposed on the portion of the nitride semiconductor layer 5. The metal of the source contact 6 and the drain contact 7 forms ohmic contact with the nitride semiconductor layer 5 so as to collect electrons or provide electrons to the channel region. Metal for forming the source contact or the drain contact may include refractory metals or compounds thereof, for example, but not limited to, metals such as aluminum (Al), titanium (Ti), niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), osmium (Os) and iridium (Ir) or compounds of the metals, such as tantalum nitride (TaN), titanium nitride (TiN), and tungsten carbide (WC). The source contact 6 and the drain contact 7 may be formed by a single metal or a metal stack (such as tungsten and/or titanium or other well-known electrode materials).

The nitride semiconductor layer 4 and the substrate 2 may be of homogeneous materials, for example, but not limited to GaN. No lattice constant or thermal expansion coefficient mismatch problem exists between the nitride semiconductor layer 4 and the substrate 2 during epitaxial growth. Therefore, the nitride semiconductor layer 4 may directly grow on the substrate 2 and is in direct contact with the substrate 2 without the need of using a buffer layer.

The nitride semiconductor layer 4 and the substrate 2 are of heterogeneous materials. The nitride semiconductor layer 4 and the substrate 2 have different lattice constants and thermal expansion coefficients. During epitaxial growth, a great quantity of dislocation and cracks may be generally generated, thereby further reducing the efficiency of the HEMT device 1a or even causing dysfunction of the HEMT device. In order to avoid the above conditions, the buffer layer (not shown in the figure) disposed between the substrate 2 and the nitride semiconductor layer 4 may be optionally used. The buffer layer may be used to promote lattice match between the substrate 2 and the nitride semiconductor layer 4 so as to reduce the interface stress and/or thermal stress of the heterogeneous materials, thereby reducing the defects and crack density in the nitride semiconductor layer 4. Materials suitable to be used as the buffer layer include, for example, but are not limited to, oxides (such as zinc oxide) or nitrides (such as aluminum nitride (AlN) and aluminum gallium nitride (AlGaN)).

The HEMT device 1a may also include a superlattice layer (not shown in FIG. 1 to FIG. 3) disposed between the substrate 2 and the nitride semiconductor layer 4. The superlattice layer may be positioned between the nitride semiconductor layer 4 and the substrate 2. The superlattice layer may be a plurality of layers or a multi-layer stack, for example an AlGaN/GaN pair or a multi-layer stack of AlN/GaN. The superlattice layer may reduce the tensile stress of the HEMT device 1a. The superlattice layer may also prevent defects (such as dislocation) from propagating into the nitride semiconductor layer 4 from a layer (such as the buffer layer) under the superlattice layer, so as to enhance the crystallization quality to the nitride semiconductor layer 4 and avoid the dysfunction of the HEMT device 1a. The superlattice layer may trap electrons diffused from the substrate 2 to the nitride semiconductor layer 4, thereby further improving the efficiency and reliability of the device. The superlattice layer may reduce electron trap.

In high-voltage application, in order to avoid direct breakdown of the voltage to the substrate 2, the superlattice layer may increase the integral size of the HEMT device or structure to increase the breakdown voltage. The thickness of the superlattice layer is generally about 1 μm to 4 μm, and is greater than that of the buffer layer. When the superlattice layer is disposed, defects, such as delamination or peeling off, caused by the lattice number and/or thermal expansion coefficient difference of the superlattice layer from adjacent materials still need to be considered. Additionally, the manufacturing cost will be greatly increased due to use of the superlattice layer.

In high-voltage application, in order to avoid direct breakdown of the voltage to the substrate 2, the buffer layer or the superlattice layer may be doped with other heterogeneous elements, for example, but not limited to, carbon, oxygen, or nitrogen, and they may be intentionally doped or unintentionally doped.

Application of Low-Voltage HEMT Devices

The gate structure of the present invention may be applied to low-voltage HEMT devices. FIG. 2(a) to FIG. 2(h) show several operations for manufacturing a low-voltage HEMT device 1b according to some embodiments of the present invention. Although FIG. 2(a) to FIG. 2(h) show several operations for manufacturing the low-voltage HEMT device 1b, similar operations are also applicable.

Figure 2A:
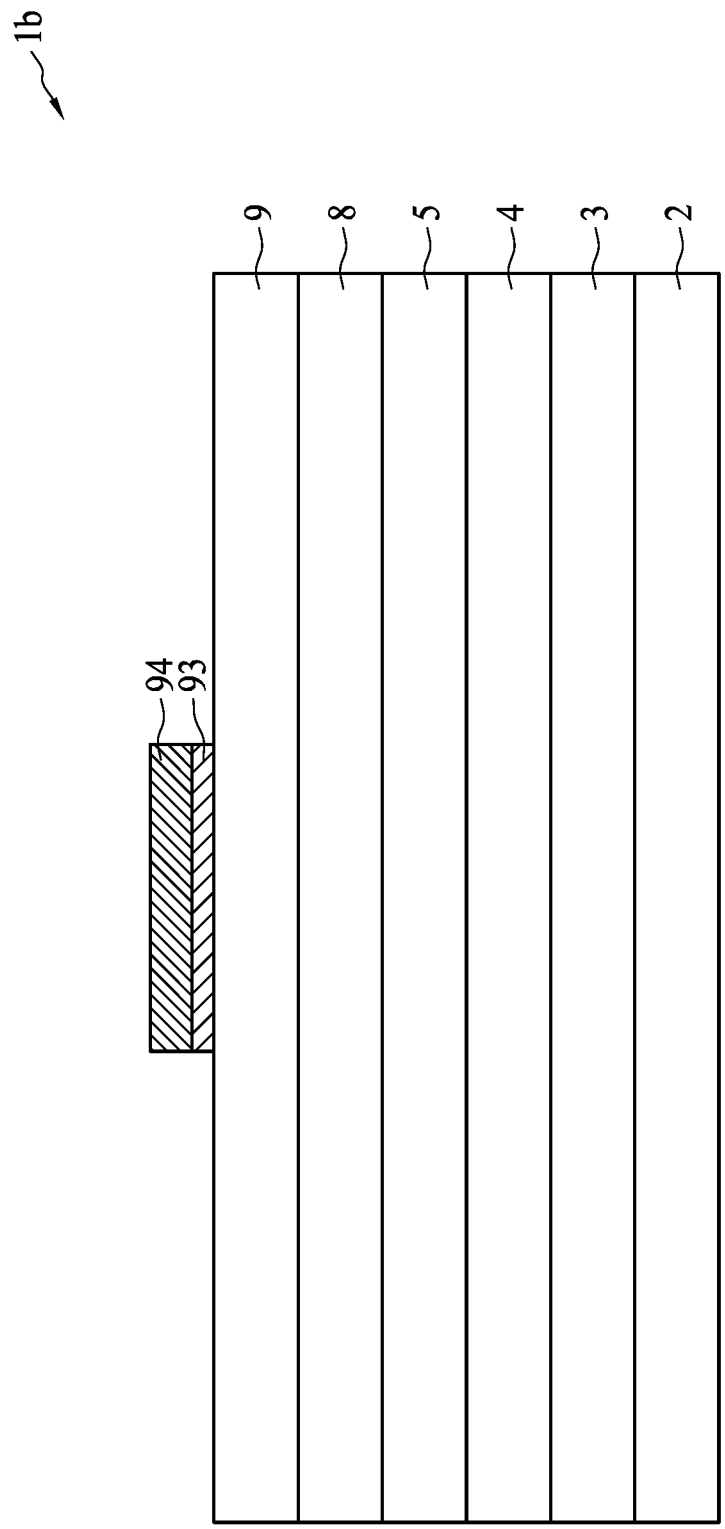
FIG. 2(a) to FIG. 2(h) show several operations for manufacturing an HEMT device 1b according to some embodiments of the present invention.

With reference to FIG. 2(a), a substrate 2 is provided. A buffer layer 3 is disposed on the substrate 2. A nitride semiconductor layer 4, a nitride semiconductor layer 5, and a doped nitride semiconductor layer 8 are disposed on the substrate 2 through epitaxial growth. A gate electrode 9 is additionally disposed on the doped nitride semiconductor layer 8. The gate electrode 9 is optionally configured to form a Schottky junction with the doped nitride semiconductor layer 8. Additionally, a photoresist 94 is applied to a hard mask 93 so as to determine the position of the gate electrode 9 after the photolithography and etching processes. The patterned hard mask 93 is formed above the gate electrode 9.

The doped nitride semiconductor layer 8 and the gate electrode 9 are disposed on the substrate 2. The doped nitride semiconductor layer 8 may be formed through metal organic chemical vapor deposition (MOCVD) or in any known epitaxial growth mode, and is doped with a dopant. Then, the gate electrode 9 is deposited onto the doped nitride semiconductor layer 8. The gate electrode 9 may be formed through physical vapor deposition (PVD), chemical vapor deposition (CVD), atomic layer deposition (ALD), plating, and/or other proper deposition steps. The gate electrode 9 is formed by a gate first process, i.e., the gate electrode 9 is formed before a source contact 6 and a drain contact 7 are formed.

The hard mask 93 may include (but is not limited to) silicon dioxide ($SiO_2$), silicon nitride (SiN), silicon oxynitride (SiON), and silicon carbide (SiC). The etching step may be performed through dry etching, wet etching, or a combination of the dry etching and the wet etching.

An etching agent for etching the gate electrode 9 may be ammonium hydroxide (NH$_4$OH), hydrogen peroxide (H$_2$O$_2$), sulfuric acid (H$_2$SO$_4$), hydrofluoric acid (HF), ammonium fluoride (NH$_4$F), or a mixture of the above compounds. The doped nitride semiconductor layer 8 may be subjected to anisotropic etching in a dry etching mode.

Figure 2B:
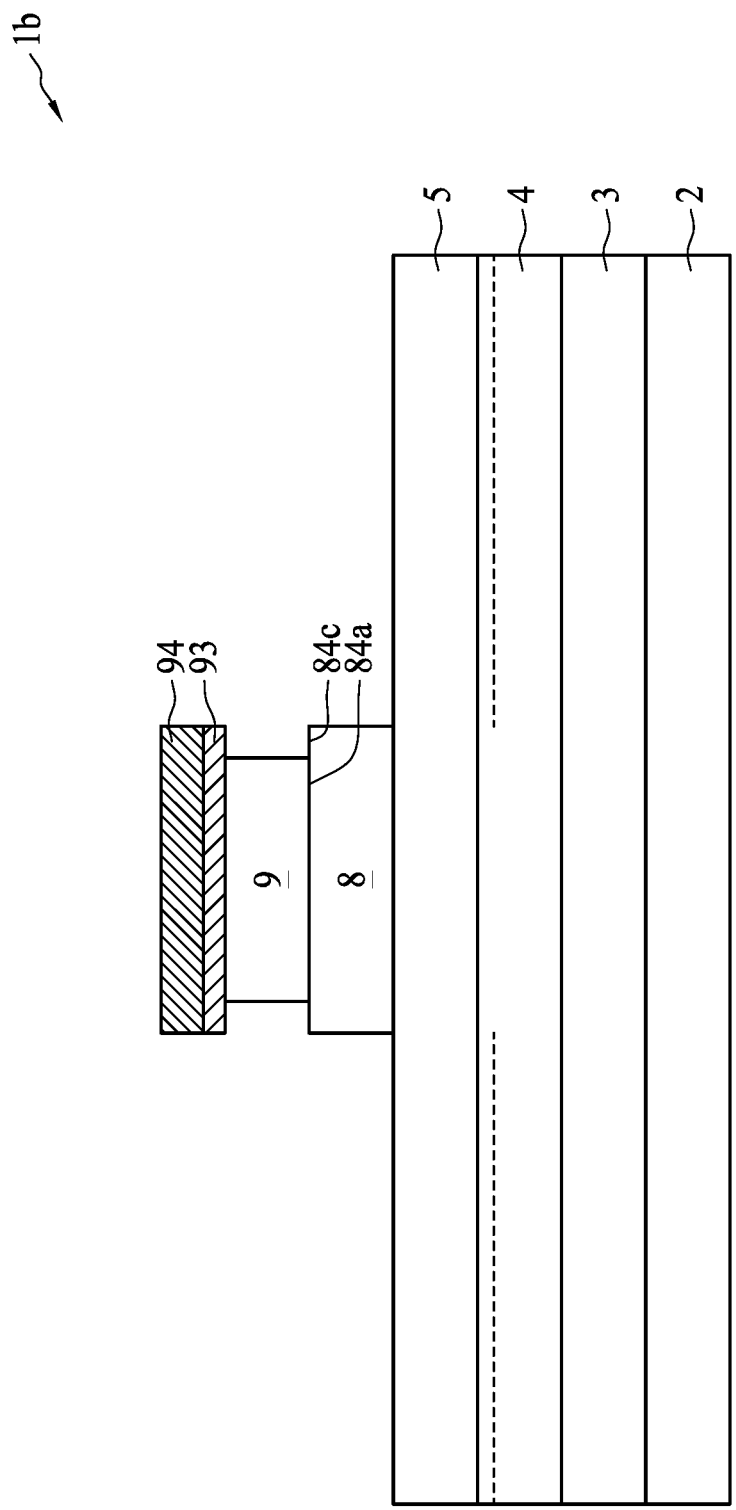

With reference to FIG. 2(b), the required portions of the gate electrode 9 and the doped nitride semiconductor layer 8 are retained in photolithography and etching modes. The etching of the exposed doped group III-V layer 8 and the gate electrode 9 may be performed by any known manufacturing process such as plasma etching. The gate electrode 9 may be optionally overetched so as to define, on the surface 84, a part 84a electrically connected to the gate electrode 9, and a part 84c adjacent to the part 84a, and then, the photoresist 94 and the hard mask 93 are peeled off.

Figure 2C:
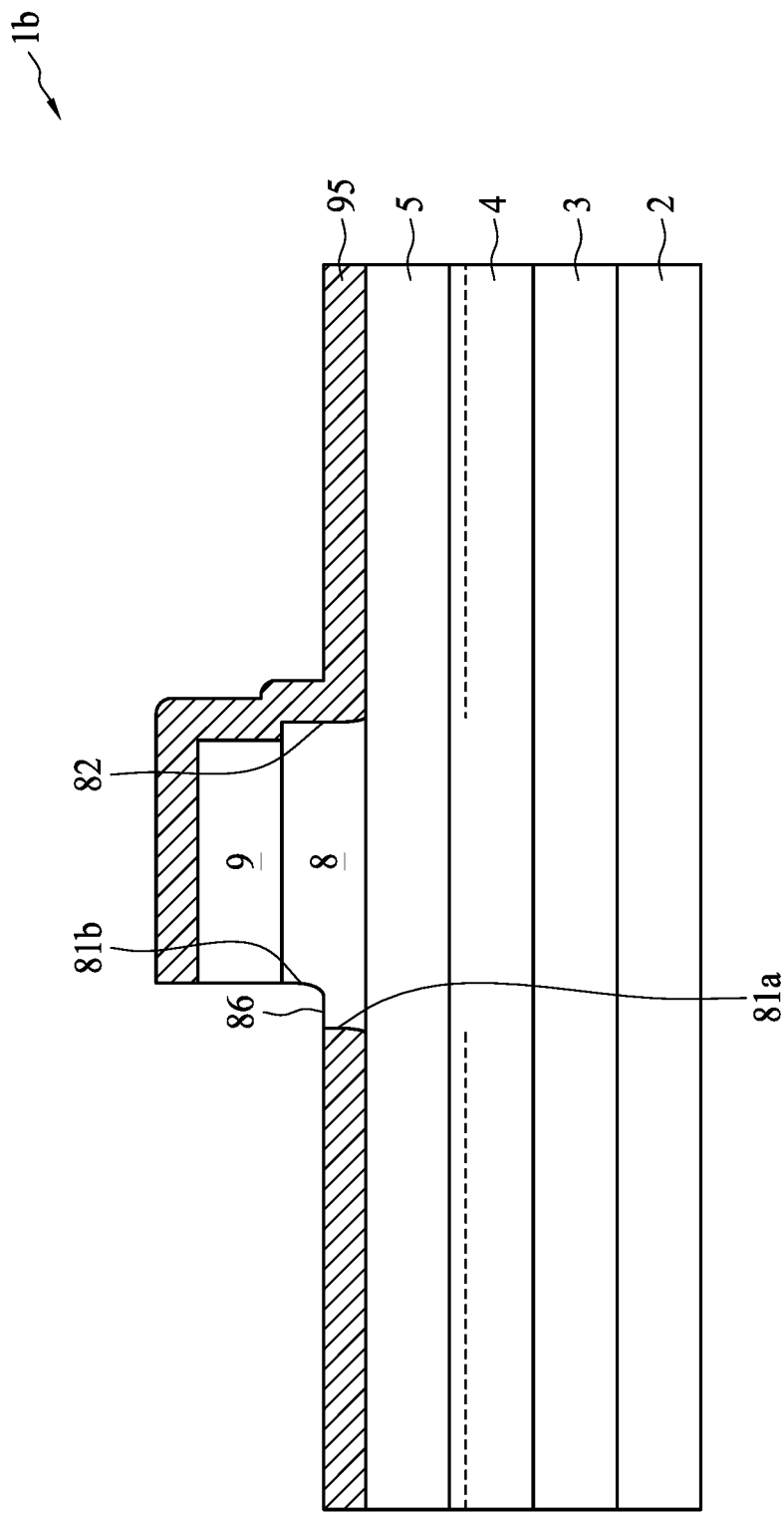

With reference to FIG. 2(c), the patterned hard mask 95 is formed above the gate electrode 9, the doped nitride semiconductor layer 8 and the nitride semiconductor layer 5 to define the width of the surface 86, and subsequently the exposed gate electrode 9 and the doped nitride semiconductor layer 8 are etched, so as to form a protrusion/step structure having the sidewall 81a, the surface 86 and the sidewall 81b on a sidewall of the doped nitride semiconductor layer 8.

Figure 2D:
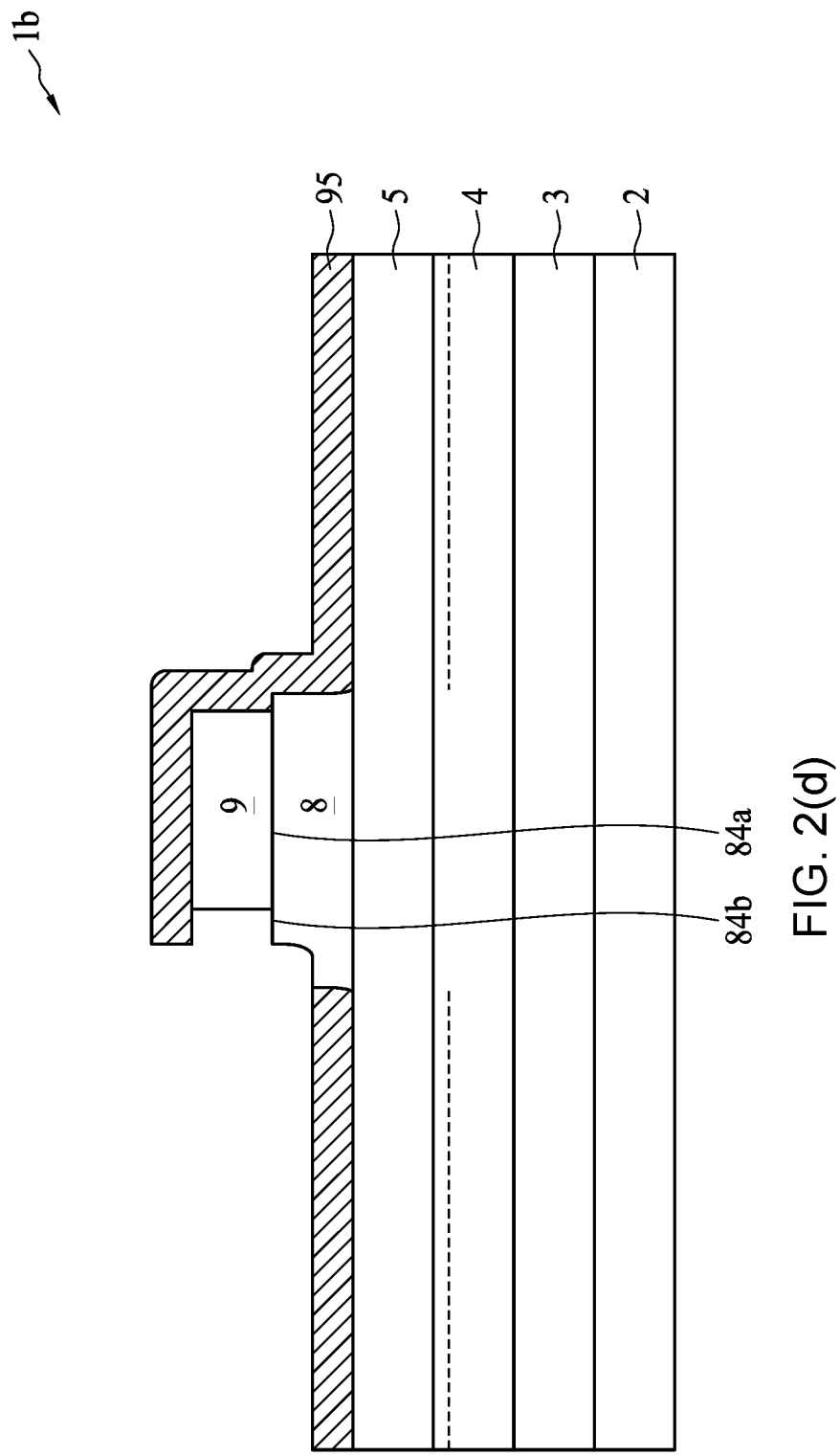

With reference to FIG. 2(d), the gate electrode 9 may be optionally overetched, so as to define the part 84b adjacent to the part 84a on the surface 84, and subsequently the hard mask 95 is peeled off.

Figure 2E:
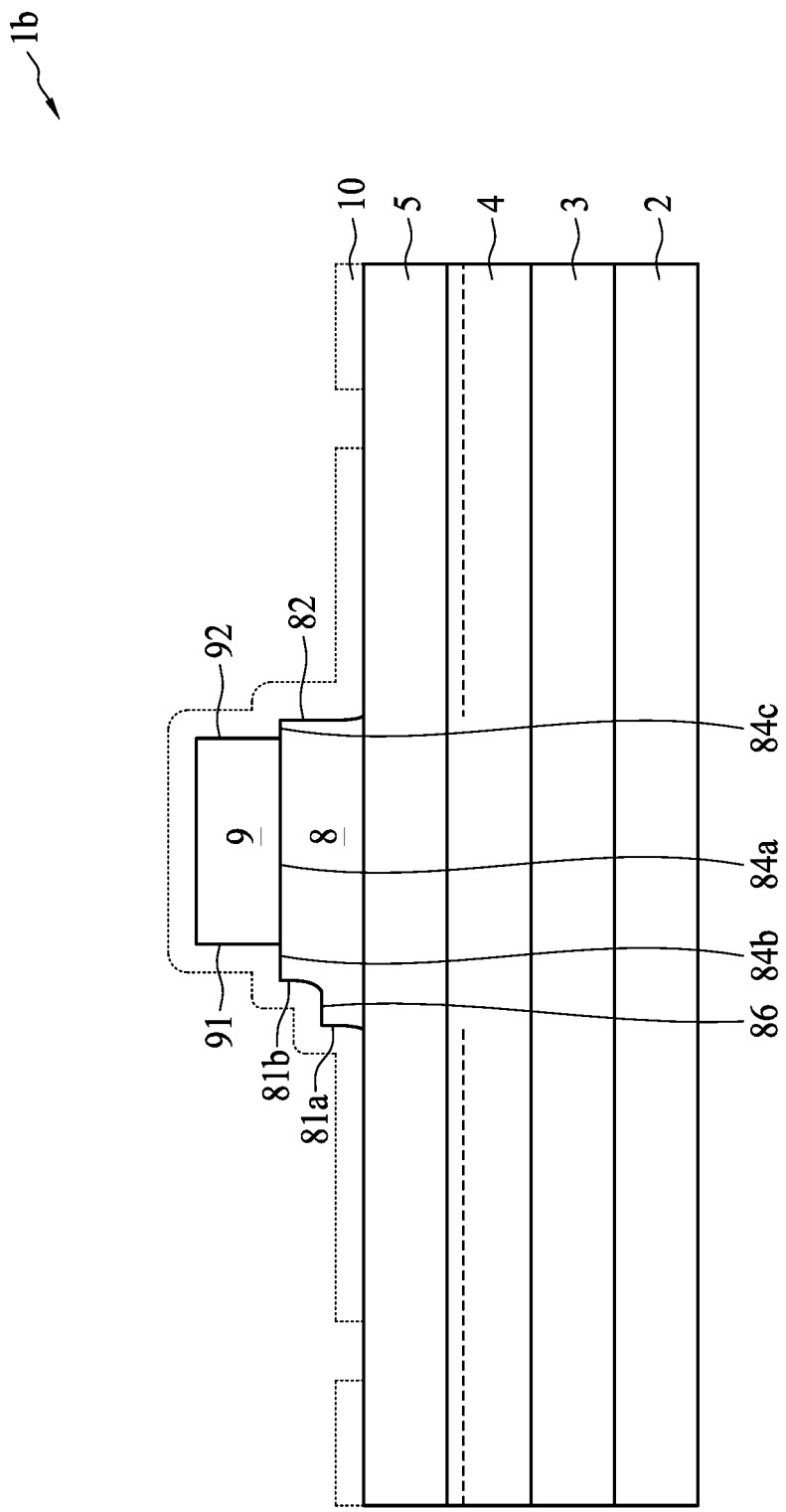

With reference to FIG. 2(e), the HEMT device 1b may also include a passivation layer 10 disposed on the gate electrode 9. The passivation layer 10 is in direct contact with the part 84b and the part 84c of the surface 84. The passivation layer 10 may surround the doped nitride semiconductor layer 8, and is in direct contact with the sidewall 82, the sidewall 81a and the sidewall 81b. The passivation layer 10 may cover the doped nitride semiconductor layer 8, and is in direct contact with the surface 86. The passivation layer 10 may surround the gate electrode 9. The passivation layer 10 may cover the gate electrode 9. The passivation layer 10 may cover part of the gate electrode 9.

The passivation layer 10 may include, for example, but is not limited to, oxides or nitrides, such as silicon nitride (SiN) and silicon oxide (SiO$_2$). The passivation layer 10 may include, for example, but is not limited to, a compound layer of oxides and nitrides, such as Al$_2$O$_3$/SiN, Al$_2$O$_3$/SiO$_2$, AlN/SiN, and AlN/SiO$_2$.

Figure 2F:
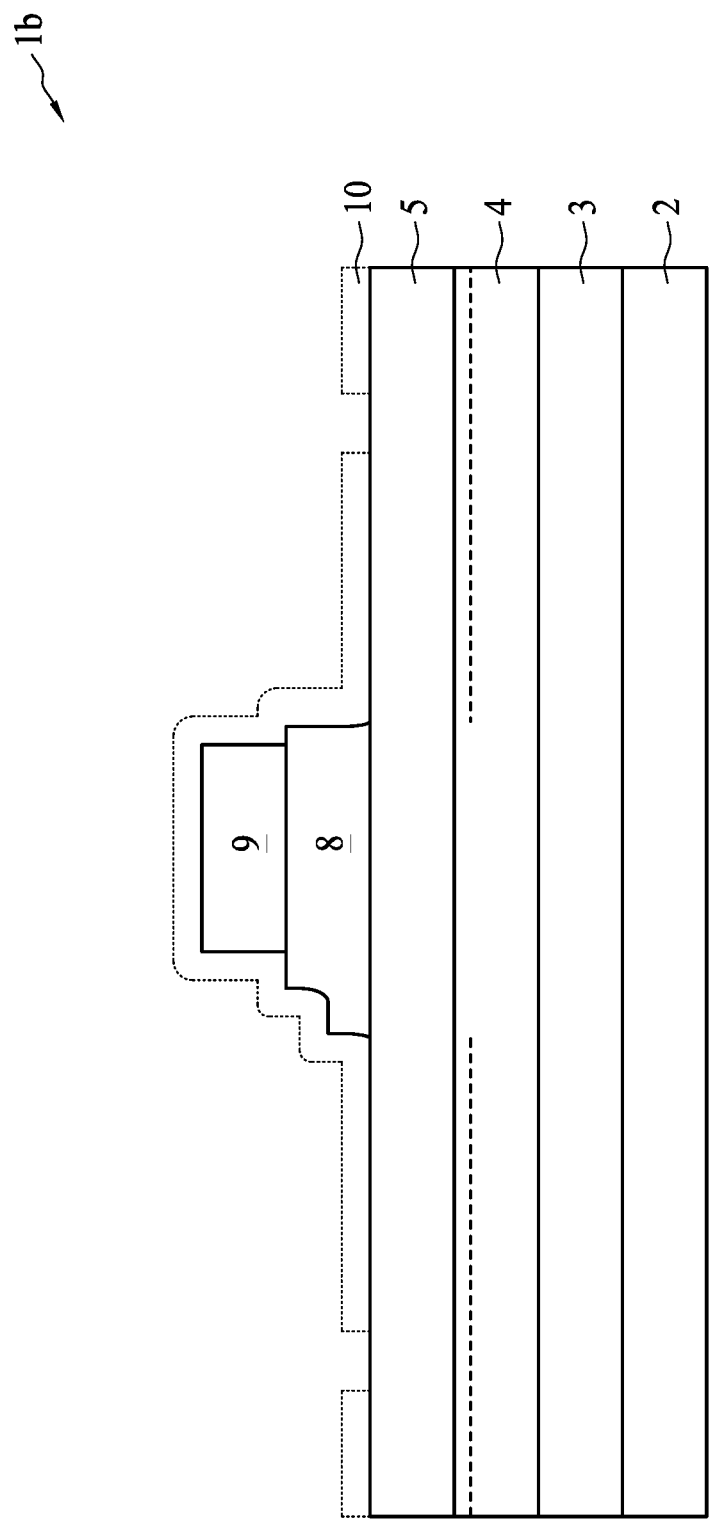

With reference to FIG. 2(f), the passivation layer 10 uses the photolithography and etching processes to define the position of the drain.

Figure 2G:
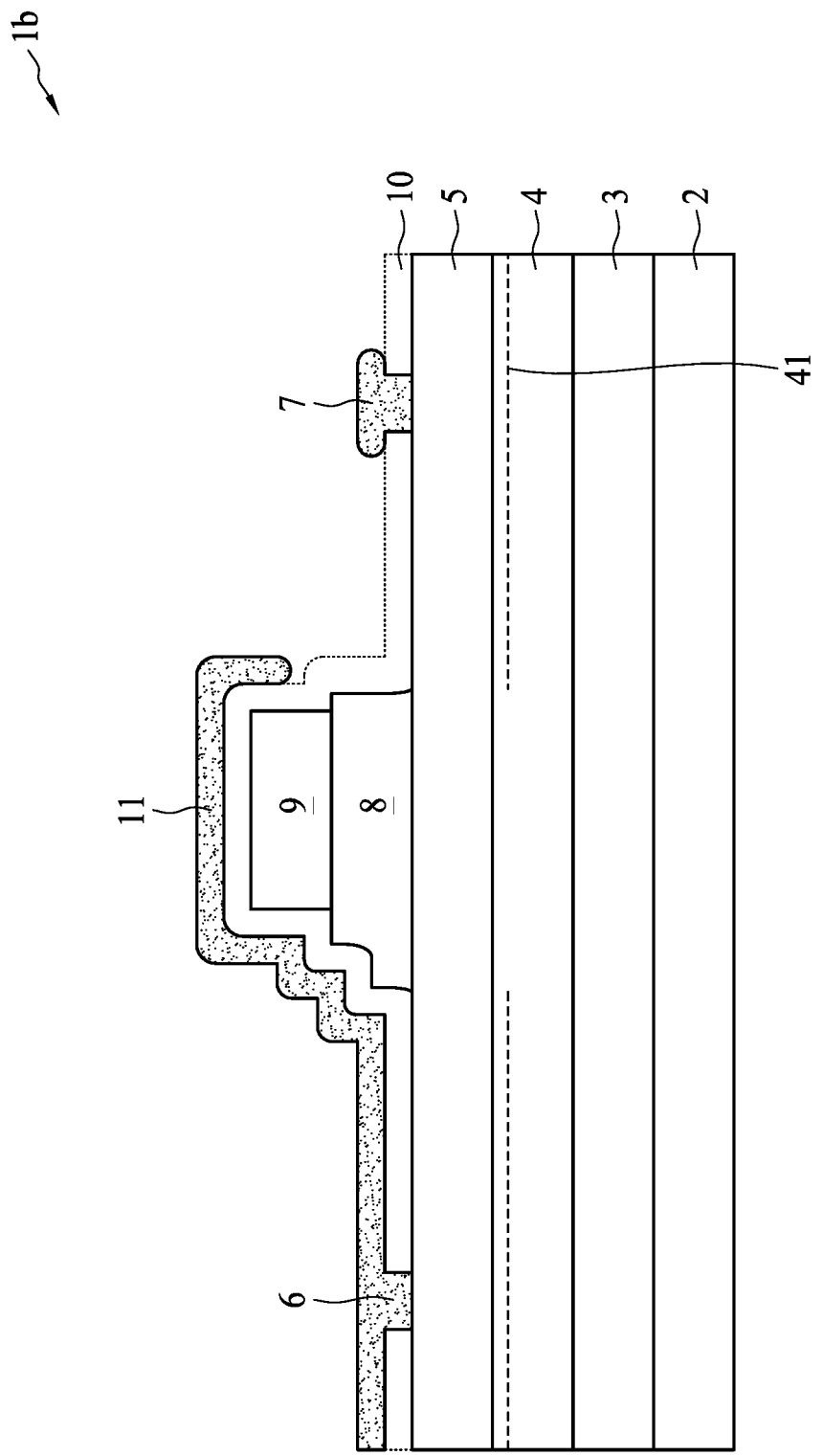

With reference to FIG. 2(g), a conductor material is deposited onto the passivation layer 10. The conductor material is patterned by using the photolithography and etching processes to form a source 6, a drain 7, and a gate field plate 11. Rapid thermal annealing (RTA) is performed so as to form the deposited material and the nitride semiconductor layer 4 into an intermetallic compound and to further form an ohmic contact from the source 6 to the two-dimensional electron gas 41 and the drain 7 to the two-dimensional electron gas 41.

The objective of providing the field plate 11 on the gate electrode 9 is to reduce an electric field nearest to the drain 7 and at a corner position of the doped nitride semiconductor layer 8, thereby improving the stability of the HEMT device 1b and increasing the breakdown voltage between the gate and the drain. The field plate 11 may be disposed above the passivation layer 10, the doped nitride semiconductor layer 8, and the gate electrode 9. The field plate 11 may have a common potential with the source contact 6 or have a common potential with the gate electrode 9. The field plate 11 may be directly connected to the source contact 6. The field plate 11 may be electrically connected to the source contact 6. By using the field plate, the electric field intensity distribution of the channel may be reconstructed, and an electric field peak value of the gate (at the side near the drain) is reduced, thereby increasing the breakdown voltage of the HEMT device 1b and reducing the electron trap effect caused by the high electric field, and improving the power density.

The length range of the field plate in the low-voltage device may be 0.4 to 1.2 μm. A too long field plate may improve the capacitance effect between the gate and the drain, thereby causing negative Miller feedback, and reducing the cut-off frequency of the current gain and the power gain. Additionally, if the field plate approaches to the drain, the electric field intensity of the field plate at the end point of the side near the drain may be improved, and the breakdown voltage is further reduced.

The source contact 6 and the drain contact 7 may include, for example, but are not limited to, a conductor material. The conductor material may include, for example, but is not limited to, a metal, an alloy, a doped semiconductor material (for example, doped crystalline silicon), or other suitable conductor materials.

Figure 2H:
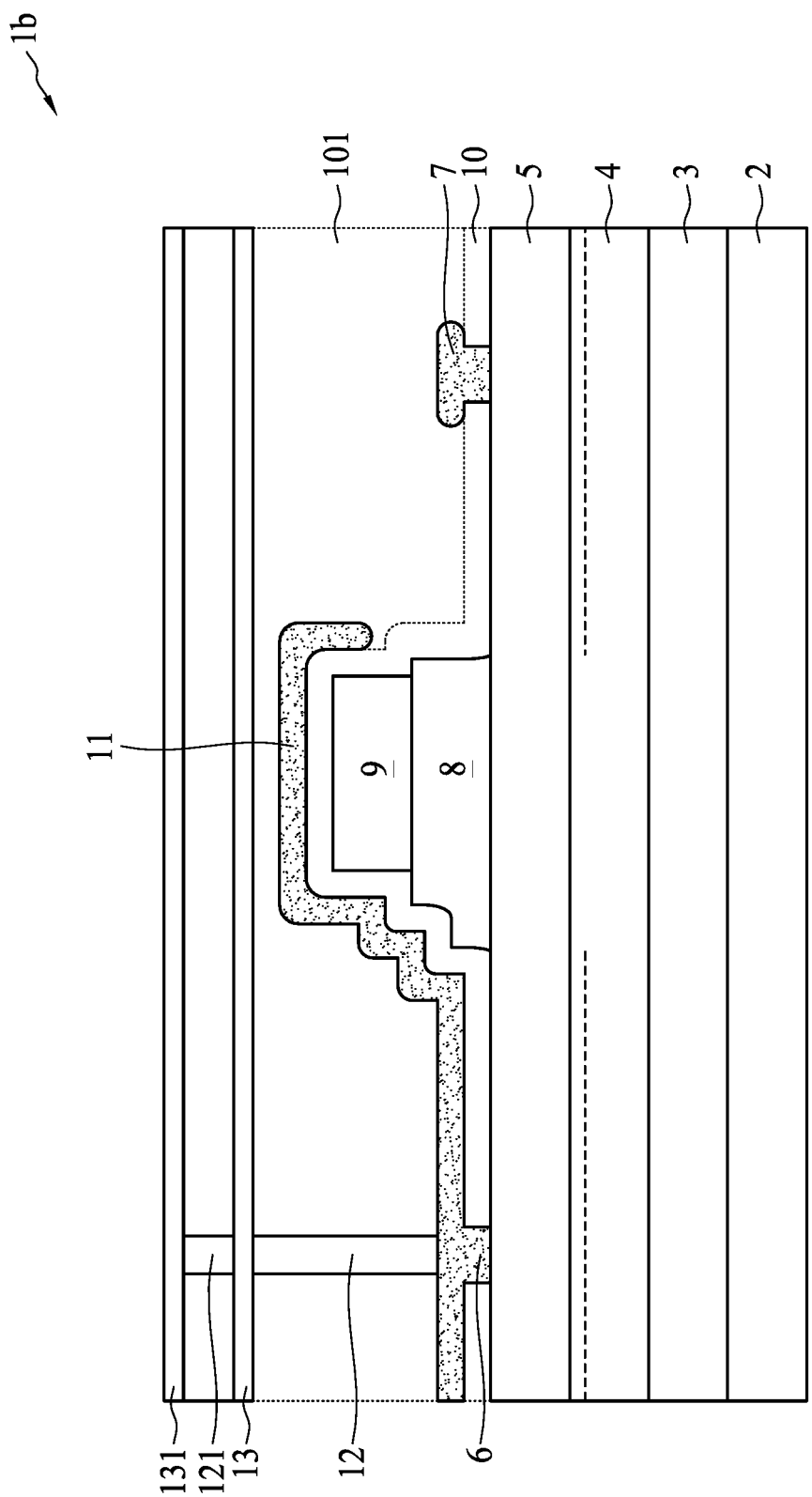

Part of the source contact 6 may be positioned in the nitride semiconductor layer 4. Part of the drain contact 7 may be positioned in the nitride semiconductor layer 4. Part of the source contact 6 may be in direct contact with the two-dimensional electron gas 41. Part of the drain contact 7 may be in direct contact with the two-dimensional electron gas 41. The source contact 6 may be disposed on the nitride semiconductor layer 4. The drain contact 7 may be disposed on the nitride semiconductor layer 4. The source contact 6 may pass through the passivation layer 10 to be in contact with the nitride semiconductor layer 5. The drain contact 7 may pass through the passivation layer 10 to be in contact with the nitride semiconductor layer 5. With reference to FIG. 2(h), the HEMT device 1b may also include an interconnect structure or conductive vias 12 and 121. The HEMT device 1b may also include metal layers 13 and 131.

The interconnect structure or the conductive via 12 is formed through a plurality of steps, including the steps of a photolithography process, etching, and deposition. The photolithography process and etching include forming a patterned mask on a passivation layer 101, and etching the passivation layer 101 to form the source contact via 12 and a drain contact via (not shown in the figure). Part of the nitride semiconductor layer 4 is exposed from the bottom of the source contact via and the drain contact via. Then, the vias are filled with the material through the deposition steps of CVD, PVD, plating and the like.

Figure 3:
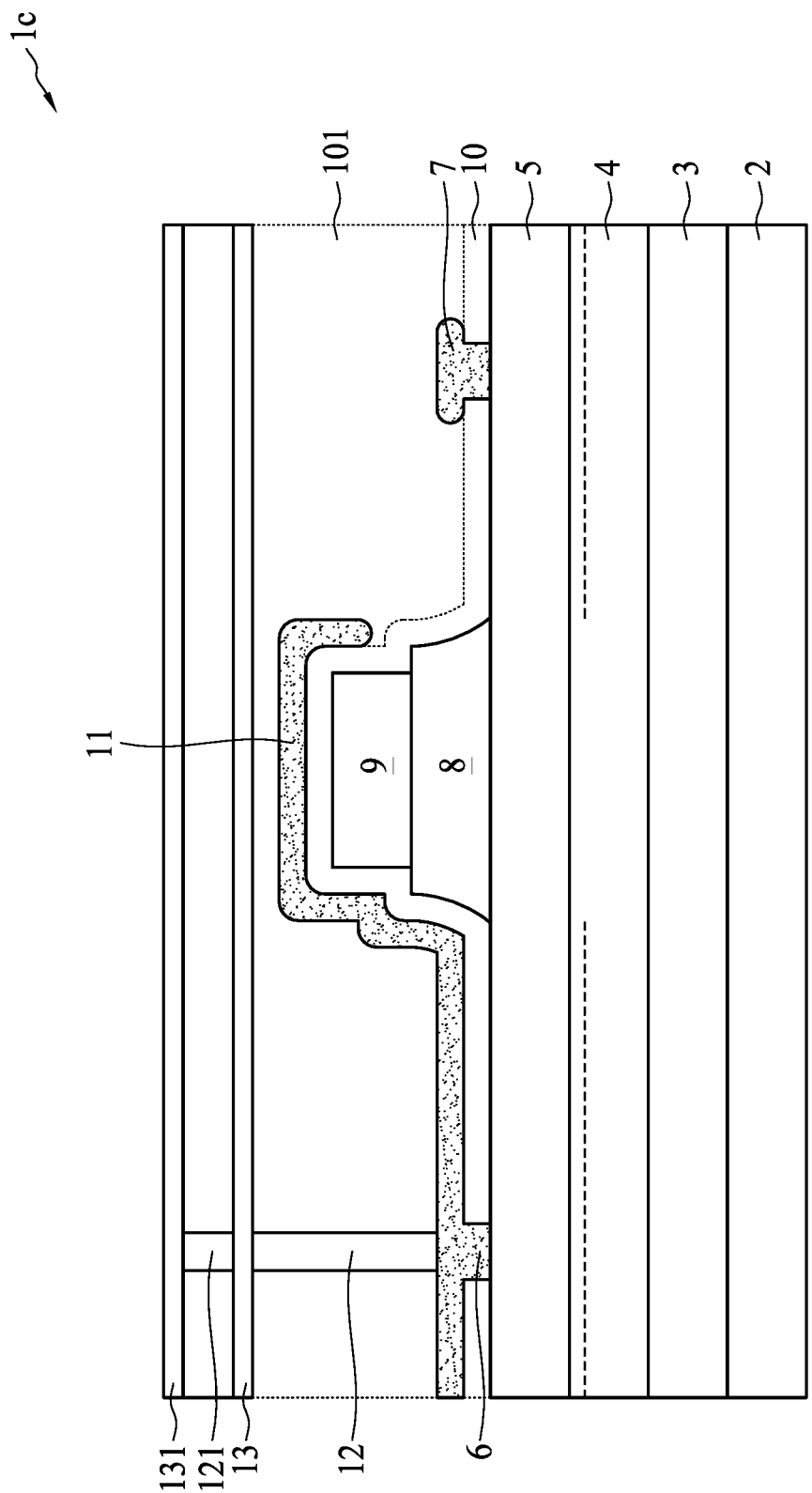
FIG. 3 shows a general HEMT device 1c including a doped nitride semiconductor layer that has no protrusion and is symmetrical in structure.

The HEMT device 1c shown in FIG. 3 is substantially the same as the HEMT device 1b shown in FIG. 2(h) in structure. A difference lies in that the gate structure of the HEMT device 1c has a symmetrical geometric shape by using the normal direction as a symmetrical axis. Moreover, the doped nitride semiconductor layer 8 of the HEMT device 1c has no protrusion. The material selection, configurations and forming modes of the layers of the HEMT device 1c are described in the section of "Application of low-voltage HEMT devices".

Figure 4:
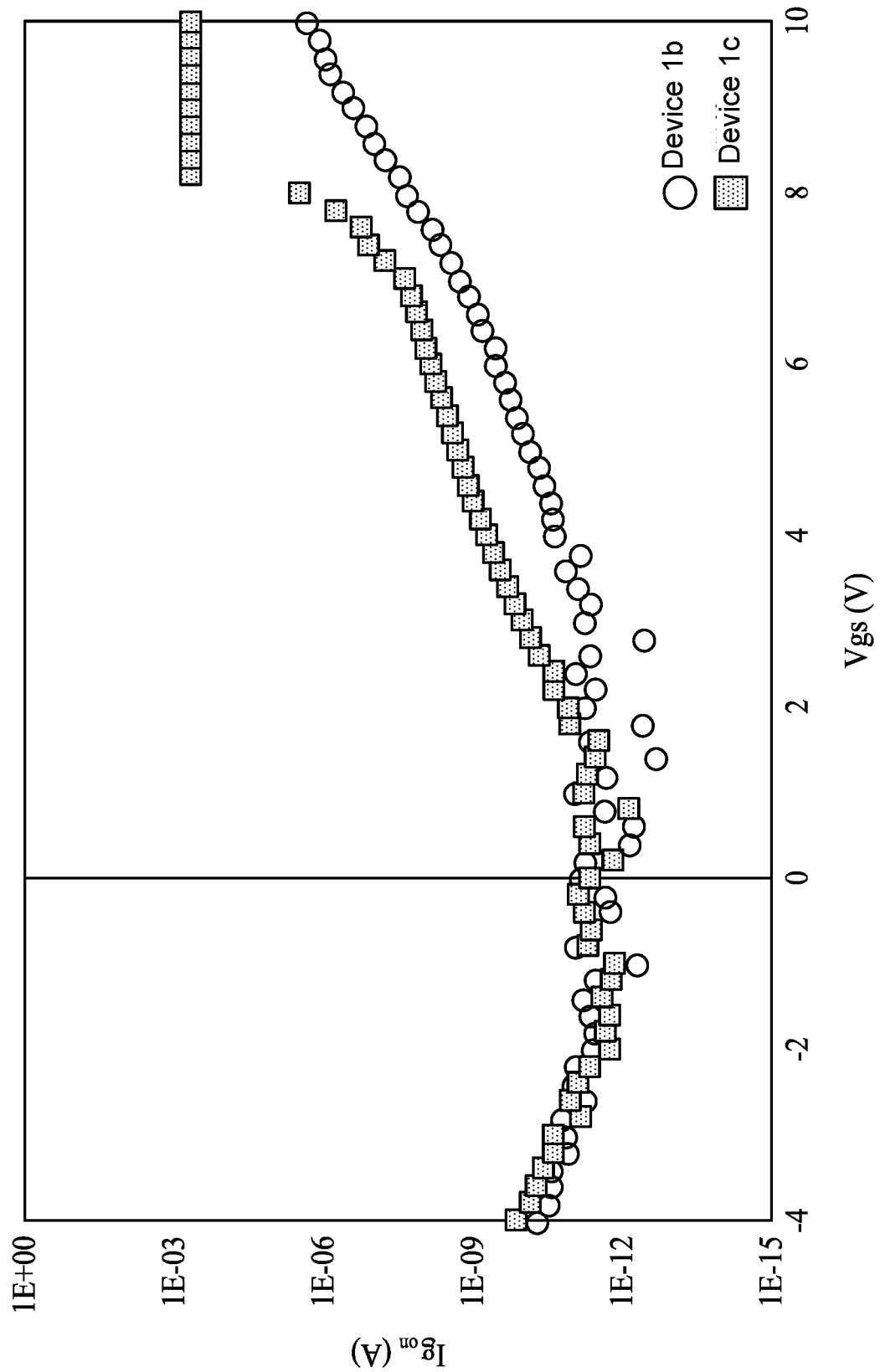
FIG. 4 shows characteristic curves of $I_{g\ on}$-$V_{gs}$ of the HEMT device 1b and HEMT device 1c.

FIG. 4 shows curves of Ig on (gate leakage current) versus Vgs of the HEMT device 1b and the HEMT device 1c, where when Vgs=5 V, Ig on of the HEMT device 1b is $7.2 \times 10^{-11}$, and Ig on of the HEMT device 1c is $2.2 \times 10^{-9}$.

Application of High-Voltage HEMT Devices

Figure 5A:
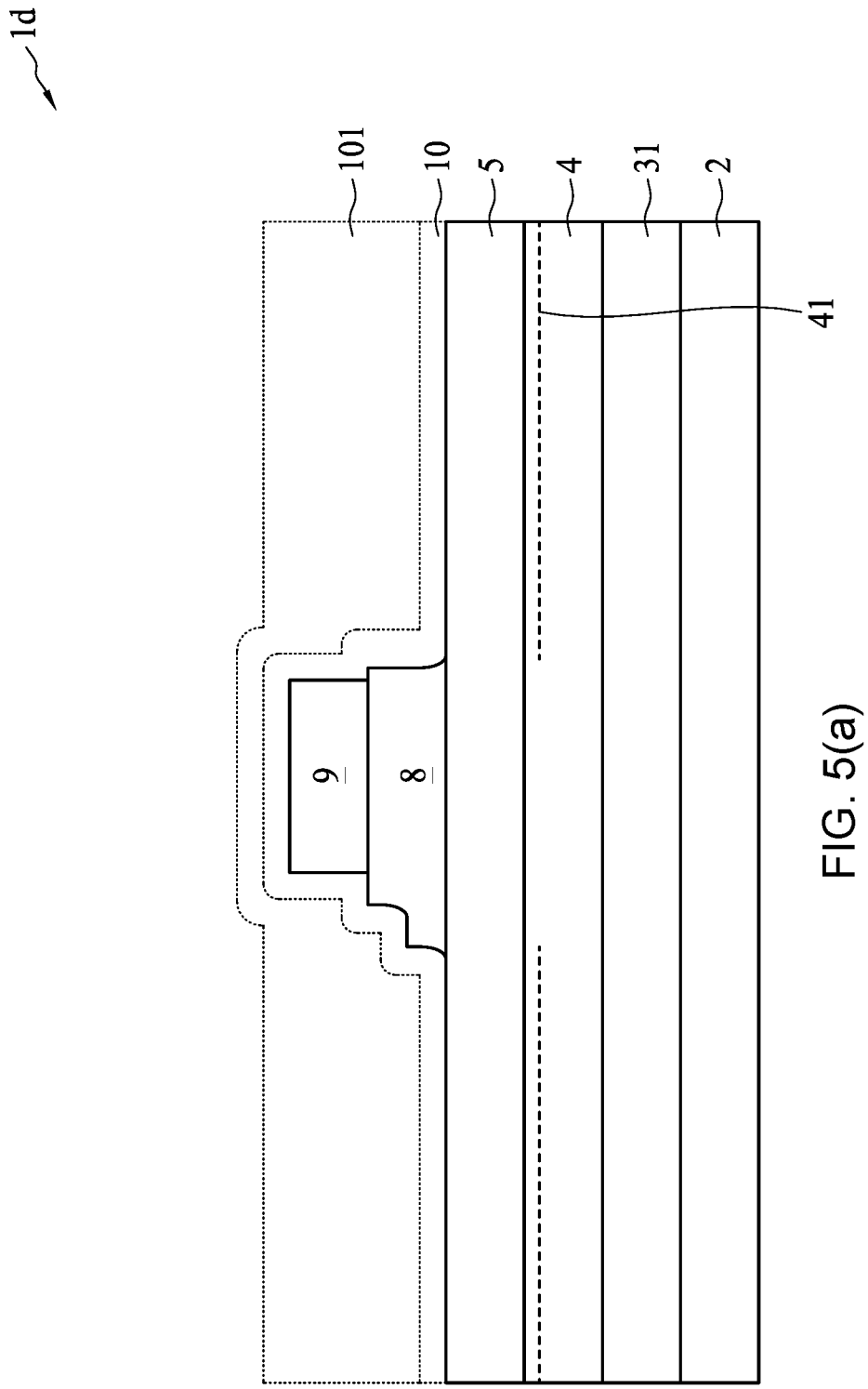
FIG. 5(a) to FIG. 5(g) show several operations for manufacturing an HEMT device 1d according to some embodiments of the present invention.

With reference to FIG. 5(a), the improved gate structure of the present invention is also applicable to high-voltage components. Reference may be made to the processes shown below of the passivation layer 101 in FIG. 2(a) to FIG. 2(e) for the preparation modes of the following structure of a passivation layer 101 of a high-voltage HEMT device 1d, and those will not be described in detail herein. However, in high-voltage application, in order to avoid direct breakdown of the voltage to a substrate 2, a doped superlattice layer 31 is optionally disposed between the substrate 2 and a nitride semiconductor layer 4 to increase the overall size of the HEMT device or structure and increase the breakdown voltage. After a passivation layer 10 is disposed, the passivation layer 101 is disposed on the passivation layer.

Figure 5B:
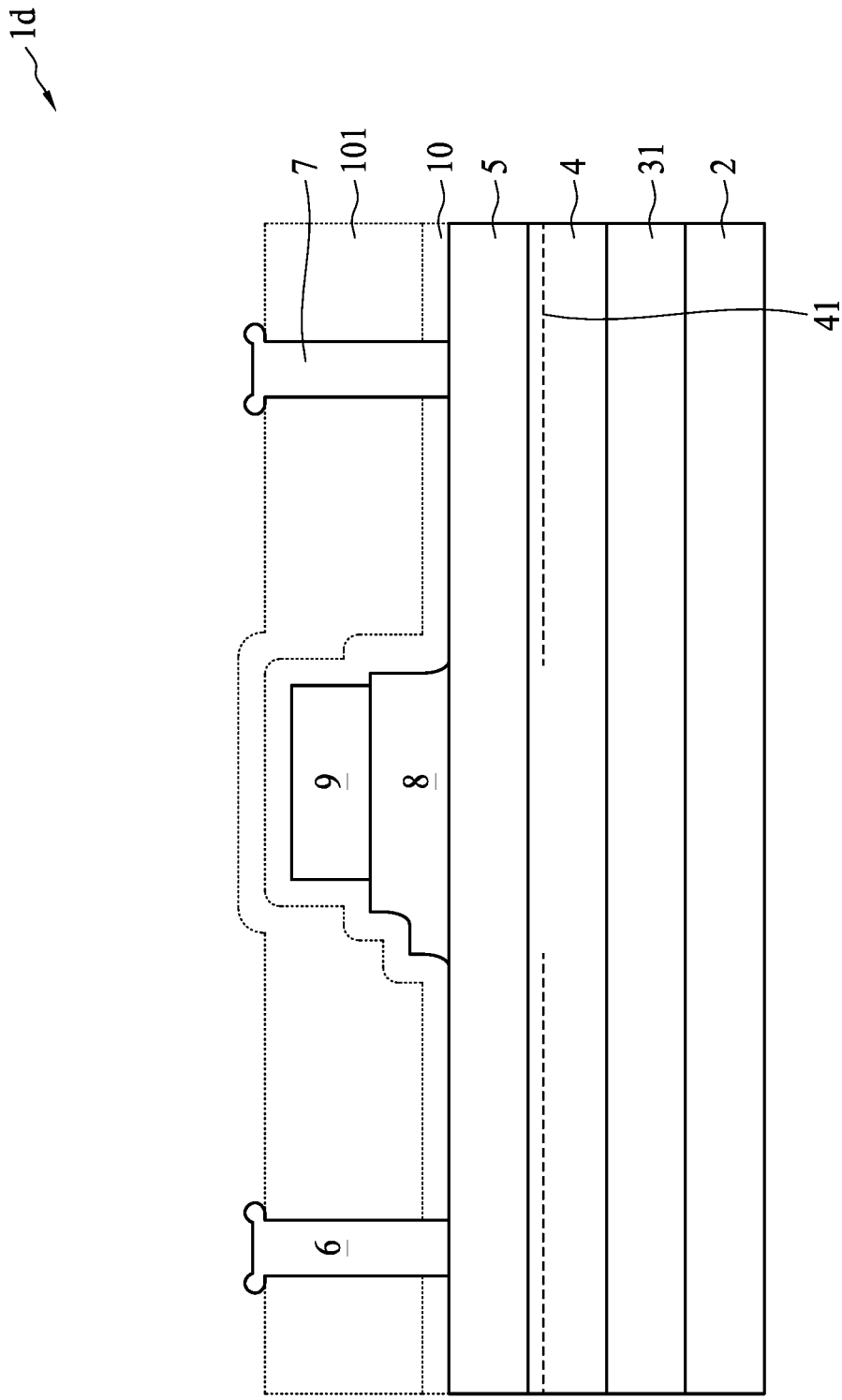

With reference to FIG. 5(b), although a source contact 6 and a drain contact 7 are respectively disposed on two sides of a gate electrode 9 in FIG. 5(b), the source contact 6, the drain contact 7, and the gate electrode 9 may have different configurations in other embodiments of the present invention according to design requirements.

Figure 5C:
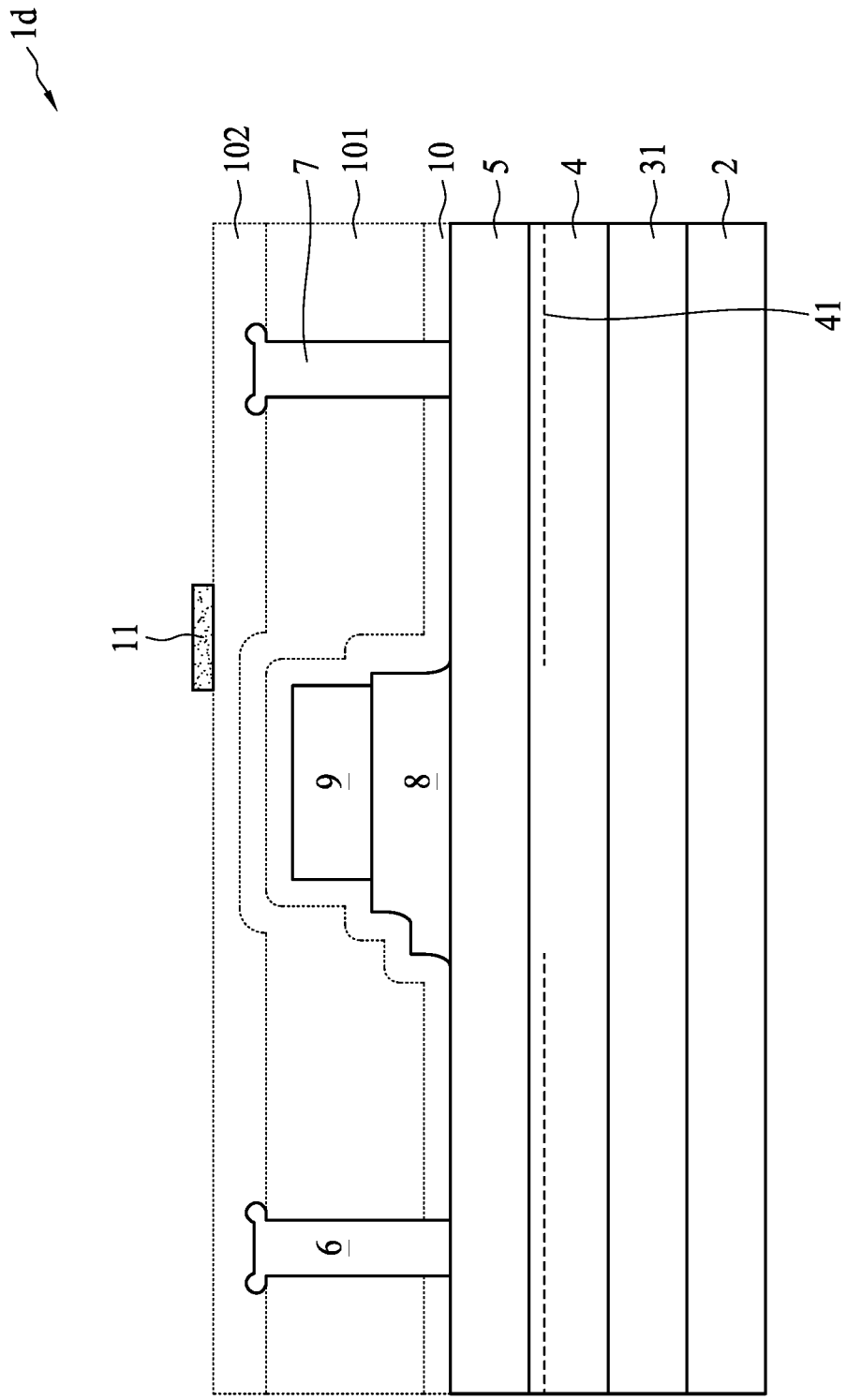

With reference to FIG. 5(c), a dielectric layer 102 is positioned between a field plate 111 and the source contact 6 substantially in the normal direction. A high-voltage component device may include a plurality of field plates, and the field plates are not in contact with each other and are separated from each other. One or more of the field plates may be at zero potential. Although the HEMT device 1d finally made through the method in FIG. 5 has four field plates, the present invention is not limited thereto. The HEMT device 1d may include more or fewer than four field plates.

The field plate 111 (including the field plates 112, 113, and 114 mentioned below) may be formed in the manner of firstly depositing a conductive material and then defining a pattern. For example, metal may be deposited through sputtering, and the pattern may be defined by dry etching. It should be noted that the position of the field plate 111 cannot be the position of a T-shaped electrode 14 formed in subsequent steps. Additionally, the applicable voltage of the relatively-low-voltage component is smaller, and the influence of the electric field between conductor structures on the efficiency of the component is smaller, so that the field plate of the relatively-low-voltage component may be omitted.

The field plate 111 may reduce the electric field of a gate contact structure, enable the electric field among the conductor structures (for example, the T-shaped electrode 14, the source contact 6, and the drain contact 7) to be averagely distributed, and improve the voltage tolerance so as to smoothly release the voltage, thereby further improving the reliability of the device.

Figure 5D:
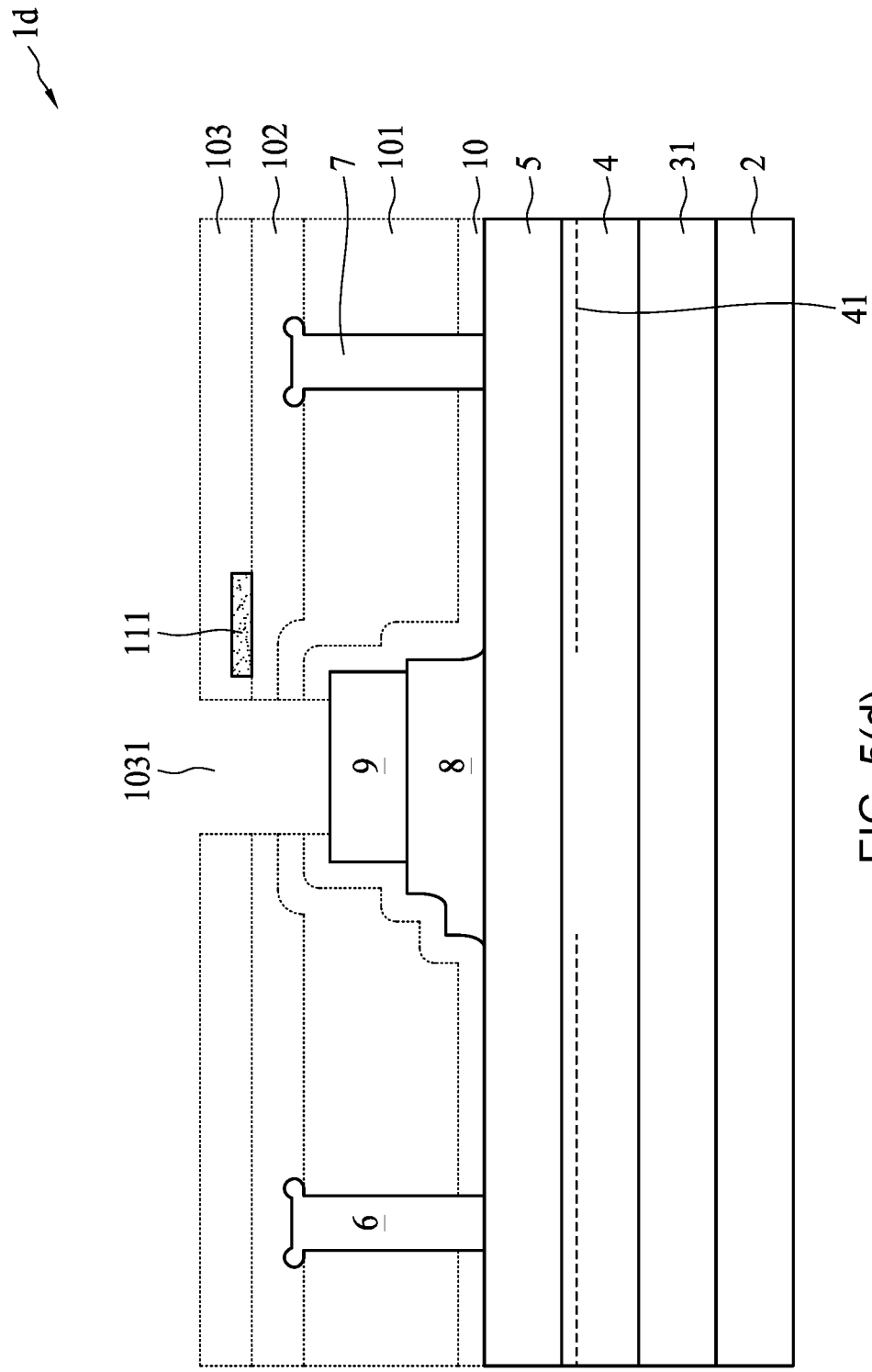

With reference to FIG. 5(d), a dielectric layer 103 is positioned between a field plate 111 and the source contact 6 substantially in the normal direction. An opening 1031 is formed in the dielectric layers 102 and 103. The opening 1031 exposes a partial surface of the gate electrode 9. The opening 1031 may be formed in a dry etching or wet etching mode.

For example, wet etching includes exposure to a hydroxide-containing solution, deionized water, and/or other etching agents. Dry etching includes use of inductively coupled plasma. The gate electrode 9 may be used as a stop layer for the doped nitride semiconductor layer 8 in this step.

Figure 5E:
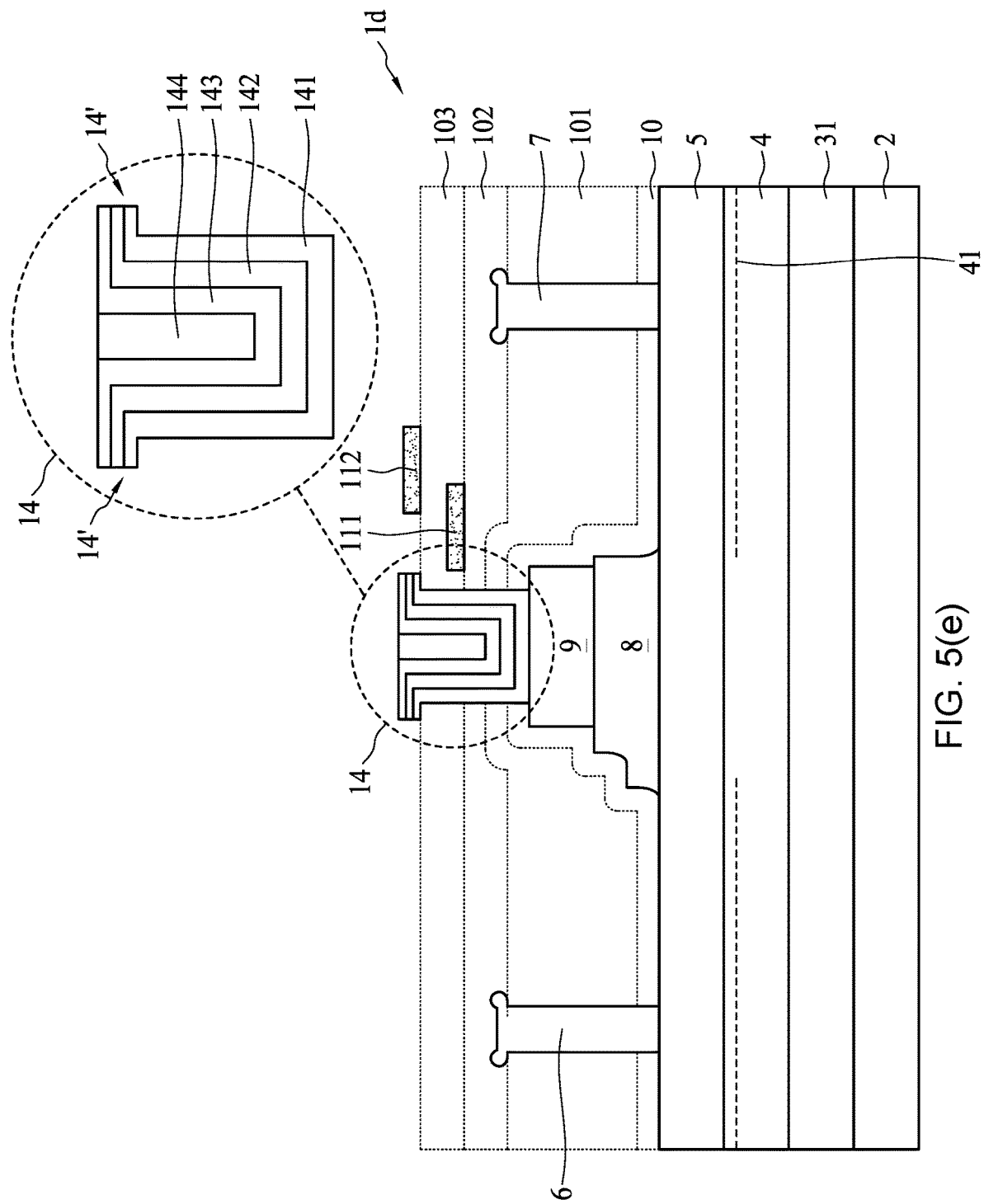

With reference to FIG. 5(e), in high-voltage application, the T-shaped electrode 14 may be additionally disposed on the gate electrode 9. The T-shaped electrode 14 may be in direct contact with the gate electrode 9. The T-shaped electrode 14 may alternatively be electrically connected to the gate electrode 9. Substantially in the normal direction, the T-shaped electrode 14 is positioned above the gate electrode 9, the gate electrode 9 is positioned under the T-shaped electrode 14, and the gate electrode 9 is positioned between the T-shaped electrode 14 and the doped nitride semiconductor layer 8.

The T-shaped electrode 14 may include a structure formed by a single material. The T-shaped electrode 14 may include a structure formed by heterogeneous materials. As shown in dotted boxes in FIG. 5(e), the T-shaped electrode 14 may include a plurality of layers of heterojunctions. The T-shaped electrode 14 may include a plurality of layers, for example, a layer 141, a layer 142, a layer 143, and a layer 144. Although the T-shaped electrode 14 depicted the dotted boxes in FIG. 5(e) includes the four layers, the present invention is not limited thereto. In other embodiments, the T-shaped electrode 14 may include structures of more or fewer than four layers.

The layer 141 may include, for example, but is not limited to, a refractory metal or a compound thereof. The layer 141 may include a material identical or similar to that of the gate electrode 9. The layer 141 may include a material different from that of the gate electrode 9. The layer 142 may include, for example, but is not limited to, a metal or a metal compound, for example, titanium, chromium, and tungsten titanate. The layer 142 may be used as a wetting layer to help subsequent metal filling. The layer 143 may include, for example, but is not limited to, a gate metal. The layer 143 may include a material identical or similar to that of the T-shaped electrode 14. The layer 143 may include a material different from that of the T-shaped electrode 14. The layer 144 may include, for example, but is not limited to, a refractory metal or a compound thereof. The layer 144 may include a material identical or similar to that of the gate electrode 9. The layer 144 may include a material different from that of the gate electrode 9.

The field plate 112 may enable the electric field among the conductor structures (for example, the T-shaped electrode 14, the source contact 6, and the drain contact 7) to be averagely distributed, and improve the voltage tolerance so as to smoothly release the voltage, thereby further improving the reliability of the device. The field plate 112 may reduce the electric field of the gate contact structure, and increase the threshold voltage. The field plate 112 partially overlaps the field plate 111 substantially in the normal direction.

The T-shaped electrode 14 has an overhang 14' so that the top width of the T-shaped electrode is greater than the width of the gate electrode 9 substantially in the tangential direction. In this case, the width of the gate electrode 9 is smaller than that of the T-shaped electrode 14. In other embodiments, the T-shaped electrode 14 may have no overhang 14'.

The distance between the border of the overhang 14' and the border of the field plate 111 may be about 0.5 μm to 2.5 μm. The distance between the border of the overhang 14' and the border of the field plate 112 may be about 2 μm to 4 μm.

The T-shaped electrode 14 may reduce the overall resistance value of the gate contact structure, is used to provide a low-resistance conductor wire, and may further be used to be electrically connected to other conductors.

The gate electrode 9 is favorable for improving bias control of the T-shaped electrode 14. The gate electrode 9 is favorable for increasing the switching speed of the gate. The gate electrode 9 is favorable for reducing the leakage current and increasing the threshold voltage.

In the high-voltage component, the voltage tolerance may be influenced by the distance between the drain contact 7 and the T-shaped electrode 14, so that the distance between the drain contact 7 and the T-shaped electrode 14 may be greater than about 15 μm. The smaller the width of the doped nitride semiconductor layer 8, the greater the distance between the drain contact 7 and the T-shaped electrode 14, and the higher the high-voltage tolerance capability. Additionally, the smaller the width of the doped nitride semiconductor layer 8, the smaller the resistance value of the high-voltage component.

The T-shaped electrode 14 may have the width greater than about 0.3 μm substantially in the tangential direction. The width of the T-shaped electrode 14 may be about 0.3 μm to about 0.8 μm. The width of the T-shaped electrode 14 may be smaller than the width of the gate electrode 9. The width of the T-shaped electrode 14 may be smaller than the width of the doped nitride semiconductor layer 8.

Each layer of the T-shaped electrode 14 may be formed through PVD, CVD, ALD, plating, and/or other suitable steps. After each layer of the T-shaped electrode 14 is filled, the surface of the T-shaped electrode 14 is not treated by CMP, so that the overhang 14' remains on the dielectric layer 103.

The field plate 111 is adjacent to the T-shaped electrode 14 substantially in the tangential direction. The field plate 112 is adjacent to the T-shaped electrode 14 substantially in the tangential direction. The field plate 111 is positioned between the T-shaped electrode 14 and the drain contact 7 substantially in the tangential direction. The field plate 112 is positioned between the T-shaped electrode 14 and the drain contact 7 substantially in the tangential direction.

The field plate 112 may be formed together with the T-shaped electrode 14. The field plate 112 may have the same material as that of the T-shaped electrode 14.

The passivation layer 10 may surround the T-shaped electrode 14. The passivation layer 10 may surround part of the T-shaped electrode 14.

The passivation layer 101 disposed on the passivation layer 10 may surround the T-shaped electrode 14. The passivation layer 101 may surround part of the T-shaped electrode 14.

Figure 5F:
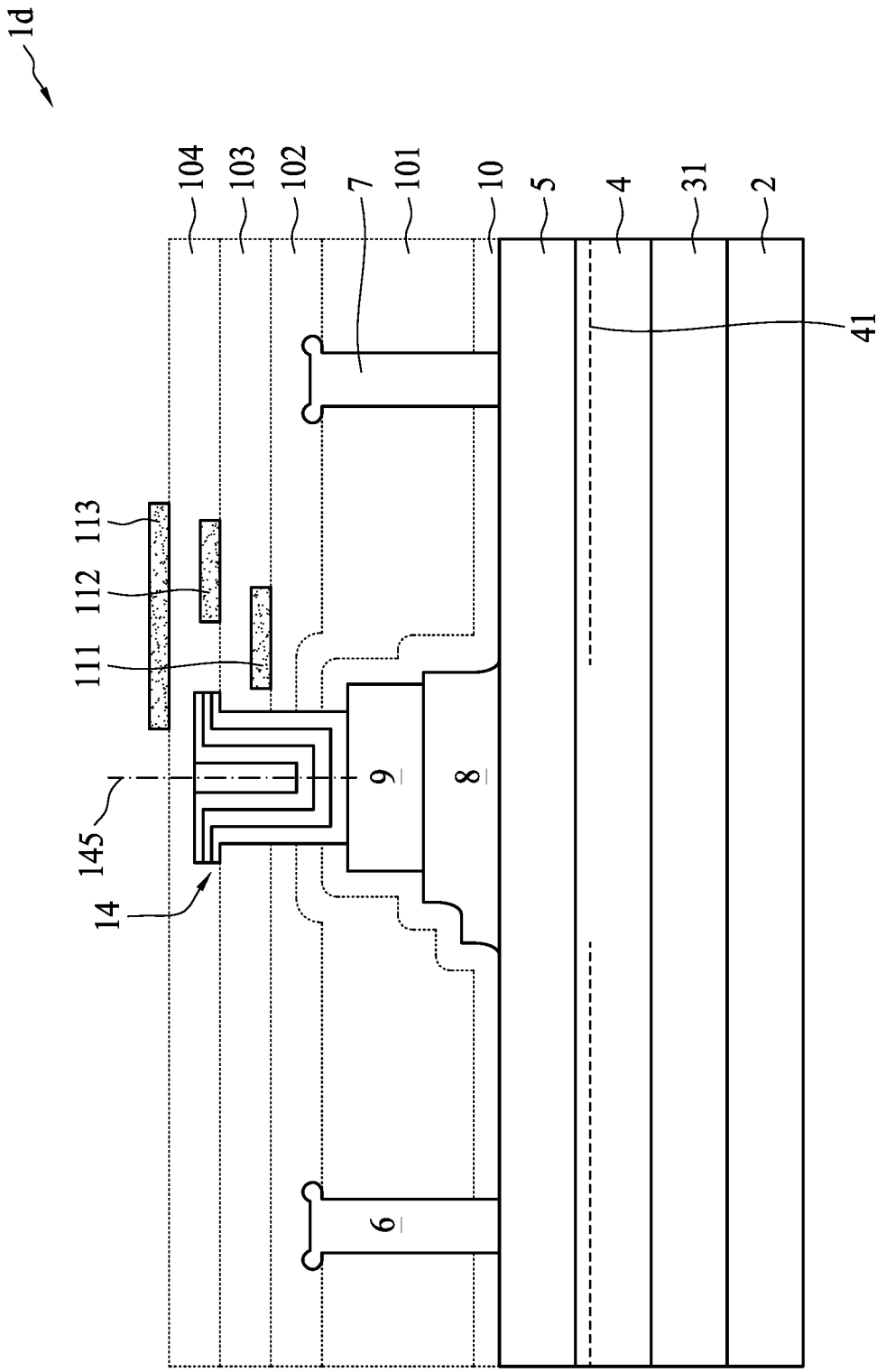

With reference to FIG. 5(f), a dielectric layer 102 is positioned between a field plate 113 and the source contact 6 substantially in the normal direction. The field plate 113 partially overlaps the field plate 111 substantially in the normal direction.

A dielectric layer 103 is positioned between a field plate 113 and the source contact 6 substantially in the normal direction. A dielectric layer 104 is positioned between a field plate 113 and the source contact 6 substantially in the normal direction.

The field plate 113 may reduce the electric field of the gate contact structure, and increase the threshold voltage. The field plate 113 may enable the electric field among the conductor structures (for example, the T-shaped electrode 14, the source contact 6, and the drain contact 7) to be averagely distributed, and improve the voltage tolerance so as to smoothly release the voltage, thereby further improving the reliability of the device. The field plate 113 overlaps with the T-shaped electrode 14 substantially along the normal direction. The field plate 113 has a portion positioned between the border of the overhang 14' and the geometric center of the T-shaped electrode 14 substantially in the tangential direction. The border of the overhang 14' passes through the field plate 113 substantially in the normal direction.

The field plate 113 may not overlap the T-shaped electrode 14 substantially along the normal direction. In other embodiments, the field plate 113 may not overlap the centerline 143 of the T-shaped electrode 14 substantially in the normal direction. The field plate 113 is positioned between the T-shaped electrode 14 and the drain contact 7 substantially in the tangential direction.

The shortest distance between the border of the overhang 14' and the border of the field plate 113 may be about 3 μm to 5 μm.

Figure 5G:
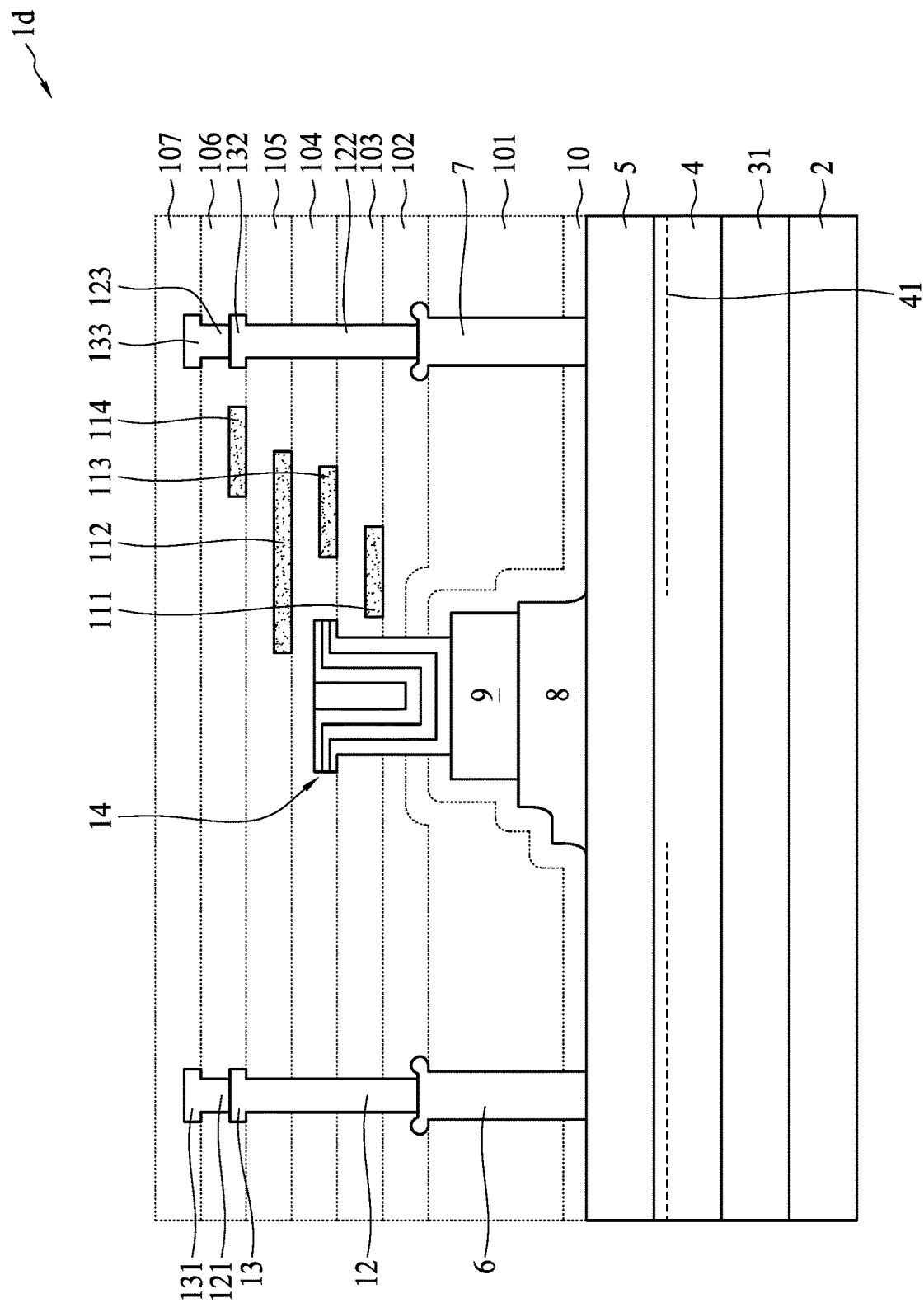

With reference to FIG. 5(g), the HEMT device 1d may also include a dielectric layer 102, a dielectric layer 103, a dielectric layer 104, a dielectric layer 105, a dielectric layer 106, and a dielectric layer 27.

The dielectric layer 102 is positioned between a field plate 114 and the source contact 6 substantially in the normal direction. The dielectric layer 103 is positioned between a field plate 114 and the source contact 6 substantially in the normal direction. The dielectric layer 104 is positioned between a field plate 114 and the source contact 6 substantially in the normal direction. The dielectric layer 105 is positioned between a field plate 114 and the source contact 6 substantially in the normal direction.

The field plate 114 may reduce the electric field of the gate contact structure, and increase the threshold voltage. The field plate 114 may enable the electric field among the conductor structures (for example, the T-shaped electrode 14, the source contact 6, and the drain contact 7) to be averagely distributed, and improve the voltage tolerance so as to smoothly release the voltage, thereby further improving the reliability of the device. The field plate 114 partially overlaps the field plate 111 substantially in the normal direction. The field plate 114 is positioned between the T-shaped electrode 14 and the drain contact 7 substantially in the tangential direction.

The distance between the border of the overhang 14' and the closest border of the field plate 114 may be about 6 μm to 8 μm.

The width of the field plate (for example, the field plate 111, the field plate 112, the field plate 113, and/or the field plate 114) substantially in the tangential direction may be about 50 to 150 nm. The width of the field plate substantially in the tangential direction may be about 80 to 120 nm. The width of the field plate substantially in the tangential direction may be about 90 to 110 nm.

The field plate 111 may be connected to the source contact 6 and/or the drain contact 7 through other conductor structures. The field plate 112 may be connected to the source contact 6 and/or the drain contact 7 through other conductor structures. The field plate 113 may be connected to the source contact 6 and/or the drain contact 7 through other conductor structures. The field plate 114 may be connected to the source contact 6 and/or the drain contact 7 through other conductor structures. The field plate 111 is not in direct contact with the source contact 6. The field plate 111 is not in direct contact with the drain contact 7. The field plate 112 is not in direct contact with the source contact 6. The field plate 112 is not in direct contact with the drain contact 7. The field plate 113 is not in direct contact with the source contact 6. The field plate 113 is not in direct contact with the drain contact 7. The field plate 114 is not in direct contact with the source contact 6. The field plate 114 is not in direct contact with the drain contact 7.

At least one dielectric layer (for example, the dielectric layer 102, the dielectric layer 103, the dielectric layer 104, and the dielectric layer 105) may exist between the field plate 111, the field plate 112, the field plate 113, and/or the field plate 114 and the conductor structure. Through such configuration, the distance between the conductor structures may be small, and the resistance value increase is avoided.

Application of Hybrid HEMT Devices

In some embodiments, the improved gate structure of the present invention may be applied to an HEMT device as shown in FIG. 6.

The HEMT device includes: a substrate; a buffer layer, positioned above the substrate, the buffer layer including a superlattice structure; a first nitride semiconductor layer, positioned above the buffer layer; a second nitride semiconductor layer, positioned above the first nitride semiconductor layer and having an energy band gap greater than that of the first nitride semiconductor layer; and a high-voltage component portion and a low-voltage component portion, positioned above the second nitride semiconductor layer, the operating voltage of the high-voltage component portion being greater than the operating voltage of the low-voltage component portion.

The high-voltage component portion includes: a first source contact and a first drain contact, positioned above the second nitride semiconductor layer; a first doped third nitride semiconductor layer, positioned above the second nitride semiconductor layer and between the first drain contact and the first source contact; and a first gate electrode, positioned above the first doped third nitride semiconductor layer.

The low-voltage component portion includes: a second source contact and a second drain contact, positioned above the second nitride semiconductor layer; a second doped third nitride semiconductor layer, positioned above the second nitride semiconductor layer and between the second drain contact and the second source contact; and a second gate electrode, positioned above the second doped third nitride semiconductor layer.

The first gate electrode and the first doped third nitride semiconductor layer of the high-voltage component portion may be disposed in the mode described above.

The second gate electrode and the second doped third nitride semiconductor layer of the low-voltage component portion may be disposed in the mode described above.

The first gate electrode of the high-voltage component portion is configured to form a Schottky junction with the first doped third nitride semiconductor layer. The second gate electrode of the low-voltage component portion is configured to form a Schottky junction with the second doped third nitride semiconductor layer.

The structure of the low-voltage component portion may be similar to that of the HEMT device 1b mentioned above. The structure of the high-voltage component portion may be identical or similar to that of the HEMT device 1d mentioned above.

FIG. 6(a) to FIG. 6(l) show several operations for manufacturing an HEMT device 1e according to some embodiments of the present invention. Although FIG. 6(a) to FIG. 6(l) show several operations for manufacturing the hybrid HEMT device 1e, similar operations are also applicable.

Figure 6A:
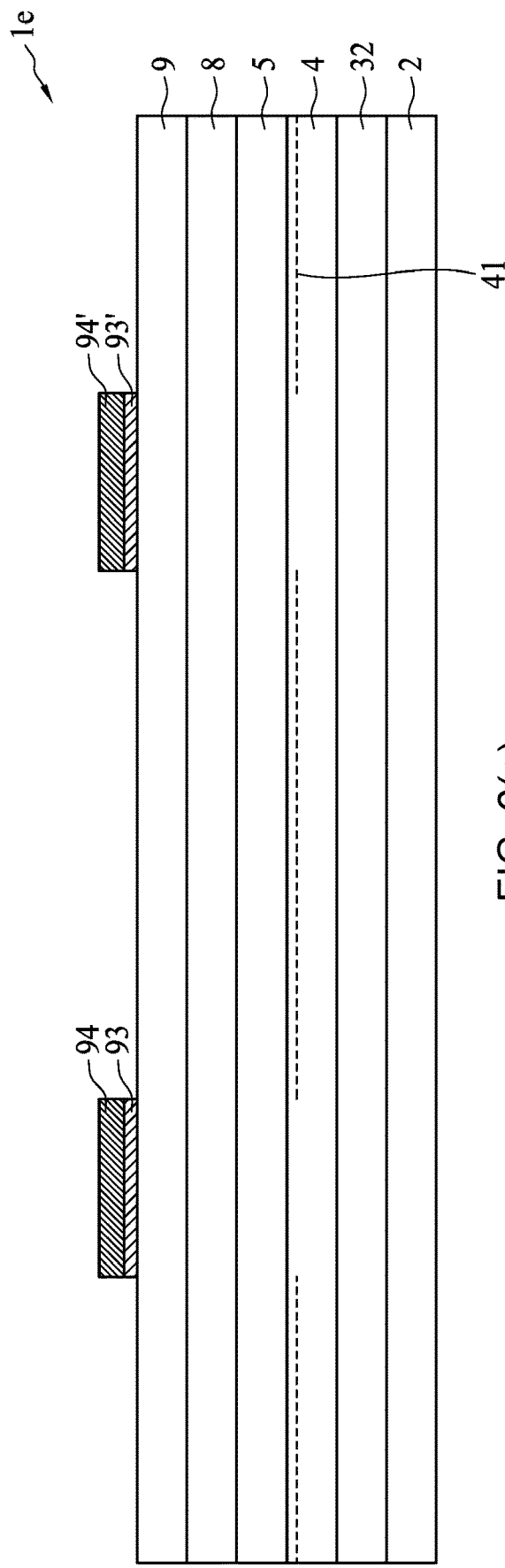

With reference to FIG. 6(a), a substrate 2 is provided. In some embodiments, a doped superlattice layer 32 optionally epitaxially grows on the substrate 2. In some embodiments, a nitride semiconductor layer 4, a nitride semiconductor layer 5, and a doped nitride semiconductor layer 8 are disposed on the substrate 2 through epitaxial growth. In some embodiments, a gate electrode is formed before a source contact and a drain contact are formed. The gate electrode 9 is configured to form a Schottky junction with the doped nitride semiconductor layer 8.

Additionally, photoresists 94 and 94' are applied to a hard mask 93 so as to determine the position of the gate electrode 9 after the photolithography and etching processes.

Figure 6B:
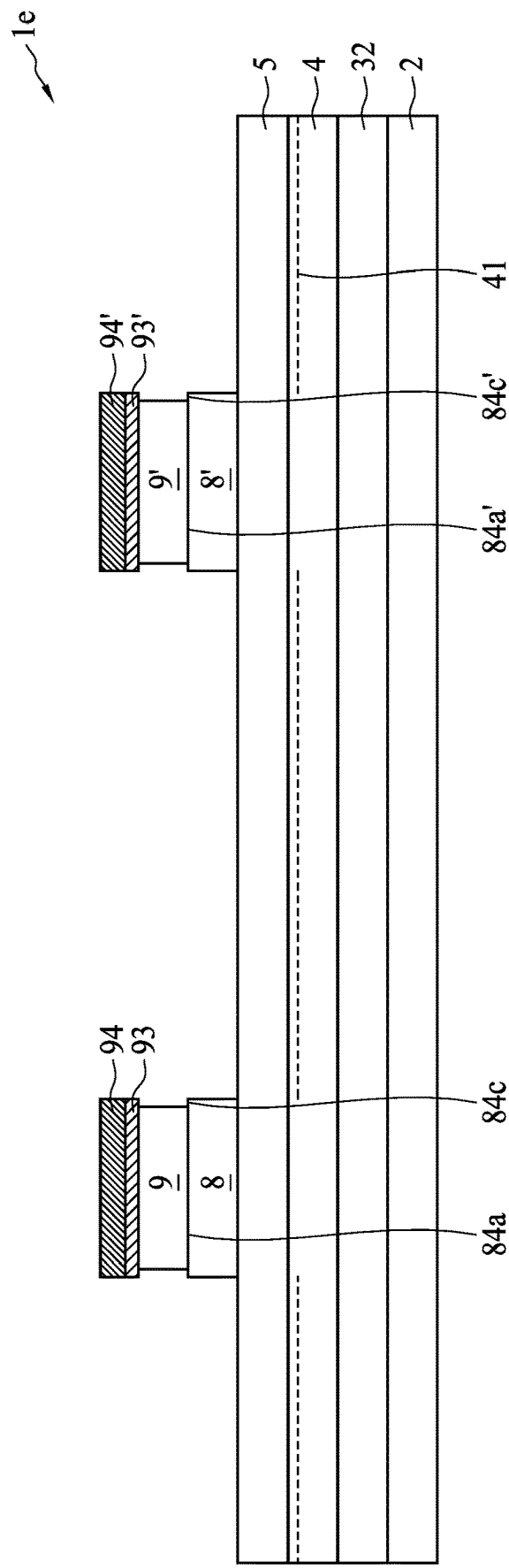

With reference to FIG. 6(b), patterned hard masks 93 and 93' are formed above the gate electrode 9. Then, the required portions of the gate electrodes 9 and 9' and the doped nitride semiconductor layer 8 may be retained in photolithography and etching modes. The gate electrodes 9 and 9' may be optionally overetched, so as to define, on the surface 84, a part 84a electrically connected to the gate electrode 9, and a part 84c adjacent to the part 84a, and define, on the surface 84', a part 84a' electrically connected to the gate electrode 9', and a part 84c' adjacent to the part 84a'. The configurations and forming modes of the above components are described above, and then, the photoresists 94 and 94' and the hard masks 93 and 93' are peeled off.

Figure 6C:
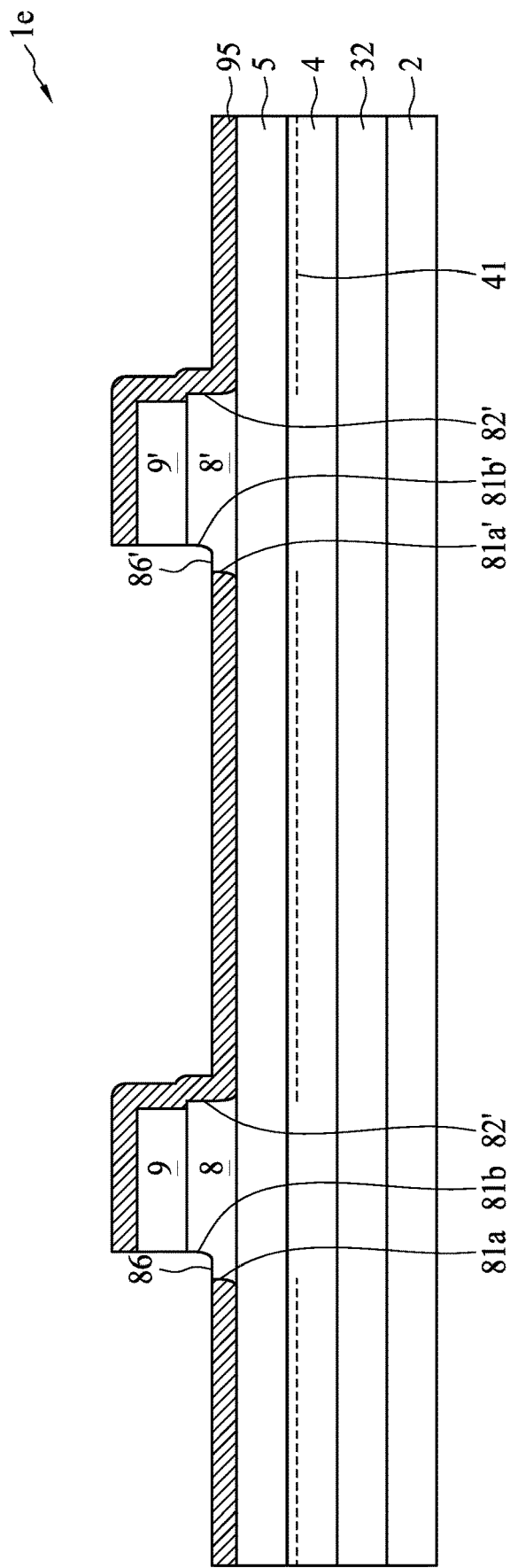

With reference to FIG. 6(c), the patterned hard mask 95 is formed above the gate electrodes 9 and 9', the doped nitride semiconductor layer 8 and the nitride semiconductor layer 5 to define the widths of the surfaces 86 and 86', and subsequently the exposed gate electrodes 9 and 9' and the doped nitride semiconductor layers 8 and 8' are etched, so as to form a protrusion/step structure having the sidewall 81a, the surface 86 and the sidewall 81b on a sidewall of the doped nitride semiconductor layer 8, and form a protrusion/step structure having the sidewall 81a', the surface 86' and the sidewall 81b' on a sidewall of the doped nitride semiconductor layer 8'. The content relevant to the photolithography and etching of the gate electrodes 9 and 9' and the doped nitride semiconductor layers 8 and 8' has been described above, and will not be described in detail herein.

Figure 6D:
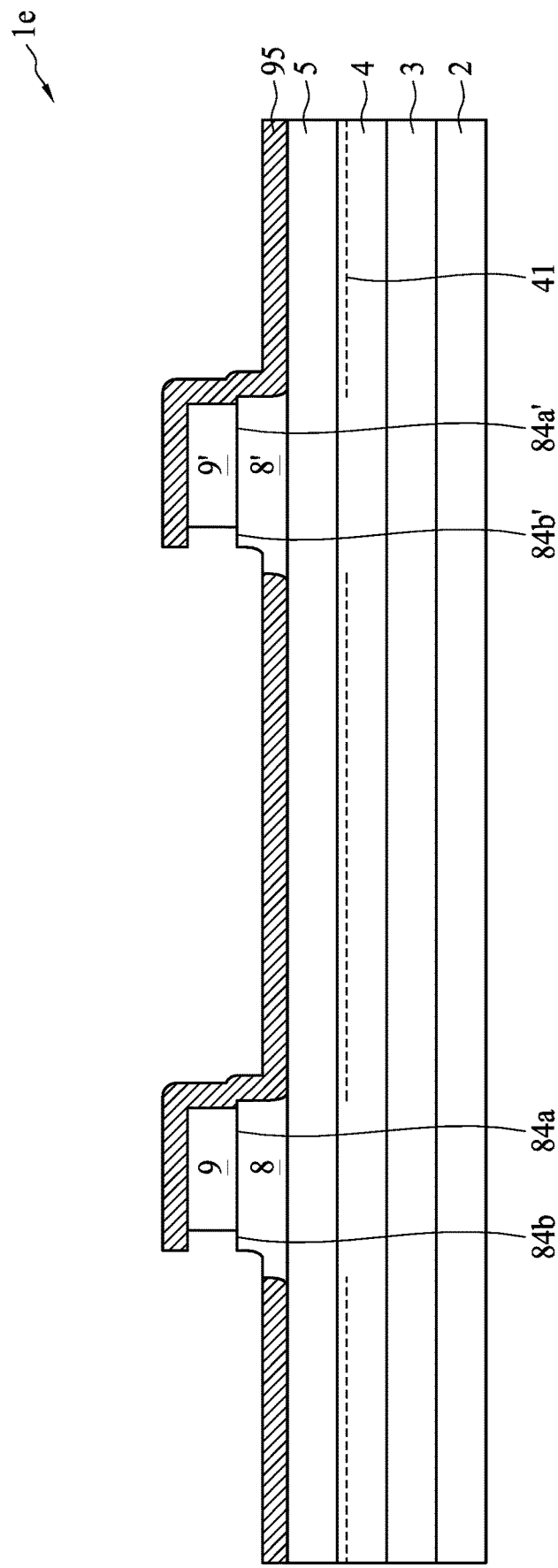

With reference to FIG. 6(d), the gate electrodes 9 and 9' may be optionally overetched, so as to define the part 84b adjacent to the part 84a on the surface 84 and define the part 84b' adjacent to the part 84a' on the surface 84', and subsequently the hard mask 93 is peeled off. The content relevant to the overetching of the gate electrodes has been described above, and will not be described in detail herein.

Figure 6E:
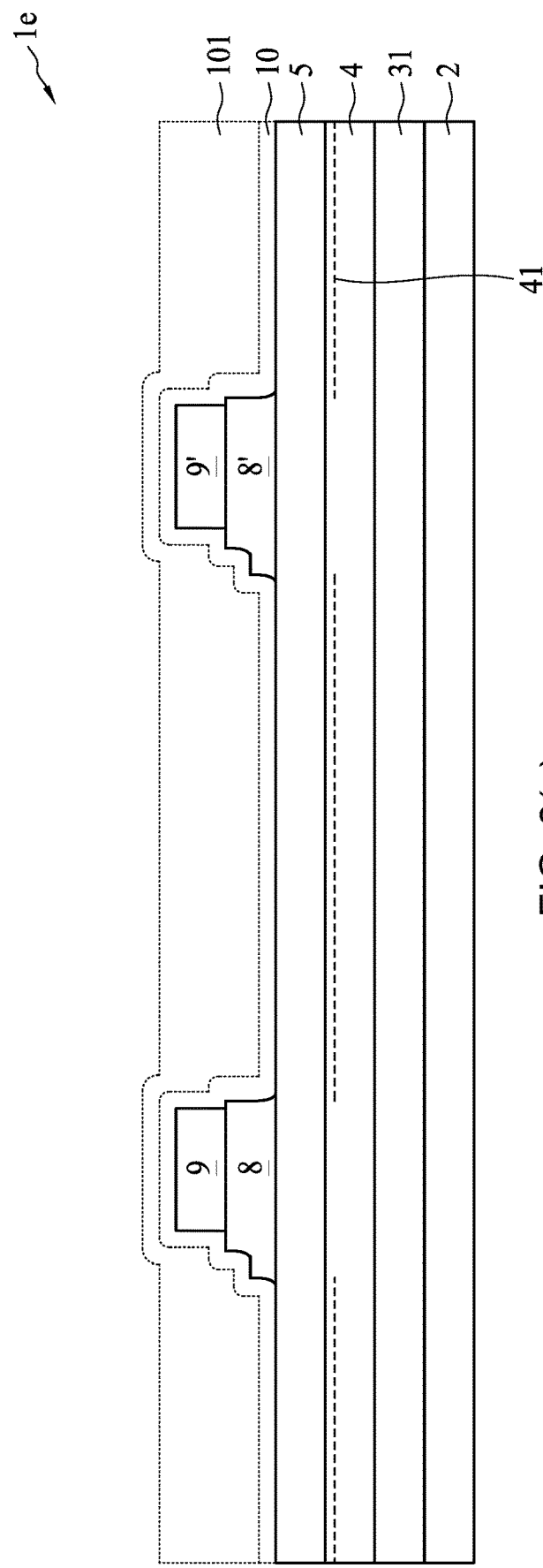

With reference to FIG. 6(e), after the asymmetrical gate structures are formed, a passivation layer 10 and a passivation layer 101 are formed on the gate electrodes 9 and 9'. The configurations and forming modes of the above components are described above.

Figure 6F:
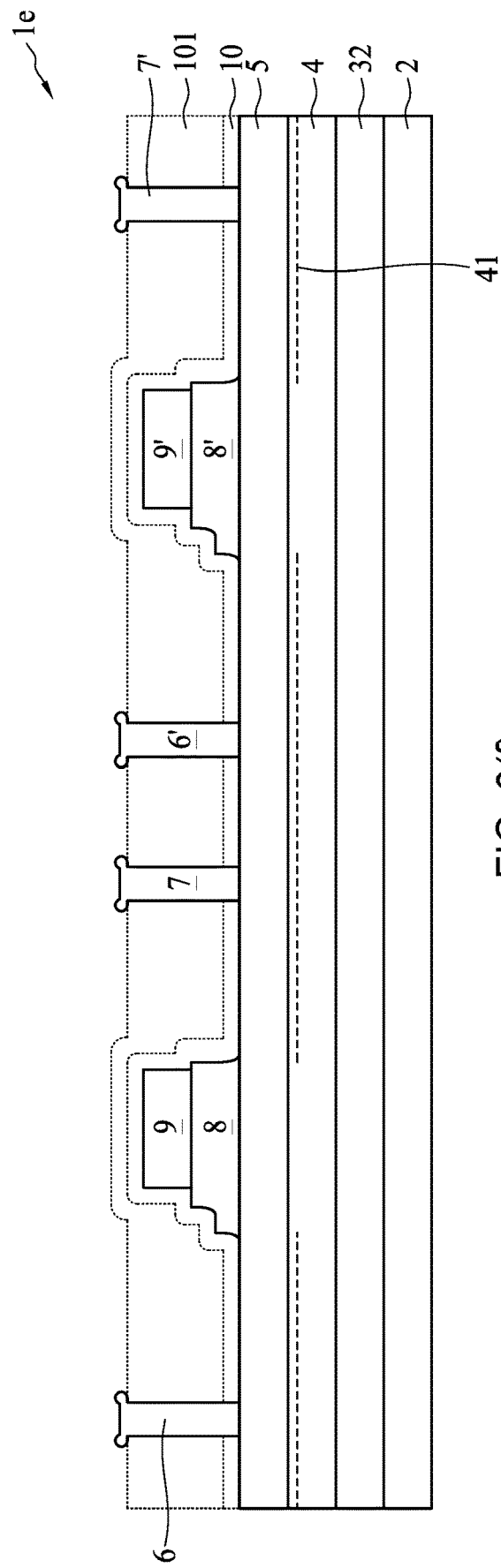

With reference to FIG. 6(f), source contact vias and drain contact vias are formed, and are filled with materials to form source contacts 6 and 6' and drain contacts 7 and 7'. The forming modes of the source contact vias and the drain contact vias have been described above, and will not be described in detail herein.

Figure 6G:
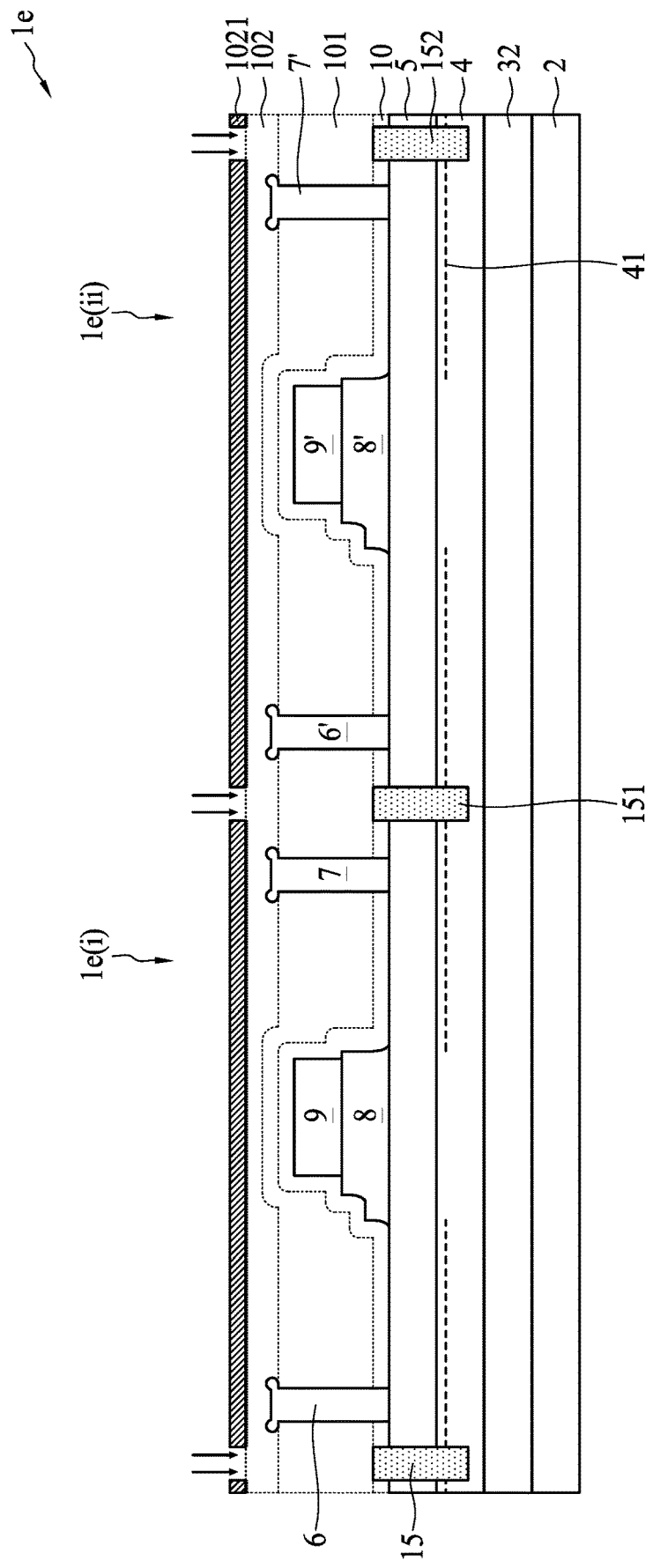
Figure 6H:
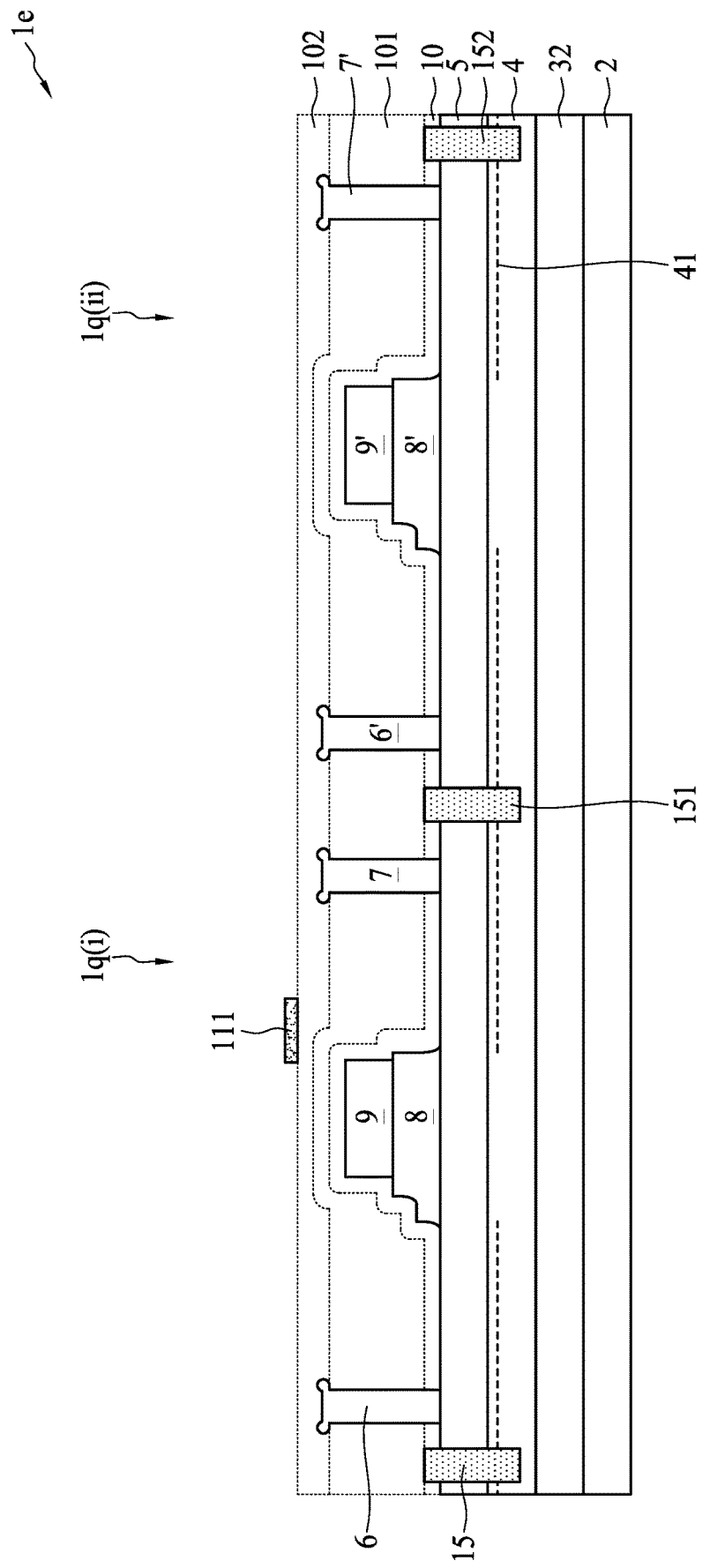
Figure 6I:
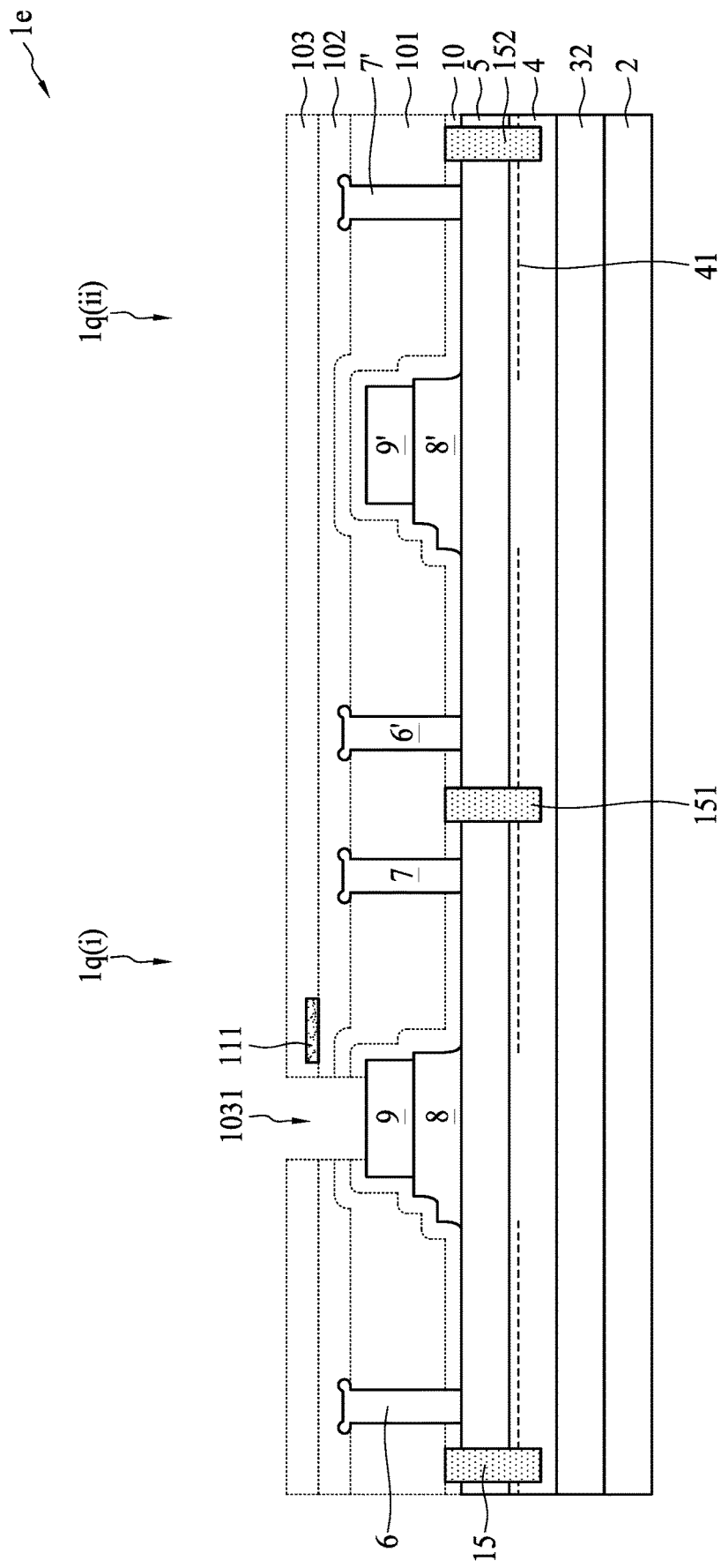
Figure 6J:
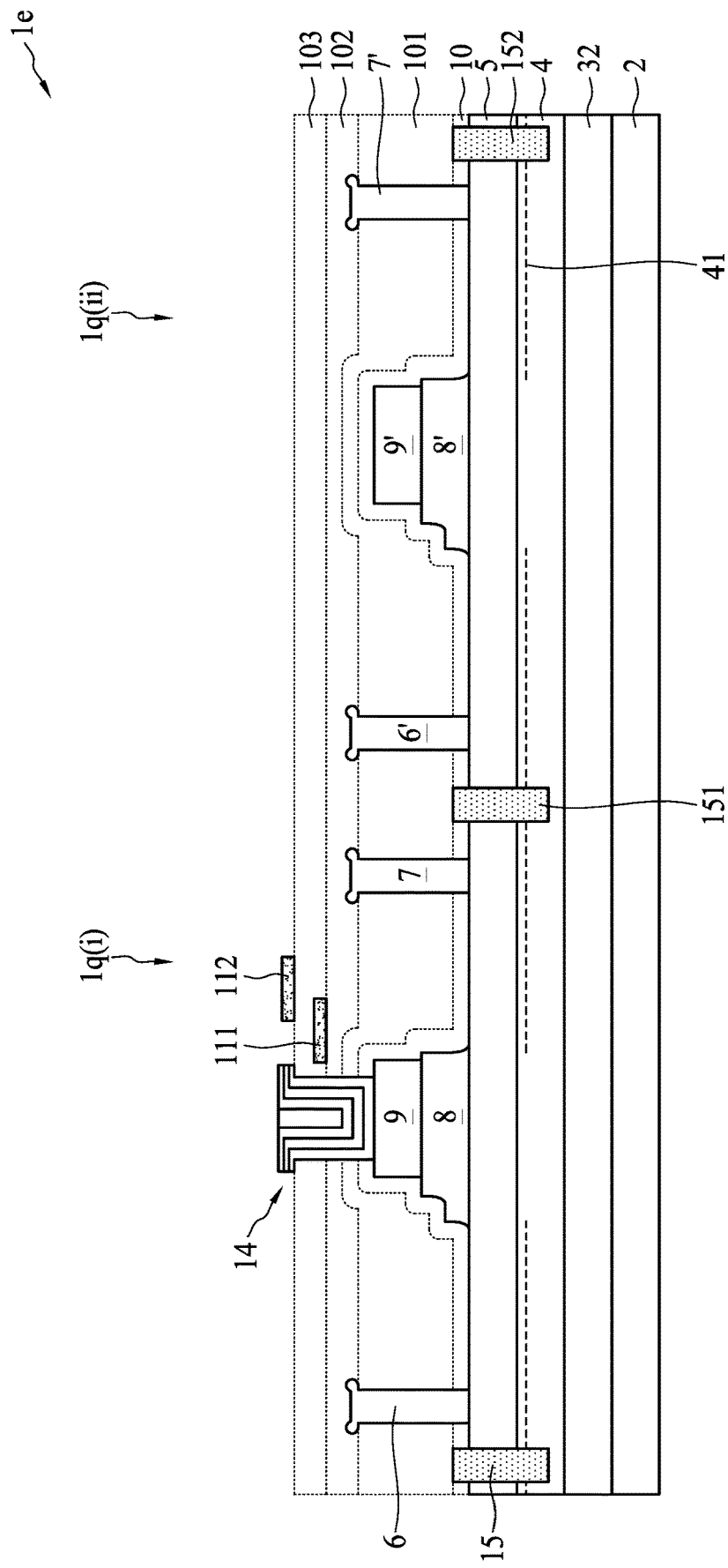
Figure 6K:
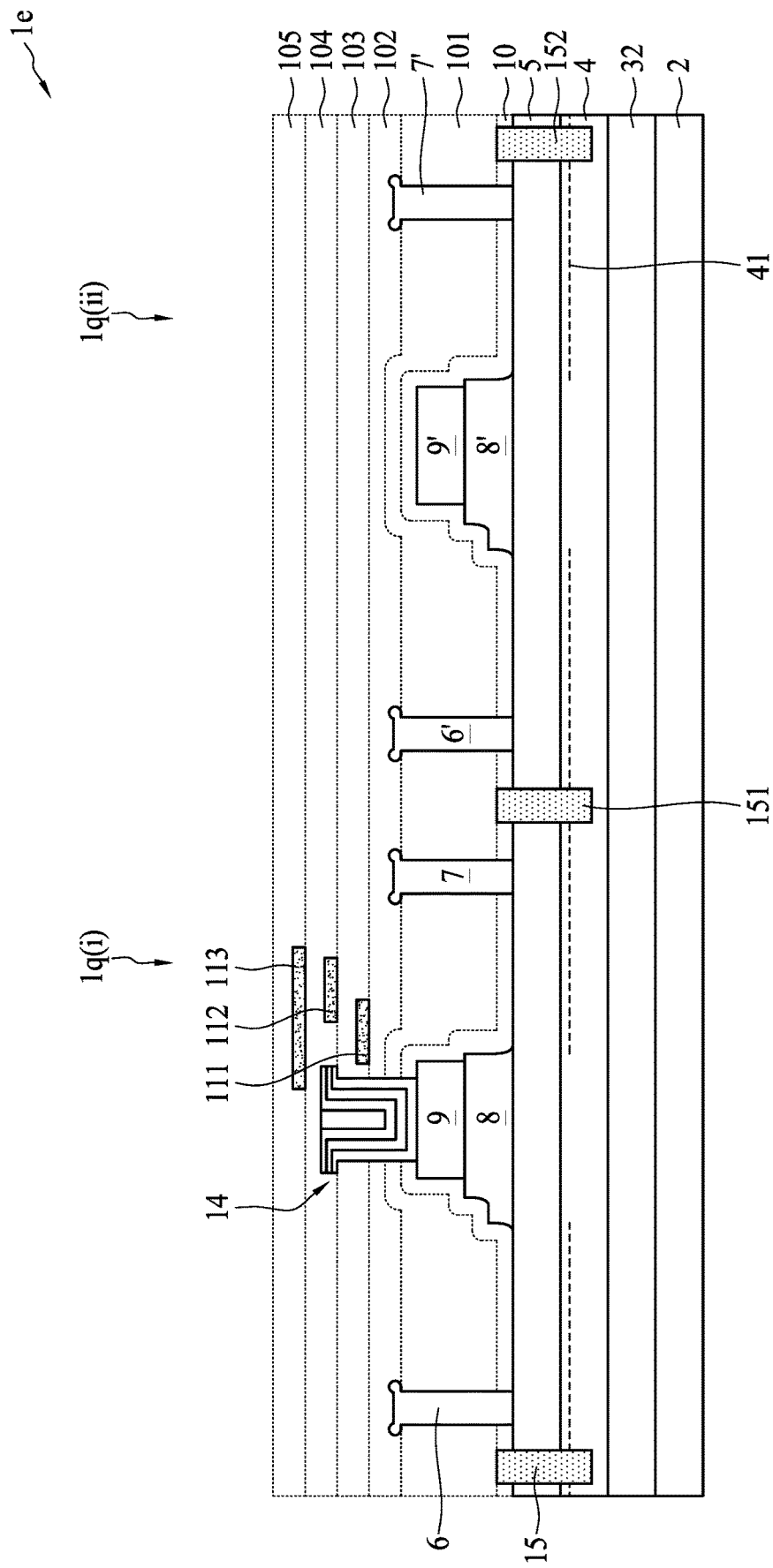
Figure 6I:
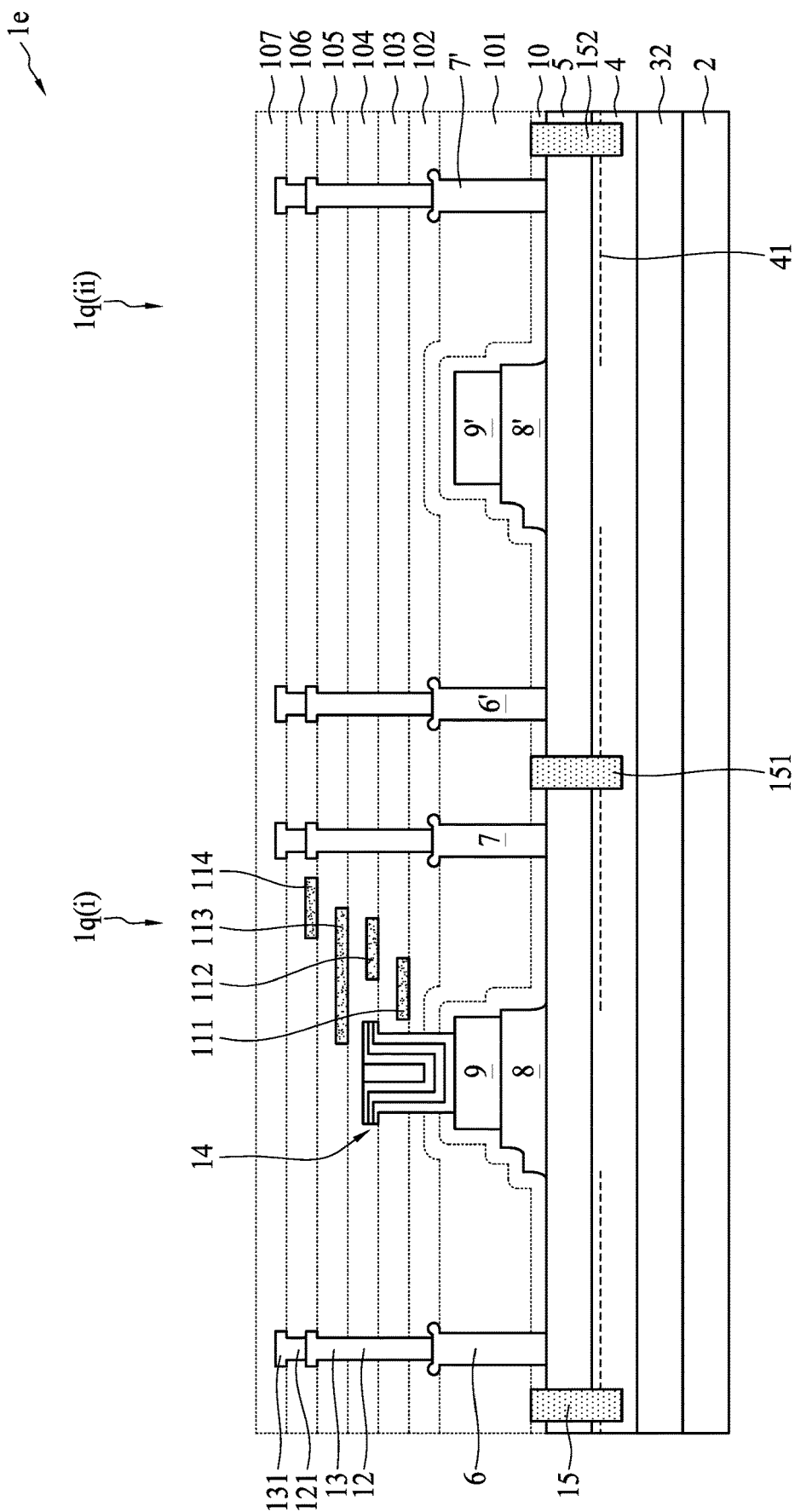

With reference to FIG. 6(g), a dielectric layer 102 is deposited onto the passivation layer 101. The dielectric layer 102 (and the dielectric layers 103, 104, 105, 106, and 107) may be deposited in the following modes: chemical vapor deposition (CVD), high density plasma CVD, spin-on, sputtering, and the like. Then, the surface of the dielectric layer 102 is treated through chemical-mechanical planarization (CMP).

Isolation regions 15, 151, and 152 are formed to isolate the source contacts 6 and 6' from the drain contacts 7 and 7' of a high-voltage component 1e(i) and a low-voltage component 1e(ii). An implant isolation process may be used. A patterned photoresist 1021 is used. Nitrogen, oxygen, fluorine or the like is implanted in the area not covered by the patterned photoresist 1021. The elements will remain in the nitride semiconductor layer 4 to block channels of the two-dimensional electron gas 41 on the two sides.

The isolation regions 15, 151, and 152 may include dielectric materials. The isolation regions 15, 151, and 152 may include dielectric materials with a low dielectric constant (low k value). The isolation regions 15, 151, and 152 may include nitrides, oxides, or fluorides. The isolation regions 15, 151, and 152 may include silicon oxide, silicon nitride, silicon oxynitride, or fluorine-doped silicate glass (FSG). If the isolation regions 15, 151, and 152 need to be filled with the dielectric materials, the operation may be performed in photolithography, etching and deposition modes before the passivation layer 101 is disposed.

With reference to FIG. 6(*h*), a field plate 111 is formed on the dielectric layer 102. The dielectric layer 102 separates the field plate 111 from the source contact 6 substantially in the tangential direction. The configurations and forming modes of the above components are described in the section of "Application of high-voltage HEMT devices".

With reference to FIG. 6(*i*), an opening 1031 is formed in the high-voltage component portion 1*e*(i). The opening 1031 exposes a partial surface of the gate electrode 9. The opening 1031 may be formed in a dry etching or wet etching mode. The configuration and forming mode of the opening 1031 are described by parts relevant to the opening 1031 in the section of "Application of high-voltage HEMT devices".

A semiconductor component 1*e* includes the high-voltage component portion 1*e*(i) and the low-voltage component portion 1*e*(ii). Before the manufacturing process proceeds to the formation of the isolation regions 15, 151, and 152 (including the step of forming the isolation regions 15, 151, and 152), the high-voltage component portion 1*e*(i) and the low-voltage component portion 1*e*(ii) have the same structure and process, and the same component may be formed in the same step.

The high-voltage component portion 1*e*(i) belongs to a relatively-high-voltage component, and the low-voltage component portion 1*e*(ii) belongs to a relatively-low-voltage component. In the semiconductor component 1*e*, the low-voltage component portion 1*e*(ii) belongs to the gate first manufacturing process. After the isolation regions 15, 151, and 152 are formed, the low-voltage component portion 1*e*(ii) will not form the opening or the T-shaped electrode.

The high-voltage component portion 1*e*(i) may belong to a hybrid manufacturing process of the gate first process and the gate last process. After the isolation regions 15, 151, and 152 are formed, the high-voltage component portion 1*e*(i) continues to form the field plate 111, form the opening 1031, and form the T-shaped electrode 14.

With reference to FIG. 6(*j*), each layer of the T-shaped electrode 14 is deposited and fills the opening 1031 to form the T-shaped electrode 14. The material selection, configurations and forming modes of the layers of the T-shaped electrode 14 are described in the section of "Application of high-voltage HEMT devices".

The field plate 112 may be formed together with the T-shaped electrode 14. The field plate 112 may have the same material as that of the T-shaped electrode 14.

With reference to FIG. 6(*k*), the operations for manufacturing the HEMT device 1*e* may additionally include forming the dielectric layer 104 and the field plate 113.

With reference to FIG. 6(*l*), the operations for manufacturing the HEMT device 1*e* may additionally include forming the dielectric layer 105 and forming the interconnect structure 12 passing through the dielectric layers 105 to 102 to be connected to the source contacts 6 and 6' and the drain contacts 7 and 7'.

The operations for manufacturing the HEMT device 1*e* may additionally include forming the metal layer 13 and the field plate 114 on the dielectric layer 105.

The operations for manufacturing the HEMT device 1*e* may additionally include forming a dielectric layer 106 to cover the metal layer 13 and the field plate 114. The operations for manufacturing the HEMT device 1*e* may additionally include forming a conductive via 121 passing through the dielectric layer 106 to be connected to the metal layer 13 or the interconnect structure 12. The operations for manufacturing the HEMT device 1*e* may additionally include forming a metal layer 131 connected to the conductive via 121, and forming a dielectric layer 107 to cover the metal layer 131.

One or more field plates may be disposed in the high-voltage component portion 1*e*(i). One or more field plates may be disposed in the low-voltage component portion 1*e*(ii). One or more field plates may be disposed in both the high-voltage component portion 1*e*(i) and the low-voltage component portion 1*e*(ii). No field plate may be disposed in the low-voltage component portion 1*e*(ii).

The high-voltage component portion 1*e*(i) may be applied to the voltage higher than 500 V. The high-voltage component portion 1*e*(i) may be applied to the voltage higher than 550 V. The high-voltage component portion 1*e*(i) may be applied to the voltage higher than 600 V. The low-voltage component portion 1*e*(ii) may be applied to the voltage of 10 V to 40 V. The low-voltage component portion 1*e*(ii) may be applied to the voltage lower than the voltage of the high-voltage component portion 1*e*(i).

The high-voltage component portion 1*e*(i) may be formed on the superlattice layer 32. The low-voltage component portion 1*e*(ii) may be formed on the superlattice layer 32.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientations shown in the figures, space-related terms are intended to encompass different orientations of the device in use or operation. An apparatus may be oriented in other ways (rotated by 90 degrees or at other orientations), and the space-related descriptors used herein may also be used for explanation accordingly.

It should be noted that, values of widths and distances described in the present invention are merely exemplary, and the present invention is not limited thereto. In some embodiments, such values may be adjusted according to an actual application situation of the present invention without departing from the inventive spirit of the present invention.

As used herein, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" or "similar" generally means being in the range of ±10%, ±5%, ±1%, or ±0.5% of the given value or range. The range may be indicated herein as from one endpoint to another endpoint or between two endpoints. Unless otherwise specified, all the ranges disclosed herein include endpoints. The term "substantially coplanar" may refer to two surfaces within a few micrometers (μm) positioned along the same plane, for example, within 10 μm, within 5 μm within 1 μm or within 0.5 μm positioned along the same plane. When reference is made to "substantially" the same numerical value or characteristic, the term may refer to a value within ±10%, ±5%, ±1%, or ±0.5% of the average of the values.

Several embodiments of the present invention and features of details are briefly described above. The embodiments described in the present invention may be easily used as a basis for designing or modifying other processes and structures for realizing the same or similar objectives and/or obtaining the same or similar advantages introduced in the embodiments of the present invention. Such equivalent construction does not depart from the spirit and scope of the present invention, and various variations, replacements, and modifications can be made without departing from the spirit and scope of the present invention.

Although the subject of this specification is described by using specific preferred embodiments and exemplary embodiments, the foregoing accompanying drawings and descriptions of this specification describe merely typical non-limiting examples of embodiments of the subject. Therefore, the foregoing accompanying drawings and descriptions are not intended to limit the scope of this specification, and many alternatives and modifications will be apparent to a person skilled in the art.

As reflected in the claims below, aspects of the present invention may have fewer features than all features of an individual embodiment disclosed above. Therefore, the claims described below are hereby explicitly incorporated into the specific embodiments, and each claim itself represents an independent embodiment of the present invention. In addition, although some embodiments described herein include some features included in other embodiments, but do not include other features included in the other embodiments, a person skilled in the art should understand that, a combination of features of different embodiments shall fall within the scope of the present invention, and is intended to form different embodiments.

What is claimed is:

1. A semiconductor device, including:
    a substrate;
    a first nitride semiconductor layer, positioned above the substrate;
    a second nitride semiconductor layer, positioned above the first nitride semiconductor layer and having an energy band gap greater than that of the first nitride semiconductor layer;
    a source contact and a drain contact, positioned above the second nitride semiconductor layer;
    a doped third nitride semiconductor layer, positioned above the second nitride semiconductor layer and between the drain contact and the source contact, where the doped third nitride semiconductor layer has a first sidewall adjacent to the source contact, a second sidewall adjacent to the drain contact, and a third sidewall positioned between the first sidewall and the second sidewall in a direction substantially parallel to an interface between the first nitride semiconductor layer and the second nitride semiconductor layer; and
    a gate electrode, positioned above the doped third nitride semiconductor layer;
    wherein the doped third nitride semiconductor layer has a first surface in contact with the gate electrode, the third sidewall is connected with the first sidewall by a third surface, an angle between a tangential direction and a connecting line between an intersection of the third sidewall and the first surface and a second intersection of the third sidewall and the third surface is less than 80°, and the tangential direction is a second direction along a second connecting line between the source contact and the drain contact.

2. The semiconductor device according to claim 1, where the third sidewall is positioned between the first sidewall and the gate electrode in the direction.

3. The semiconductor device according to claim 2, where a ratio of a height of the third sidewall to a height of the first sidewall is 0.5 to 2 in a direction perpendicular to the direction.

4. The semiconductor device according to claim 2, where a ratio of a shortest distance between the gate electrode and the first sidewall in the direction to a shortest distance between the gate electrode and the second sidewall in the direction is greater than 1.

5. The semiconductor device according to claim 1, where the third sidewall is positioned between the gate electrode and the second sidewall in the direction.

6. The semiconductor device according to claim 5, where a ratio of a height of the third sidewall to a height of the second sidewall is 0.5 to 2 in a direction perpendicular to the direction.

7. The semiconductor device according to claim 5, where a ratio of a shortest distance between the gate electrode and the second sidewall in the direction to a shortest distance between the gate electrode and the first sidewall in the direction is greater than 1.

8. The semiconductor device according to claim 1, where an angle between any tangent plane of the first sidewall, the second sidewall or the third sidewall and the direction is 30° to 150°.

9. The semiconductor device according to claim 1, where the doped third nitride semiconductor layer further has a fourth sidewall different from the third sidewall, and the fourth sidewall is positioned between the first sidewall and the second sidewall in the direction.

10. The semiconductor device according to claim 1, further including a passivation layer, positioned at least partially above the second nitride semiconductor layer and at least partially above the doped third nitride semiconductor layer, where the passivation layer is in direct contact with the third sidewall.

11. A semiconductor device, including:
    a substrate;
    a first nitride semiconductor layer, positioned above the substrate;
    a second nitride semiconductor layer, positioned above the first nitride semiconductor layer and having an energy band gap greater than that of the first nitride semiconductor layer;
    a source contact and a drain contact, positioned above the second nitride semiconductor layer;
    a doped third nitride semiconductor layer, positioned above the second nitride semiconductor layer and between the drain contact and the source contact; and
    a gate electrode, positioned above the doped third nitride semiconductor layer, where the doped third nitride semiconductor layer has a first surface in contact with the gate electrode, a second surface in contact with the second nitride semiconductor layer, and a third surface positioned between the first surface and the second surface in a first direction substantially perpendicular to an interface between the first nitride semiconductor layer and the second nitride semiconductor layer, and the third surface extends in a second direction substantially parallel to the interface between the first nitride semiconductor layer and the second nitride semiconductor layer;

wherein the doped third nitride semiconductor layer further has a first sidewall and a third sidewall, the first sidewall and the third sidewall are positioned on a same side of the doped third nitride semiconductor layer, and the first sidewall is adjacent to the source contact or the drain contact;

wherein the third sidewall is connected with the first sidewall by the third surface, an angle between a tangential direction and a connecting line between an intersection of the third sidewall and the first surface and a second intersection of the third sidewall and the third surface is less than 80°, and the tangential direction is a third direction along a second connecting line between the source contact and the drain contact.

12. The semiconductor device according to claim 11, where the third surface is positioned between the source contact and the gate electrode or positioned between the gate electrode and the drain contact in the second direction.

13. The semiconductor device according to claim 11, where an orthographic projection range of the third surface overlaps an orthographic projection range of the first surface in the second direction.

14. The semiconductor device according to claim 11, where an orthographic projection range of a sidewall of the doped third nitride semiconductor layer overlaps an orthographic projection range of the third surface in the second direction.

15. The semiconductor device according to claim 11, where a ratio of a width of the third surface in the second direction to a width of the first surface in the second direction is 0.05 to 0.2.

16. The semiconductor device according to claim 11, where a ratio of a width of the third surface in the second direction to a width of the second surface in the second direction is 0.02 to 0.15.

17. The semiconductor device according to claim 11, where the doped third nitride semiconductor layer further has a fourth surface different from the third surface, and the fourth surface is positioned between the first surface and the second surface in the first direction.

18. The semiconductor device according to claim 11, where the geometric center of the gate electrode is aligned with the geometric center of the first surface in the second direction.

19. The semiconductor device according to claim 11, further including a passivation layer, positioned at least partially above the second nitride semiconductor layer and at least partially above the doped third nitride semiconductor layer, where the passivation layer is in direct contact with the third surface.

20. A semiconductor device, including:
a substrate;
a first nitride semiconductor layer, positioned above the substrate;
a second nitride semiconductor layer, positioned above the first nitride semiconductor layer and having an energy band gap greater than that of the first nitride semiconductor layer;
a source contact and a drain contact, positioned above the second nitride semiconductor layer;
a doped third nitride semiconductor layer, positioned above the second nitride semiconductor layer and between the drain contact and the source contact; and
a gate electrode, positioned above the doped third nitride semiconductor layer, where
the doped third nitride semiconductor layer has at least one protrusion in a direction substantially parallel to an interface between the first nitride semiconductor layer and the second nitride semiconductor layer, and lithe at least one protrusion extends along the direction, and the doped third nitride semiconductor layer has a first surface in contact with the gate electrode;
wherein the at least one protrusion comprises a first sidewall and a third surface extending in a second direction substantially parallel to the direction, and the doped third nitride semiconductor layer has a third sidewall,
the third sidewall and the first sidewall are located on a same side of the doped third nitride semiconductor layer, and the third sidewall and the first sidewall are connected with each other through the third surface; and
an angle between a tangential direction and a connecting line between an intersection of the third sidewall and the first surface and a second intersection of the third sidewall and the third surface is less than 80°, and the tangential direction is a third direction along a second connecting line between the source contact and the drain contact.

* * * * *